United States Patent [19]
Hasegawa et al.

[11] Patent Number: 5,640,216
[45] Date of Patent: Jun. 17, 1997

[54] LIQUID CRYSTAL DISPLAY DEVICE HAVING VIDEO SIGNAL DRIVING CIRCUIT MOUNTED ON ONE SIDE AND HOUSING

[75] Inventors: Kaoru Hasegawa, Ichinomiya-machi; Yoshio Toriyama, Nagara-machi; Naoto Kobayashi, Koshiate Mobara; Katsuhiko Yarita, Hayano Mobara; Hironori Kondo, Kisaki Mobara; Masahiko Suzuki, Midorigaoka Mobara; Yoshihiro Imajo, Shimonagayoshi Mobara, all of Japan

[73] Assignees: Hitachi, Ltd., Tokyo; Hitachi Device Engineering Co., Ltd., Hayano Mobara, both of Japan

[21] Appl. No.: 419,000

[22] Filed: Apr. 7, 1995

[30] Foreign Application Priority Data

| Apr. 13, 1994 | [JP] | Japan | 6-075019 |
| Apr. 13, 1994 | [JP] | Japan | 6-075038 |
| Apr. 13, 1994 | [JP] | Japan | 6-075056 |
| Apr. 13, 1994 | [JP] | Japan | 6-075063 |
| Apr. 13, 1994 | [JP] | Japan | 6-075072 |

[51] Int. Cl.⁶ .............. G02F 1/1333; G02F 1/1335; H05K 5/00; H05K 7/00
[52] U.S. Cl. .............. 349/58; 349/59; 349/62; 349/70; 349/158; 361/681
[58] Field of Search ............. 359/83, 69, 82, 359/88, 48, 49, 50; 361/681; 345/206

[56] References Cited

U.S. PATENT DOCUMENTS

| 5,311,342 | 5/1994 | Watanabe | 359/88 |
| 5,432,626 | 7/1995 | Sasuga et al. | 359/83 |

FOREIGN PATENT DOCUMENTS

| 63-068817 | 3/1988 | Japan . | |
| 4-043327 | 2/1992 | Japan | 359/88 |
| 5-313179 | 11/1993 | Japan | 359/82 |

*Primary Examiner*—William L. Sikes
*Assistant Examiner*—Walter J. Malinowski
*Attorney, Agent, or Firm*—Antonelli, Terry, Stout & Kraus, LLP

[57] ABSTRACT

Herein disclosed are a liquid crystal display device and a data processing device, which can have their frame portions reduced in area to reduce the size and weight by extracting the terminals of video signals to only one side of a liquid crystal display panel and by arranging a video signal line driving circuit substrate to be connected with the terminals, only at one side of the display panel.

5 Claims, 40 Drawing Sheets

$y_i$ →

$y_{i+1}$ →

$y_{i+2}$ →

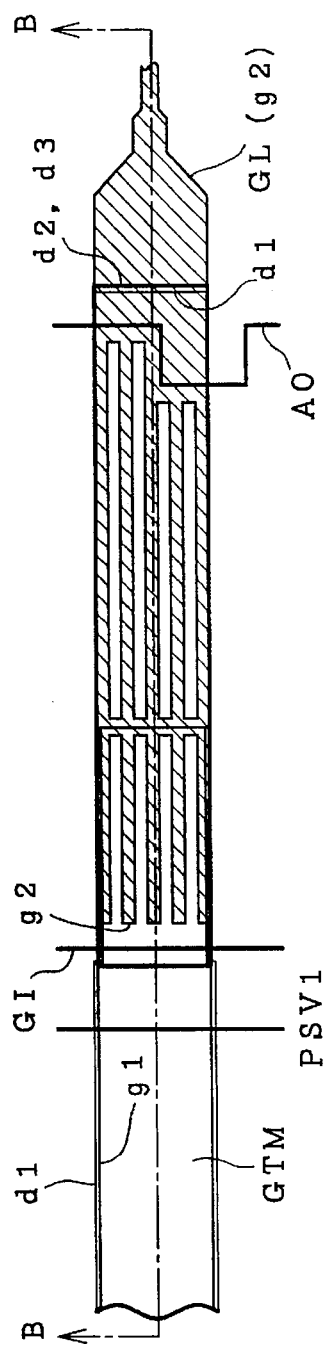
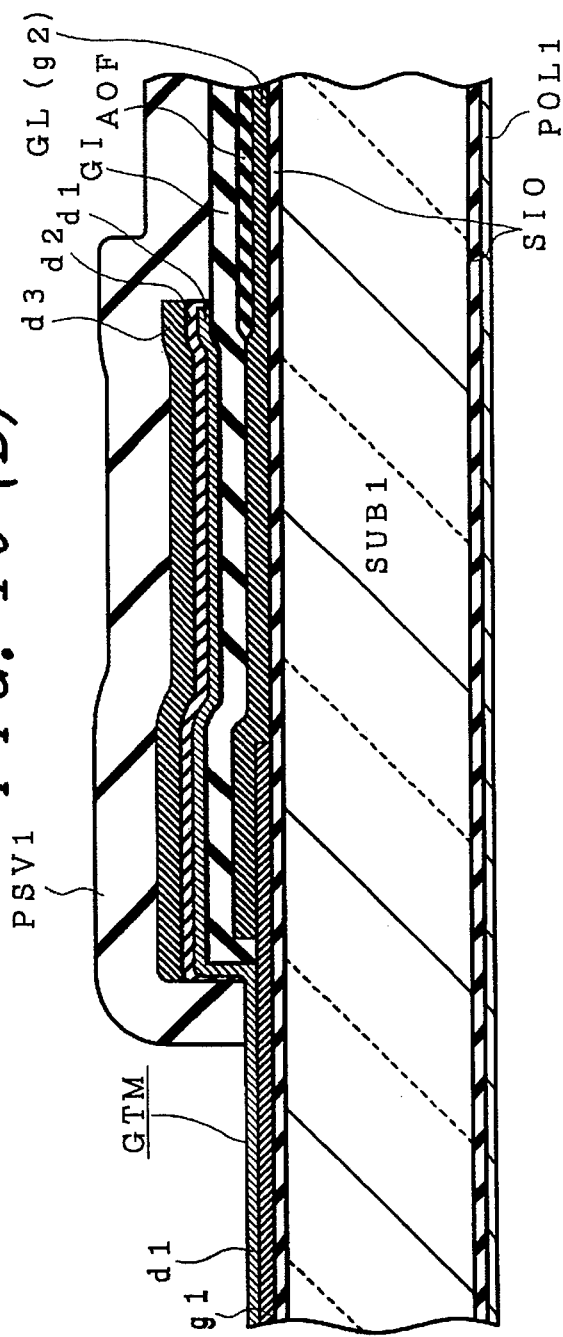
FIG. 10 (A)
FIG. 10 (B)

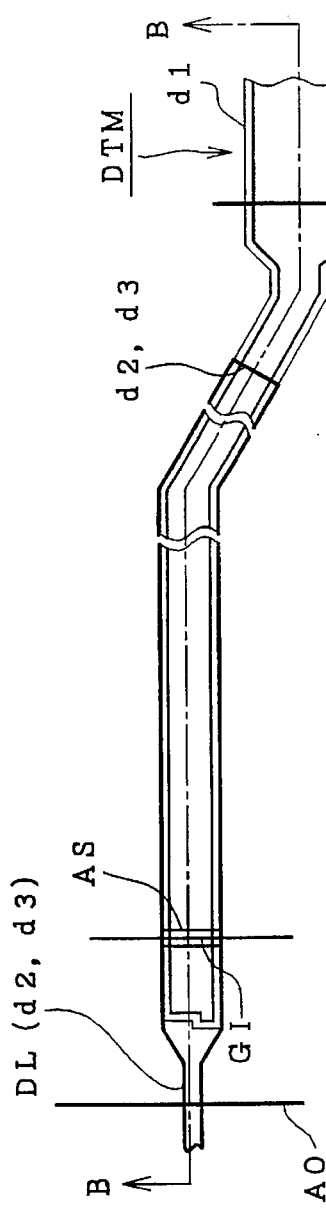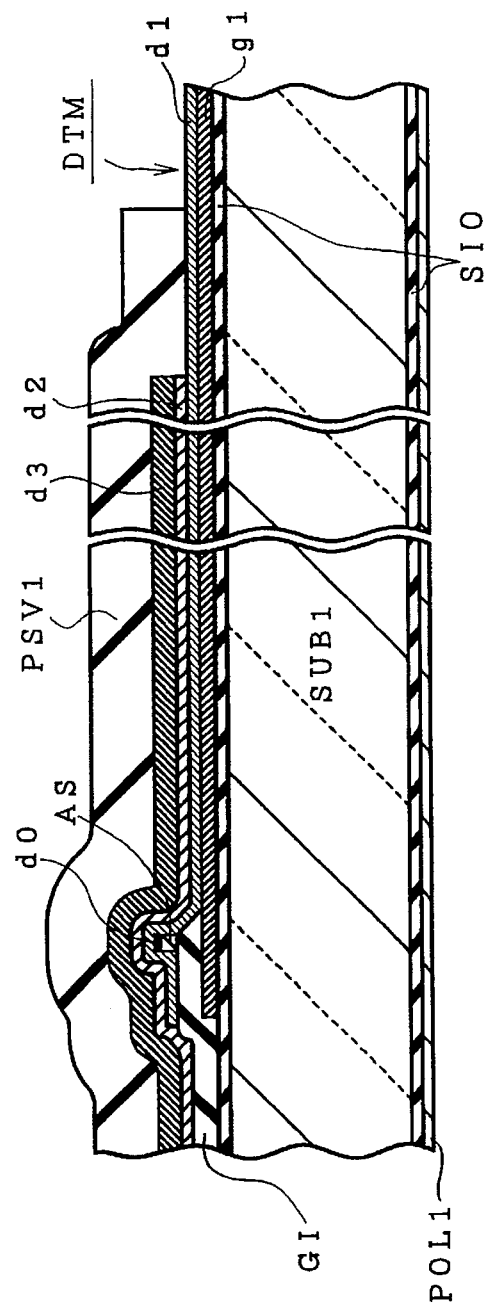
FIG. 11 (A)
FIG. 11 (B)

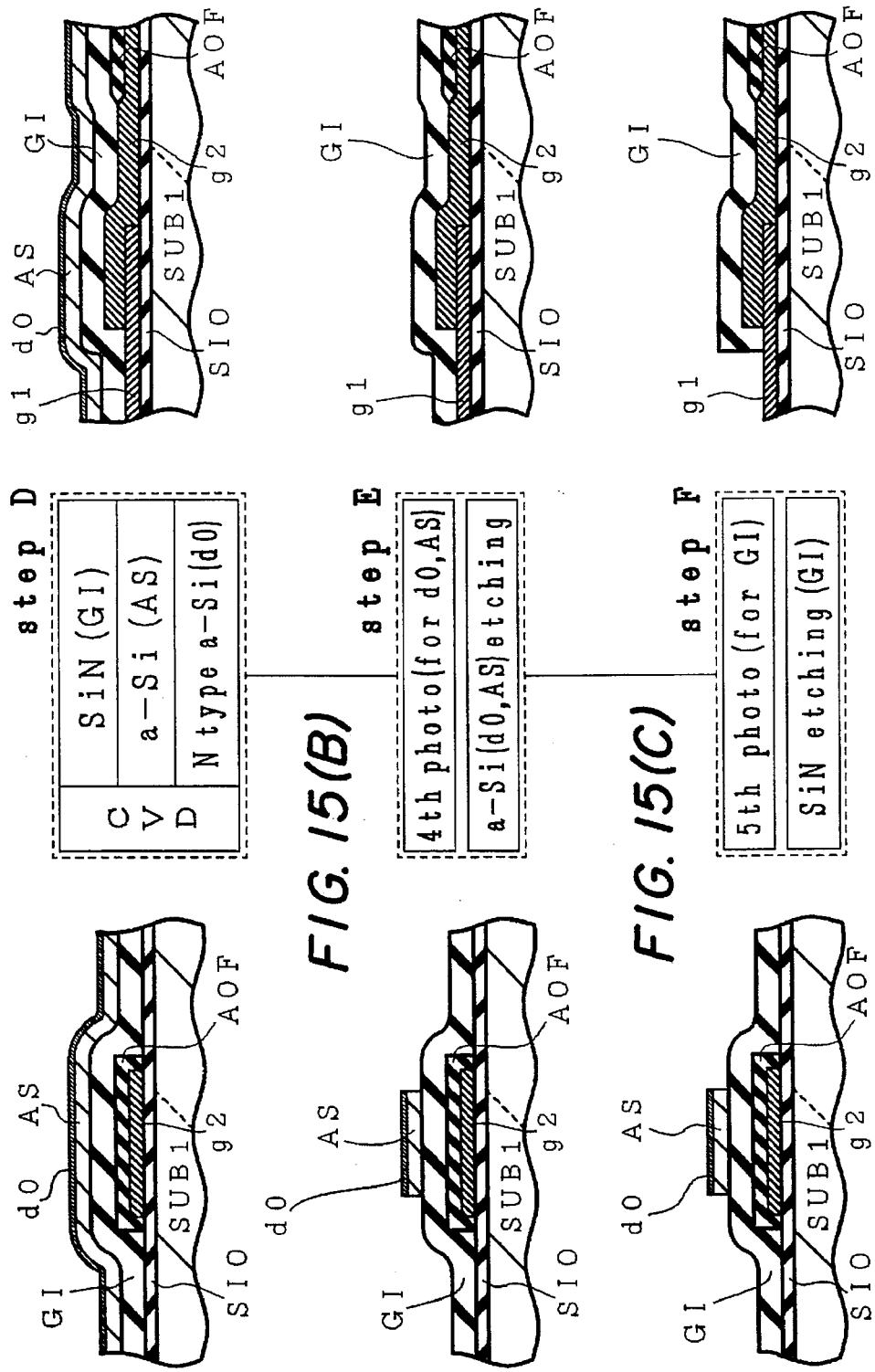

FIG. 29 (A)   FIG. 29 (B)
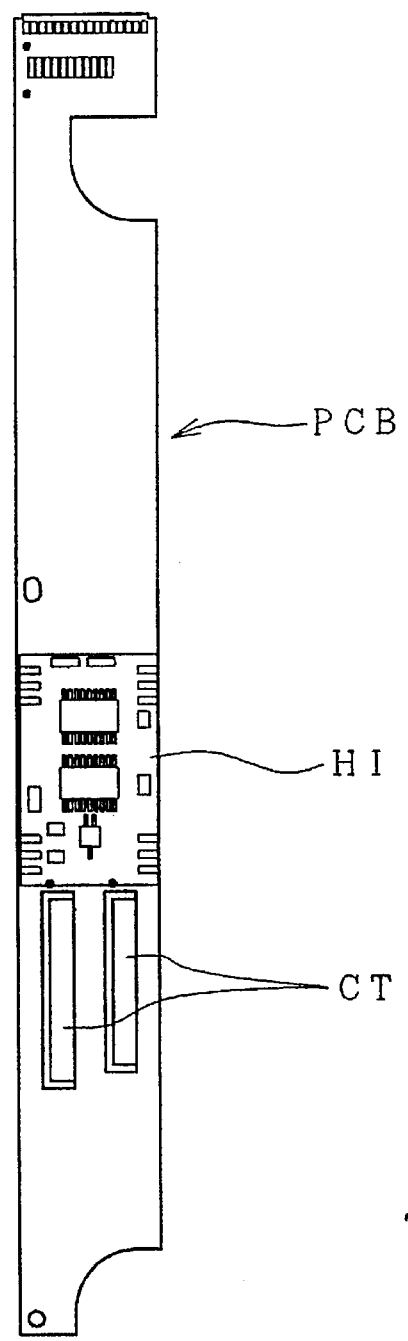
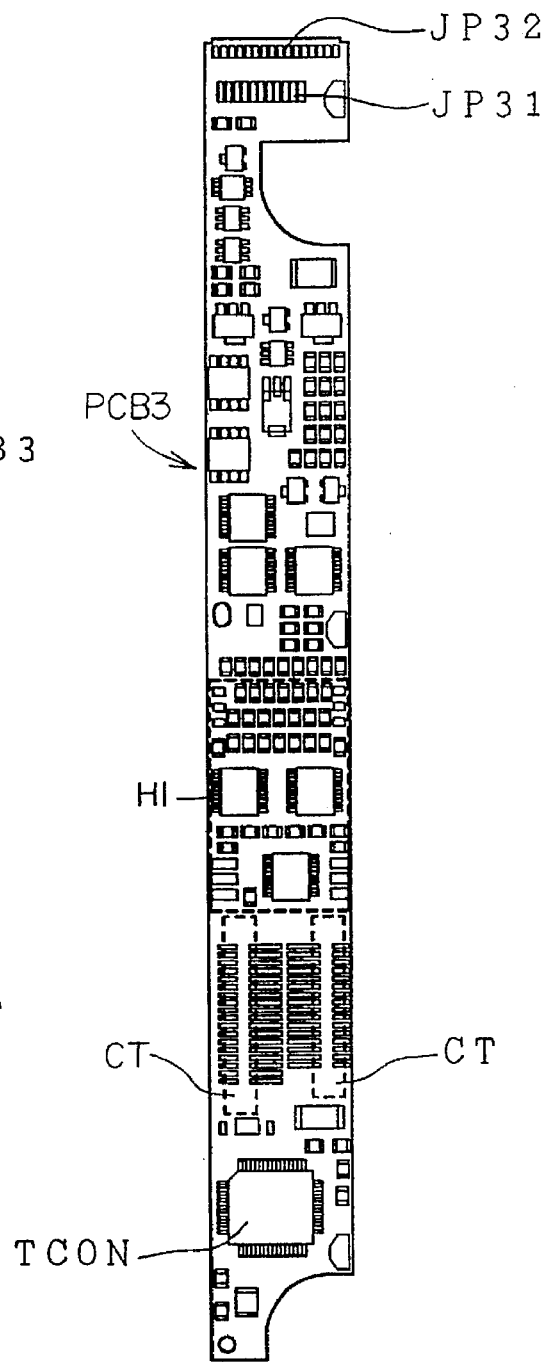

FIG. 33
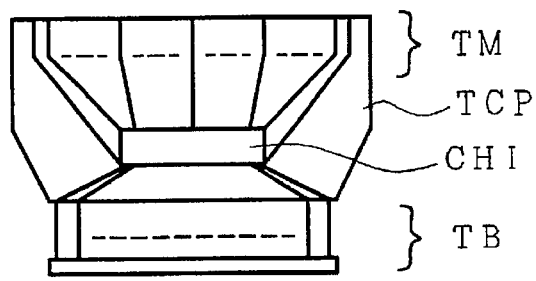
FIG. 34 (a)
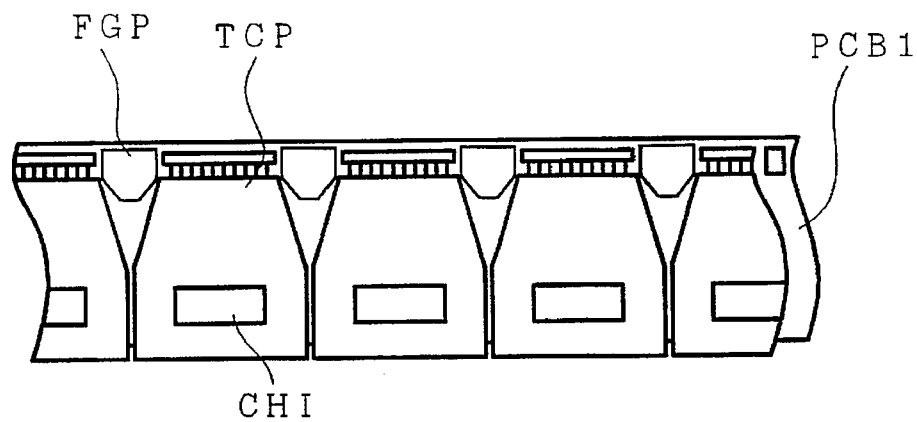
FIG. 34 (b)
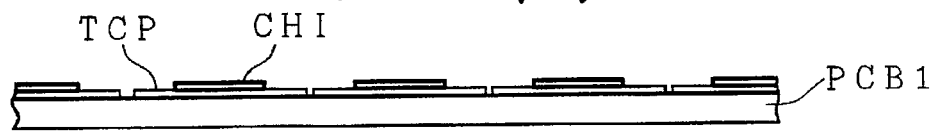
FIG. 35(a)   FIG. 35(b)   FIG. 35(c)
   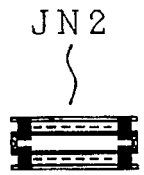   

LIQUID CRYSTAL DISPLAY DEVICE HAVING VIDEO SIGNAL DRIVING CIRCUIT MOUNTED ON ONE SIDE AND HOUSING

BACKGROUND OF THE INVENTION

1. Field of Industrial Application

The present invention relates to a liquid crystal display device comprising a back light including a liquid crystal display panel having a liquid crystal sealed between two superposed insulating substrates, a light guide plate arranged below the liquid crystal display panel, and a fluorescent tube arranged in the vicinity of the side of the light guide plate, and, more particularly, to a data processing device having said liquid crystal display device assembled as a display unit.

2. Prior Art

In a liquid crystal display device of active matrix type, nonlinear devices (e.g., switching devices) are disposed in a manner to correspond to a plurality of pixel electrodes arranged in matrix, respectively. The liquid crystal in each pixel is always drive, in principle, (at a duty ratio of 1.0). In comparison with the so-called "simple matrix type" which employs a time division driving system, therefore, the active system has better contrast and has become an indispensable technique particularly in a color liquid crystal display device. A typical example of the switching devices is a thin film transistor (TFT).

The liquid crystal display device is constructed to comprise: a liquid crystal display panel (or liquid crystal display element) prepared by superposing two transparent glass substrates at a predetermined gap such that their surfaces each having display pixel electrodes of a transparent conductive film and an orientation film laminated thereon are opposed to each other, by adhering the two substrates to each other by a seal member applied in a frame shape to the edge portion between the two substrates, by filling and sealing a liquid crystal from a liquid crystal sealing entrance formed in a portion of the seal member into the seal member between the two substrates, and by mounting or adhering a polarizing plate to the outer sides of the two substrates; a circuit substrate arranged outside of the outer peripheral portion of the liquid crystal display panel; an intermediate frame molded for holding the aforementioned individual members; a metallic shield casing formed with a liquid crystal display window for accommodating those individual members; and a back light arranged below the liquid crystal display panel for supplying a light to the liquid crystal display panel.

Here, the liquid crystal display device of active matrix type using the thin film transistors is known in Japanese Patent Laid-Open No. 309921/1988 or on pp. 193 to 210 of Nikkei Electronics entitled "Active Matrix Type Color Liquid Crystal Display of 12.5 Type Adopting Redundant Construction" and issued on Dec. 15, 1986 NIKKEI McGRAW-HILL for example.

SUMMARY OF THE INVENTION

[Problems to Be Solved by the Invention]

The liquid crystal display device of the prior art is constructed such that vide signal lines are alternately extracted to the two opposed longer sides of the liquid crystal display panel and such that video signal line driving circuit substrates are individually arranged outside of the longer sides. As a result, the periphery of the display unit, i.e., the so-called "frame portion" cannot have its area reduced to raise a problem in which the liquid crystal display device or a data processing device such as a personal computer or word processor having the liquid crystal display device assembled therein as the display unit has its external size enlarged to have a heavy weight.

A first target the present invention is to solve the above-specified problem.

In the liquid crystal display device, on the other hand, in order that the liquid crystal display panel having the liquid crystal sealed between the two superposed transparent glass substrates may be fixed in that device, both the two transparent substrates are pushed through rubber cushions. As a result, the two transparent glass substrates are so severely pushed that the gap of the liquid crystal between the two transparent glass substrates is changed to raise a problem of a display unevenness. As a result, the liquid crystal display panel cannot be so firmly held that a sufficient mechanical strength cannot be retained.

A second target the present invention is to solve the above-specified problem.

In the liquid crystal display device of the prior art having the back light composed of a fluorescent tube and a light guide plate, on the other hand, a sufficient consideration has not been taken into the place for arranging the fluorescent tube or the like so that said device is not sufficiently small-sized and light-weighted yet. In accordance with the development of recent years in the computerized society, it is desired that the data processing device such as a personal computer or word processor be progressed to a portable one having the size of a notebook, and that the liquid crystal display device assembled as the display unit and mainly determining the shape, size and weight of the data processing device be small-sized and light-weighted.

A third target the present invention is to solve the above-specified problem.

In the prior art, on the other hand, in order that the light guide plate of the back light and the liquid crystal display panel may be firmly held in said device, there arises a problem that the device has its external size enlarged.

A fourth target the present invention is to solve the above-specified problem.

In the prior art, on the other hand, when two lamp cables, with which are individually connected the one-side ends of the fluorescent tube constituting the back light, are to be extracted in one direction, there is no space for threading the lamp cables to allow these cables to bulging out of the liquid crystal display device. Thus, a large space for accommodating the lamp cables to make it difficult to reduce the size and weight of the device. On the other hand, the rubber bushes of the prior art for holding the fluorescent tube are active to hold only the fluorescent tube.

A fifth target the present invention is to solve the above-specified problem.

On the other hand, the light guide plate of the back light of the prior art has many spare areas for holding the light guide plate in said device so that it is made far larger than an effective light emitting portion. As a result, there is a problem that the device is large-sized and heavy-weighted.

A sixth target the present invention is to solve the above-specified problem.

In the prior art, on the other hand, after the liquid crystal display device has been assembled, there is a problem that the monolithic mold casing (or frame body) has its bottom face caused to bulge by the downward force which is exerted upon the bottom face by the weight of the liquid crystal display panel, the light guide plate and so on. In order to suppress this bulge, the mold casing has to be thickened to disable the liquid crystal display device to be thinned and light-weighted.

A seventh target the present invention is to solve the above-specified problem.

In the liquid crystal display device of the prior art, on the other hand, the cables of the fluorescent tube of the back light extend along the outer side of said device so that said cables and an inverter to be connected with the leading ends of the former bulge out of the device. Thus, there arises a problem that the external size is substantially enlarged.

An eighth target the present invention is to solve the above-specified problem.

In recent years, on the other hand, the liquid crystal display device of active matrix type using thin film transistors as its switching elements is demanded to have the multi-gradation and the single power source so that its performance and facility may be improved. However, the circuit for realizing those demands consumes much power. If, moreover, the circuit means is packaged in compact, the highly dense packaging results to raise a problem in the hear liberation in the parts packaged on the circuit substrate.

A ninth target the present invention is to solve the above-specified problem.

On the other hand, in case the number of electronic parts constituting the liquid crystal display panel driving circuit is large, the prior art is practiced, for example, by superposing the circuit substrates in two stages, by packaging the numerous electronic parts on the individual upper and lower faces of the two circuit substrates and by electrically connecting the two circuit substrates by joiners. According to this practice, however, the number of circuit substrate is increased, and the joiners have to be added so increase the cost for the material and the number of working steps. The resultant problem is a rise in the production cost.

A tenth target the present invention is to solve the above-specified problem.

FIG. 46 is an internal top plan view of an essential portion of the liquid crystal display device of the prior art.

Letters SHD designate a metallic shield casing; letters PNL designate a liquid crystal display panel; letters PCB1 and PCB2 designate circuit substrates arranged in the outer peripheral portion of the liquid crystal display panel PNL; letters JN designate a joiner for electrically connecting the circuit substrates PCB1 and PCB2; letters SH designate mounting holes which are formed in the shield casing SHD for mounting said liquid crystal display device as the display unit in the data processing device such as a personal computer or word processor.

The mounting holes SH are usually formed in the four corners of the shield casing SHD. If, however, the electric connections between the circuit substrates PCB1 and PCB2 are to be taken by using the joiners JN, one circuit substrate PCB2 is formed into not a rectangular shape but a special shape having a projection, as shown in FIG. 46. This shape is followed by problems that the extraction efficiency of the circuit substrate is not satisfactory to raise the production cost of the circuit substrate.

An eleventh target of the present invention is to solve the above-specified problem.

In the outer peripheral portion of the liquid crystal display panel, on the other hand, there are arranged a plurality of divided circuit substrates, which are electrically connected by one joiner.

In accordance with development of recent years in the multiple colors of the color liquid crystal display device, the number of video signal lines for designating the gradations of red, green and blue colors increases together with the number of gradation voltages so that the portion having the function of the interface between that liquid crystal display device and the data processing device side of the personal computer or the like to be assembled with that liquid crystal display device is so complicated as to make difficult the electric connections between the drain side circuit substrate and the interface circuit substrate. Moreover, not only the number of video signal lines but also the number of connection lines are increased in accordance with the abrupt increase in the number of colors of the liquid crystal display device, because the connection lines effect the connections of the gradation voltages increasing in proportion to the color number, the clock and the power supply voltage.

As the number of connection lines thus increases, the space for mounting the joiners is enlarged to raise a problem that said device is large-sized.

A twelfth target of the present invention is to solve the above-specified problem.

On the other hand, the mounting holes, as formed in the liquid crystal display device for mounting the display device as the display unit in the data processing device such as the personal computer or word processor, are usually formed in the corners of the metallic shield casing at the portions (as will be called the "drawn portions") which are integral with the metal plate forming said shield casing and drawn to form a parallel plane at a level different from the metal plate. In case the corners of the shield casing are drawn, the drawn portions can be reduced generally to a quadrant by removing the side face of the shield casing at said corners. However, from the relation to the arrangement of the packaged parts of the circuit substrate or the electric connections of the circuit substrates, however, it is demanded to form the mounting holes not at the corners but in the intermediate portions spaced at a considerable distance from the corners. In this case, the shape of the drawn portions of the mounting holes cannot be made quadrant but semicircular from the conveniences of the drawing operations. As a result, the area necessary for the mounting holes is enlarged to invite disadvantages in reducing the size and weight of the liquid crystal display device.

A thirteenth target of the present invention is to solve the above-specified problem.

In the latest years, on the other hand, there is a problem that the liquid crystal display device emits harmful radiative electric waves which cause the EMI (i.e., electromagnetic interference). It is, therefore, urgent from the safe drives of airplanes, ships or automobiles handling the electric waves to reduce the EMI.

A fourteenth target of the present invention is to solve the above-specified problem.

In order to prevent the aforementioned EMI, there has been proposed in Japanese Patent Application No. 53496/1992 a technique in which the circuit substrate arranged on the outer peripheral portion of a liquid crystal display panel is equipped on its face with frame ground pads connected with ground wiring lines and in which pawls (or slender projections) formed by noting a metallic shield casing partially are soldered to the frame ground pads. According to this technique, the ground wiring lines of the circuit substrate are connected with the common metallic shield casing having a sufficiently low impedance so that the ground wiring lines can be strengthened in the higher frequency range to suppress the emission of the harmful radiative electric waves. In this prior art, however, the shield casing is formed with the pawls on its upper face (i.e., the so-called frame portion around the display) so that the pawls may come, when folded toward the circuit substrate, into abutment against the circuit substrate, thus raising a problem that the folding workability is poor. Since, moreover, the pawls are to be soldered to the frame ground pads, the soldering operations have to be carried out through the small openings around the pawls after the shield casing has been attached to cover the circuit substrate. This also deteriorates the soldering workability.

A fifteenth target of the present invention is to solve the above-specified problems.

In the liquid crystal display device of the prior art, on the other hand, the video signal lines are alternately extracted above and below the liquid crystal display panel, and two video signal line driving circuit substrates to be connected with the input terminals of the extracted video signal lines are individually arranged on the upper and lower sides of the outer peripheral portion of the liquid crystal display panel where the electronic parts are arranged along the flow of the signals which are fed from an external personal computer through said device. As a result, a connector to be connected with the personal computer or the like and a signal source integrated circuit are arranged at the central portion of an interface circuit substrate. Incidentally, if the arrangement of the electronic parts along the signal flow of the aforementioned system is taken in case the video signal lien driving circuit substrate is arranged at only one side of the liquid crystal display panel, then the layout is made such that the connector is arranged at the remote end portion of the interface circuit substrate from the video signal line driving circuit substrate, i.e., at the end portion closest to the corner of the metallic shield casing for accommodating the liquid crystal display panel and the circuit substrate, and such that the signal source integrated circuit is arranged adjacent to the connector in the direction apart from the corner. If the connector is then to be arranged at the remotest end of the interface circuit substrate, i.e., in the vicinity of the corner of the shield casing, the corners of the metallic shield casing having the mounting hole are covered with the mold casing having the aligned mounting holes because the connector cannot be covered with the monolithic mold casing to be united with the metallic shield casing so that it may be connected with the personal computer or the like. As a result, the two casings cannot be fixed by fastening them by threading the screws or the like through those mounting holes. As a result, the mechanical strength is deteriorated to raise a problem that the reliability is lowered.

A sixteenth target of the present invention is to solve the above-specified problem.

In order to suppress the emission of the unnecessary radiative electric waves to cause the EMI, a plurality of resistors and capacitors for smoothing the signal wave forms are discretely arranged in the prior art in the vicinity of the signal source integrated circuit or in the course of the signal transmission route. As a result, there are required several spaces for interposing the resistors and capacitors in the vicinity of the signal source integrated circuit and between the tape carrier packages mounting the driving IC chips, so that the dead spaces are so enlarged that the electronic parts cannot be packaged in a high density.

A seventeenth target of the present invention is to solve the above-specified problem.

A first object of the present invention is to provide a liquid crystal display device and a data processing device, which can be small-sized and light-weighted by reducing the area of the frame portion.

A second object of the present invention is to provide a liquid crystal display device which can firmly hold the liquid crystal display panel to have a high mechanical strength.

A third object of the present invention is to provide a liquid crystal display device which can be small-sized and light-weighted by efficiently accommodating a fluorescent tube of a back light.

A fourth object of the present invention is to provide a liquid crystal display device which can be small-sized and light-weighted by firmly holding a light guide plate and a liquid crystal display panel in the device.

A fifth object of the present invention is to provide a liquid crystal display device which can be small-sized and light-weighted by holding the cables of the fluorescent tube while being prevented from bulging out of the liquid crystal display device.

A sixth object of the present invention is to provide a liquid crystal display device which can be small-sized and light-weighted by efficiently holding the light guide plate in the device and by reducing the size of the light guide plate as small as possible.

A seventh object of the present invention is to provide a liquid crystal display device which can be small-sized and light-weighted by suppressing the bulging of the bottom face of a mold casing due to the weight of the liquid crystal display panel, the light guide plate or the like and by thinning the mold casing.

An eighth object of the present invention is to provide a liquid crystal display device which can be small-sized and light-weighted by confining the cables and the inverter within the device.

A ninth object of the present invention is to provide a liquid crystal display device which can realize the multi-gradation, the single power source and the compact packaging by solving the problem of heat liberation of the parts on the circuit substrate.

A tenth object of the present invention is to provide a liquid crystal display device which can reduce the number of electronic parts and the number of working steps to reduce the production cost.

An eleventh object of the present invention is to provide a liquid crystal display device which can have a high extraction efficiency of the circuit substrate to reduce the cost for the material of the circuit substrate.

A twelfth object of the present invention is to provide a liquid crystal display device which can be small-sized and light-weighted by connecting the circuit substrate in a small space even in case the number of connections between the circuit substrates is large.

A thirteenth object of the present invention is to provide a liquid crystal display device which can be small-sized and light-weighted by reducing the drawn portions of the mounting holes generally to a quadrant in case the mounting holes are to be formed in the intermediate portions of the shield casing.

A fourteenth object of the present invention is to provide a liquid crystal display device which can suppress emission of harmful radiative electric waves.

A fifteenth object of the present invention is to provide a liquid crystal display device which can have satisfactory folding and soldering workabilities of the pawls formed integral with the shield casing.

A sixteenth object of the present invention is to provide a liquid crystal display device which can have a high mechanical strength and a high reliability.

A seventeenth object of the present invention is to provide a liquid crystal display device which can reduce the dead space to package the electronic parts highly densely when the resistors and capacitors are mounted for the countermeasures of the EMI.

[Means for Solving the Problems]

In order to solve the aforementioned first problem, the liquid crystal display device of the present invention is characterized in that a video signal line driving circuit substrate is arranged on only one of the longer sides of the display panel and is connected with the terminals of the video signal lines.

Moreover, a liquid crystal display device comprising a liquid crystal display panel, in which first and second insulating substrates are superposed at a predetermined gap such that their faces respectively formed with transparent pixel electrodes and an orientation film are opposed to each other, in which the two substrates are adhered to each other through a seal member applied in a frame shape on the edge portions between the two substrates while sealing a liquid crystal in the seal member between the two substrates, and in which a plurality of scanning signal lines and video signal lines arrayed on the opposed face of the first insulating substrate have their individual terminals disposed outside of the seal member, characterized in that a video signal line driving circuit substrate is arranged on only one of the longer sides of the display panel and is connected with the terminals of the video signal lines.

Moreover, a liquid crystal display device comprising a liquid crystal display panel in which there are superposed at a predetermined gap: a first insulating substrate including a plurality of scanning signal lines extending in a horizontal direction and arranged in a vertical direction and a plurality of video signal lines extending in a vertical direction and arranged in a horizontal direction, and having a first pixel electrode and a switching element at the intersecting regions between the two adjacent ones of the scanning signal lines and the two adjacent ones of the video signal lines; and a second insulating substrate having a second pixel electrode opposed to the first pixel electrode, and in which a liquid crystal is sealed between the two substrates, characterized in that a video signal line driving circuit substrate is arranged on only one of the longer sides of the display panel and is connected with the terminals of the video signal lines.

Moreover, a liquid crystal display device is characterized in that no circuit substrate is arranged at the other side of the display panel which is arranged with the video signal line driving circuit substrate.

Moreover, a liquid crystal display device is characterized in that two sides perpendicular to the side of the display panel, which is arranged with the video signal line driving circuit substrate, is arranged at one side with a scanning signal line driving circuit substrate and at the other with a circuit substrate including a power source circuit and a conversion circuit.

Moreover, the liquid crystal display device is characterized in that the video signal lien driving circuit substrate is arranged above the display of a display unit when the liquid crystal display device is assembled as the display unit in a predetermined data processing device.

In order to solve the aforementioned second problem, moreover, a liquid crystal display device according to the present invention is characterized in that the liquid crystal display panel sealing a liquid crystal between the two superposed insulating substrates is formed with a single plate portion so that the liquid crystal display panel is held through an elastic member between on at least one of the upper and lower faces of the single plate portion and fixed in the device.

Moreover, a liquid crystal display device comprising: a liquid crystal display panel sealing a liquid crystal between two superposed transparent glass substrates; a circuit substrate arranged on the outer peripheral portion of the liquid crystal display panel; and a back right arranged below the liquid crystal display panel, characterized: in that a metallic shield casing for accommodating the liquid crystal display panel and the circuit substrate and a mold casing monolithically molded for accommodating the back light are united by their individual fitting portions; and in that the liquid crystal display panel is held through an elastic member on a single plate portion formed on the liquid crystal display panel and is fixed in the device.

Moreover, the liquid crystal display device is characterized in that the elastic member is interposed between the single plate portion of the liquid crystal display panel and the back light.

Moreover, a liquid crystal display device comprising: a liquid crystal display panel sealing a liquid crystal between two superposed transparent glass substrates; circuit substrates arranged at the two, three or four sides of the peripheral portion of the liquid crystal display panel; a light guide plate for a back light arranged below the liquid crystal display panel; a metallic shield casing for accommodating the liquid crystal display panel and the circuit substrates; and a mold casing monolithically molded for accommodating the back light, the metallic shield casing and the mold casings being united by fitting their individual fitting members, characterized in that the liquid crystal display panel is formed with a single plate portion so that the liquid crystal display panel and the light guide plate are held through an elastic member between the single plate portion and the light guide plate and fixed in the device.

Moreover, a liquid crystal display device is characterized in that a double sided adhesive sheet is sandwiched between the liquid crystal display panel and the metallic shield casing.

Moreover, a liquid crystal display device is characterized in that the single plate portion is formed on the three sides or the entire periphery of the liquid crystal display panel although it is intrinsically necessary to arrange the terminal electrodes.

In order to solve the aforementioned third problem, moreover, the present invention is characterized in that the fluorescent tube of the back light is arranged below a plurality of tape carrier packages arranged on the outer peripheral portion of the liquid crystal display panel.

Moreover, a liquid crystal display device comprising: a liquid crystal display panel; a light guide plate arranged below the liquid crystal display panel; a fluorescent tube arranged in the vicinity of at least one side face of the light guide plate; and a plurality of tape carrier packages arranged on the outer peripheral portion of the liquid crystal display panel, characterized in that the fluorescent tube is arranged below the plurality of tape carrier packages.

Moreover, a liquid crystal display device is characterized in that one of the longer sides of the liquid crystal display panel and one of the shorter sides of the liquid crystal display panel are formed only on their outer peripheral portion with a plurality of the tape carrier packages, below which is arranged the fluorescent tube.

In order to solve the aforementioned fourth problem, a liquid crystal display device comprising: a liquid crystal display panel; a light guide plate arranged below the liquid crystal display panel; a fluorescent tube arranged in the vicinity of the side face of the light guide plate; at least one optical sheet arranged on the upper face of the light guide plate; a casing for accommodating the light guide plate and the fluorescent tube, characterized: in that the side portions of the at least one optical sheet are protruded from and placed on the side wall of the casing; and in that an elastic member such as a rubber cushion is interposed between the optical sheet on the side wall and the liquid crystal display panel.

Moreover, a liquid crystal display device is characterized in that the elastic member is sandwiched between the optical sheet on the side wall and the upper transparent glass substrate of the liquid crystal display panel.

Moreover, a liquid crystal display device comprising: a liquid crystal display panel; a circuit substrate arranged in the outer peripheral portion of the liquid crystal display panel; a light guide plate arranged below the liquid crystal display panel; a fluorescent tube arranged in the vicinity of at least one side face of the light guide plate; at least one optical sheet arranged on the upper face of the light guide plate; a metallic shield casing accommodating the liquid crystal display panel and the circuit substrate; and a mold casing monolithically molded and accommodating the light guide plate and the fluorescent tube together, characterized: in that at least one of the four sides of the at least one optical sheet has its end portion protruded and placed on the side wall of the mold casing; in that an elastic member is interposed between the optical sheet on the side wall and the lower face of an upper transparent glass substrate of the liquid crystal display panel; and in that the shield casing and the mold casing are united by fitting their individual fitting portions.

Moreover, a liquid crystal display device is characterized in that the optical sheet is a diffusive sheet mounted on the upper face of the light guide plate, and a prism sheet formed on the upper face of the diffusive sheet.

In order to solve the aforementioned fifth problem, according to the present invention, a liquid crystal display device comprises a back light having a fluorescent tube and cables of the fluorescent tube, characterized by a holding member having an elastic member for holding both the fluorescent tube and the cables.

Moreover, a liquid crystal display device comprises a back light including a fluorescent tube and two cables having their individual one ends connected with the two ends of the fluorescent tube and their other ends extracted in a common direction, characterized in that a retaining member is formed one or more holes or grooves for holding both the fluorescent tube and one or two of the cables.

In order to solve the aforementioned sixth problem, according to the present invention, a liquid crystal display device in which a light guide plate for a back light arranged below a liquid crystal display panel and a fluorescent tube arranged in the vicinity of the side face of the light guide plate are accommodated in a casing, is characterized in that the light guide plate is prevented from moving toward the fluorescent tube by small projections which are formed on the inner face of the casing between the light guide plate and the fluorescent tube.

Moreover, a liquid crystal display device is characterized in that the casing is a monolithic mold casing.

Moreover, a liquid crystal display device is characterized in that the light guide plate is generally rectangular.

Moreover, a liquid crystal display device is characterized in that the light guide plate has a size as similar to that of an effective light emitting portion as possible.

Moreover, a liquid crystal display device is characterized in that the projections are integral with the casing.

Moreover, a liquid crystal display device is characterized in that two projections are formed in the vicinity of the two end portions of the fluorescent tube.

Moreover, a liquid crystal display device is characterized in that the three sides of the light guide plate other than one at the side of the fluorescent tube are held by the inner wall of the a light guide plate accommodating portion which is formed in the casing along the generally rectangular shape of the light guide plate.

In order to solve the aforementioned seventh problem, according to the present invention, a liquid crystal display device is characterized in that an opening is formed at a central portion except for the frame portion of the casing for holding a light guide plate.

Moreover, a liquid crystal display device, in which a liquid crystal display panel and a light guide plate arranged below the former are accommodated in a monolithic mold casing and a metallic shield casing, is characterized in that an opening is formed at a central portion except for the frame portion of the mold casing.

Moreover, a liquid crystal display device comprising: a metallic shield casing for accommodating a liquid crystal display panel; a mold casing monolithically molded for accommodating a light guide plate to be arranged below the liquid crystal display panel; and an elastic member interposed between the liquid crystal display panel and the light guide plate, wherein the shield casing is pushed into the device to unit the shield casing and the mold casing by fitting their individual fitting portions, is characterized in that the mold casing is formed with an opening at its central portion excepting its frame portion.

In order to solve the aforementioned eighth problem, according to the present invention, a liquid crystal display device is characterized in that the cables of the back light are fitted in a groove formed in the casing.

Moreover, a liquid crystal display device comprising: a fluorescent tube; and a monolithic mold casing for accommodating the fluorescent tube, is characterized in that two cables connected with the two ends of the fluorescent tube are fitted in a groove formed in the mold casing.

Moreover, a liquid crystal display device comprising: a liquid crystal display panel; a circuit substrate arranged on the outer circumferential portion of the liquid crystal display panel; a light guide plate arranged below the liquid crystal display panel; a fluorescent tube arranged on at least one side face of the light guide plate; a metallic shield casing for accommodating the liquid crystal display panel and the circuit substrate together; and a mold casing monolithically molded for accommodating the light guide plate and the fluorescent tube, is characterized in that two cables having their individual one ends connected with the two ends of the fluorescent tube are accommodated in a groove which is made integral with the side wall of the mold casing.

Moreover, a liquid crystal display device is characterized in that the first cable connected with the first end portion of the fluorescent tube is fitted in the groove formed in the side wall of the mold casing along the fluorescent tube.

Moreover, a liquid crystal display device is characterized: in that the first cable connected with the first end portion of the fluorescent tube is fitted in the groove formed in the side wall of the mold casing along the fluorescent tube; and in that the first cable downstream of the second end portion of the fluorescent tube and a second cable connected with the end portion are extracted generally perpendicularly of the direction of the first cable upstream of the second end portion.

Moreover, a liquid crystal display device is characterized in that the first cable downstream of the second end portion of the fluorescent tube and the second cable connected with the second end portion are extracted between the mounting holes of the mold casing and a circuit substrate arranged on the outer peripheral portion of the shorter side of the liquid crystal display panel.

Moreover, a liquid crystal display device is characterized in that an inverter connected with each other end of the cable is accommodated in an accommodating portion outside of the light guide plate, as formed in the mold casing, without bulging out of the mold casing.

In order to solve the aforementioned ninth problem, according to the present invention, a liquid crystal display device is characterized in that a notch is formed in a portion corresponding an exothermic portion.

Moreover, a liquid crystal display device comprising: a liquid crystal display panel; circuit substrates arranged at three or four side of the outer peripheral portion of the liquid crystal display panel; an a casing is characterized in that a notch is formed in the casing at a portion corresponding to the exothermic portion on the circuit substrates.

Moreover, a liquid crystal display device comprising: a liquid crystal display panel; circuit substrates arranged at three or four sides of the outer peripheral portion of the liquid crystal display panel; a back light arranged below the liquid crystal display panel; a metallic shield casing for accommodating the liquid crystal display panel and the circuit substrates together; and a mold casing monolithically molded for accommodating the back light, wherein the metallic shield casing and the mold casing are united, is characterized in that the mold casing is notched at a portion corresponding to an exothermic portion mounted on the circuit substrates.

In order to solve the aforementioned tenth problem, moreover, according to the present invention, a liquid crystal display device comprising: a liquid crystal display panel; and a circuit substrate formed with a circuit for driving the liquid crystal display panel, is characterized in that a hybrid integrated circuit formed by hybridly integrating a portion of the circuit is packaged in the circuit substrate.

Moreover, a liquid crystal display device is characterized in that electronic parts are packaged on the circuit substrate between the circuit substrate and the hybrid integrated circuit.

In order to solve the aforementioned eleventh problem, according to the present invention, a liquid crystal display device comprising: a liquid crystal display panel; a plurality of divided circuit substrates arranged on the outer peripheral portion of the liquid crystal display panel and electrically connected by joiners; a casing for accommodating the liquid crystal display panel and the circuit substrates together; and mounting holes formed in the casing for the device, is characterized in that at least one of the mounting holes is arranged away from the corner of the casing.

Moreover, a liquid crystal display device comprising: a liquid crystal display panel; circuit substrates divided and arranged at the two, three or four sides of the outer peripheral portions of the liquid crystal display panel; and a casing for accommodating the liquid crystal display panel and the circuit substrates together and formed with mounting holes, is characterized: in that at least one of the mounting holes is arranged at a distance from the corner of the casing; and in that the circuit substrate having a generally rectangular shape are divided into a plurality of sheets and are electrically connected in the vicinity of the corners by joiners.

Moreover, a liquid crystal display device comprising: a liquid crystal display panel; a plurality of divided circuit substrates arranged at two, three or four sides of the outer peripheral portion of the liquid crystal display panel; a back light arranged below the liquid crystal display panel; a metallic shield casing for accommodating the liquid crystal display panel and the circuit substrates together; and a mold casing monolithically molded for accommodating the back light, wherein the shield casing and the mold casing are united, is characterized: in that at least one of the mounting holes is arranged at a distance from the corners of the shield casing and the mold casing; and in that the circuit substrate having a generally rectangular shape are divided into a plurality of sheets and are electrically connected in the vicinity of the corners by joiners.

In order to solve the aforementioned twelfth problem, according to the present invention, a liquid crystal display device comprising a plurality of circuit substrates, is characterized in that the circuit substrates are electrically connected with each other by two or more electric connection means superposed at two or more stages.

Moreover, a liquid crystal display device comprising circuit substrates divided into a plurality and arranged at the two, three or four sides of the outer circumferential portion of a liquid crystal display panel, is characterized in that the circuit substrates are electrically connected with each other through at least two joiners which are superposed at two or more stages in the thickness direction of the display device.

Moreover, a liquid crystal display device is characterized in that one of the plurality of electrically connected circuit substrates is an interface circuit substrate.

In order to solve the aforementioned thirteenth problem, according to the present invention, a liquid crystal display device having a metallic casing formed with mounting holes, is characterized: in that the mounting holes are positioned at intermediate portions spaced at a predetermined distance from the corners of the casing and in a drawn portion which is made integral with a metallic plate forming the casing and which forms a parallel plane at a different level as that of the metal plate; in that the drawn portion is given generally a quadrant shape; and in that the quadrant shape is formed with a notch in its radial portion between the drawn portion and the metal plate adjacent to the drawn portion.

Moreover, a liquid crystal display device comprising: a liquid crystal display panel; circuit substrates arranged at two, three or four sides of the outer peripheral portion of the liquid crystal display panel; a back light arranged below the liquid crystal display panel; a metallic shield casing for accommodating the liquid crystal display panel and the circuit substrates; and a monolithic mold casing for accommodating the back light, in which the shield casing and the mold casing are united, and in which the shield casing and the mold casing are formed with mounting holes aligned with each other, is characterized: in that the mounting holes are positioned at intermediate portions spaced at a predetermined distance from the corners of the shield casing and in a drawn portion which is made integral with a metallic plate forming the shield casing and which forms a parallel plane at a different level as that of the metal plate; in that the drawn portion is given generally a quadrant shape; and in that the quadrant shape is formed with a notch in its radial portion between the drawn portion and the metal plate adjacent to the drawn portion.

In order to solve the aforementioned fourteenth and fifteenth problems, according to the present invention, a liquid crystal display device is characterized: in that the circuit substrates are formed with a frame ground pad on at least one portion thereof; and in that a pawl made integral with the side face of the shield casing is connected with the frame ground pad.

Moreover, a liquid crystal display device comprising: a liquid crystal display panel; circuit substrates disposed at the two, three or four outer peripheral portions of the liquid crystal display panel; and a metallic shield casing accommodating the liquid crystal display panel and the circuit substrates and having a display window for exposing the liquid crystal display panel to the outside, characterized: in that the circuit substrates are formed with a frame ground pad on at least one portion thereof; and in that a pawl made integral with the side face of the shield casing is connected with the frame ground pad.

Moreover, a liquid crystal display device is characterized: in that the pawls are formed by cutting a portion of the side face; and in that the pawls are connected by folding inward of the liquid crystal display device.

Moreover, a liquid crystal display device is characterized in that the pawl and the frame ground pad are soldered to each other.

Moreover, a liquid crystal display device is characterized in that the circuit substrate is divided into a plurality of sheets.

In order to solve the aforementioned sixteenth problem, according to the present invention, a liquid crystal display device comprising: a first circuit substrate arranged outside of a first side of a liquid crystal display panel for driving signal lines; a second circuit substrate arranged outside of a second side adjacent to and perpendicular to the first side and having a connector for connection with the outside; a casing having a mounting hole in the vicinity of its corner for accommodating the liquid crystal display panel and the first and second circuit substrates together, is characterized: in that the first casing and the second casing are united together; in that the second circuit substrate is equipped with an electronic part having a lower height at its end portion farther from the first circuit substrate; and in that the connector is arranged adjacent to the electronic part in the direction apart from the end portion.

Moreover, a liquid crystal display device comprising: a first circuit substrate arranged outside of a first side of a liquid crystal display panel for driving signal lines; a second circuit substrate arranged outside of a second side adjacent to and perpendicular to the first side and having a connector for connection with the outside; a first casing having a first mounting hole in the vicinity of its corner for accommodating the liquid crystal display panel and the first and second circuit substrates; a back light disposed below the liquid crystal display panel; and a second casing having a second mounting hole aligned with the first mounting hole for accommodating the back light, is characterized: in that the first casing and the second casing are united together; in that the second circuit substrate is equipped with an electronic part having a lower height at its end portion farther from the first circuit substrate; and in that the connector is arranged adjacent to the electronic part in the direction apart from the end portion.

Moreover, a liquid crystal display device is characterized in that no circuit substrate is arranged outside of the third side opposed to the first side of the liquid crystal display panel arranged with the first circuit substrate.

Moreover, a liquid crystal display device is characterized: in that the first circuit substrate is a video signal line driving circuit substrate; and in that a scanning signal line driving circuit substrate is arranged at the fourth side opposed to the second side of the liquid crystal display panel arranged with the second circuit substrate.

Moreover, a liquid crystal display device is characterized in that the second circuit substrate is an interface circuit substrate having a power source circuit and a conversion circuit.

Moreover, a liquid crystal display device is characterized in that the lower electronic parts are a signal source integrated circuit.

In order to solve the aforementioned seventeenth problem, according to the present invention, a liquid crystal display device is characterized in that a plurality of electronic parts for counter-measures of the EMI are concentratedly arranged on the circuit substrate.

Moreover, a liquid crystal display device is characterized in that a plurality of capacitors and resistors for the counter-measures of the EMI are concentratedly arranged at the end portion of the circuit substrate apart from the signal source integrated circuit and downstream of the flow direction of a drive IC chip.

Moreover, a liquid crystal display device comprising circuit substrates arranged at two, three or four sides of the outer peripheral portion of a liquid crystal display panel, is characterized in that a plurality of capacitors and resistors for the counter-measures of EMI are concentratedly arranged apart from a signal source integrated circuit and at the end portion of the circuit substrate downstream in the direction of signal flow of a drive IC chip.

[Operations]

In the liquid crystal display device of the present invention, the terminals of the video signal lines are extracted to only one side of the liquid crystal display panel, and the video signal line driving circuit substrate to be connected with the terminals is arranged at the side of the display panel, usually at only one longer side. As a result, the area of the frame portion around the display unit can be reduced to reduce the size and weight of the liquid crystal display device and the data processing device assembling the former. Moreover, when the liquid crystal display device is packaged as the display unit in the data processing device such as a personal computer or word processor, the side, at which the video signal line driving circuit substrate is arranged, is located at the upper side of the display. In the notebook type personal computer or word processor having the display unit hinged to the keyboard portion, a space for attaching the hinges to the lower portion of the display can be easily retained to make the vertical position of the display proper.

In the liquid crystal display device of the present invention, moreover, one of the two insulating substrates constituting the liquid crystal display panel is protruded and formed with the single plate portion and is exclusively held through the elastic member mounted on the single plate portion, so that the gap between the two substrates is not changed to cause no display unevenness even if strongly pushed. As a result, the pushing force of the liquid crystal display panel can be increased to improve the mechanical strength and the reliability.

In the liquid crystal display device of the present invention, moreover, the slender fluorescent tube is arranged in the space below the plurality of tape carrier packages packaged on the outer peripheral portion of the liquid crystal display panel so that it can be accommodated in a high space using efficiency. As a result, the device can have its external size reduced to reduce the size and the weight.

In the liquid crystal display device of the present invention, moreover, the end portion of at least one optical sheet such as a diffusive sheet or a prism sheet arranged on the light guide plate is protruded from the end portion of the side of the light guide plate and placed on the side wall of the casing accommodating the light guide plate, and the elastic member such as a rubber cushion is sandwiched between the optical sheet on the side wall and the liquid crystal display panel and is firmly held by the casing, so that the light guide plate and the liquid crystal display panel can be firmly held and fixed in the device. Moreover, this holding structure can reduce the external size of the device and accordingly the size and weight of the same. Incidentally, the elastic member such as the rubber cushion is effective to prevent the display unevenness due to the change in the gap between the two transparent glass substrates constituting the liquid crystal display panel, because one of these substrates is pushed if the elastic member is sandwiched between the optical sheet on the side wall of the casing and the upper one of the two transparent glass substrates.

In the liquid crystal display device of the present invention, moreover, both the fluorescent tube and the cables of the former are held by the holding member such as the rubber bushes made of an elastic member. As a result, the cable can be accommodated in the liquid crystal display device without bulging out, so that the liquid crystal display device can be small-sized and light-weighted to reduce the production cost.

In the liquid crystal display device of the present invention, moreover, the size of the light guide plate of the back light is made as small as that of the effective light emitting unit so that the electronic parts can be packaged in the space which has been occupied by the light guide plate of the prior art. At the same time, the light guide plate is held by the small projections formed on the inner face of the casing accommodating the light guide plate so that the light guide plate can be held in the small space. As a result, the device can be small-sized and light-weighted to reduce the production cost.

In the liquid crystal display device of the present invention, moreover, a large opening is formed in the bottom face of the mold casing at a central portion other than the surrounding frame portion so that the bottom face of the mold casing can be prevented, by the weight and internal pressure of the liquid crystal display panel, after the assembly of the liquid crystal display device, from being bulging out by the force to be applied vertically downward to the bottom face of the mold casing. As a result, the mold casing can be thinned to reduce the thickness and weight of the liquid crystal display device.

In the liquid crystal display device of the present invention, moreover, the two cables, as connected with the two ends of the fluorescent tube of the back light, are fitted in the groove formed in the casing, and the inverter is accommodated in the accommodating portion formed in the mold casing outside of the light guide plate, so that the cables and the inverter can be accommodated without bulging out of the device. As a result, the liquid crystal display device can be small-sized and light-weighted to reduced the production cost.

In the liquid crystal display device of the present invention, moreover, a notch is formed in the casing at a portion corresponding to the exothermic portion. As a result, it is possible to provide a liquid crystal display device having such a circuit as can improve not only the heat liberation of the exothermic portions, the highly dense packageability of the circuit and the compactness and as can realize the multi-gradation, the single power source and the compact packaging.

In the liquid crystal display device of the present invention, moreover, the hybrid integrated circuit, as prepared by hybridly integrating a portion of the circuit for driving the liquid crystal display panel, is packaged on the circuit substrate so that the number of the electronic parts can be reduced. At the same time, neither another circuit substrate nor any joiner is required, it is possible to reduce the cost for the material and the number of working steps. As a result, the production cost can be reduced to improve the reliability of the product.

In the liquid crystal display device of the present invention, moreover, by positioning the mounting holes of the casing away from the case corners, the space for electrically connecting the circuit substrate by the joiners can be retained while being left generally rectangular, so that the extraction efficiency of the circuit substrates can be made high to reduce the cost for the material of the circuit substrates.

In the liquid crystal display device of the present invention, moreover, the space of the device in the thickness direction can be effectively exploited to electrically connect the plurality of circuit substrates by two or more electric connection means superposed at two or more stages. As a result, the circuit substrates can be connected in a small space, even if the number of their connection lines is large, to reduce the size and weight of the liquid crystal display device.

In the liquid crystal display device of the present invention, moreover, the mounting holes can be formed, if intended so, in the intermediate portions at a predetermined considerable distance from the corners of the metallic casing by notching the radial portion of a quadrant between the drawn portions to be formed with the mounting holes and the metal plate adjacent to the former, to draw the drawn portions generally into the quadrant. As a result, the liquid crystal display device can be small-sized and light-weighted.

In the liquid crystal display device of the present invention, moreover, the pawls, as integrally formed by notching the metallic shield casing, are connected with the frame ground pads which are connected with the ground wiring lines and formed on the face of the circuit substrate. As a result, the ground wiring lines are connected with the common metallic shield casing having a sufficiently low impedance so that the they are strengthened in a higher frequency range to suppress the emission of the harmful radiative electric waves.

Since, moreover, the pawls are formed on the side of the shield casing, they are kept, when folded, away from any contact with the circuit substrate unlike the pawls formed on the upper face, so that the workability is satisfactory. In case, on the other hand, the pawls are soldered to the frame ground pads, the circuit substrate, as united with the liquid crystal display panel, can be soldered from the inner face of the open shield casing after it has been fixed in the shield casing, so that the soldering workability is excellent.

In the liquid crystal display device of the present invention, moreover, the electronic parts of the signal source integrated circuit, as have a low level, are arranged at the remotest end of the circuit substrate having the connector with the outside, that is, over the circuit substrate in the vicinity of the corner of the casing for accommodating the circuit substrate and the liquid crystal display panel, and the connector is arranged adjacent thereto in the direction apart from the corner. As a result, the vicinity of the corner of the casing, as formed with the mounting holes, can be covered with the case integral with or separate from the aforementioned casing. When the device is packaged in the data processing device such as a personal computer, the corner of the casing of the device is firmly held and fixed through the mounting holes by the screws or the like so that the mechanically strength can be improved to improve the reliability of the product.

In the liquid crystal display device of the present invention, moreover, a plurality of electronic parts for counter-measures of the EMI are arranged concentratedly on the circuit substrate so that the dead space can be reduced to package the electronic parts highly densely. As a result, the liquid crystal display device can be small-sized and light-weighted to reduce the production cost.

BRIEF DESCRIPTION OF THE DRAWINGS

FIGS. 10(A)–(B) are a top plan view and a section showing the vicinity of the connecting portion between a gate terminal CTM of a gate wiring line GL.

FIGS. 11(A)–(B) are a top plan view and a section showing the vicinity of the connecting portion between a drain terminal DTM and a video signal line DL.

FIGS. 15(A)–15(C) show a flow chart of a section of a pixel portion and a gate terminal portion and shows the manufacture steps A to F at the side of a substrate SUB1.

FIG. 24(A) a section taken along line A—A; FIG. 24(B) a section taken along line B—B: B; FIG. 24(C) a section taken along line C—C; and FIG. 24(D) a section taken along line D—D.

FIG. 26(A) a section taken along line A—A; FIG. 26(B) a section taken along line B—B: FIG. 26(C) a section taken along line C—C; and FIG. 26(D) a section taken along line D—D.

FIG. 28(A) a section taken along line A—A; FIG. 28(B) a section taken along line B—B: and FIG. 28(C) a section taken along line C—C.

FIG. 29 (A) is a top plan view of the interface circuit substrate PCB3, and FIG. 29 (B) is a bottom view of the interface circuit substrate PCB3.

FIG. 33 is a top plan (or bottom view) of the tape carrier package TCP.

FIGS. 34(a)–(b) are top plan (or bottom view) and side elevation of a plurality of packaged TCPs.

FIG. 35(A), (B) and (C) are top plan views of joiners JN1 to JN3, respectively.

DESCRIPTION OF THE PREFERRED EMBODIMENTS

Figure 1:
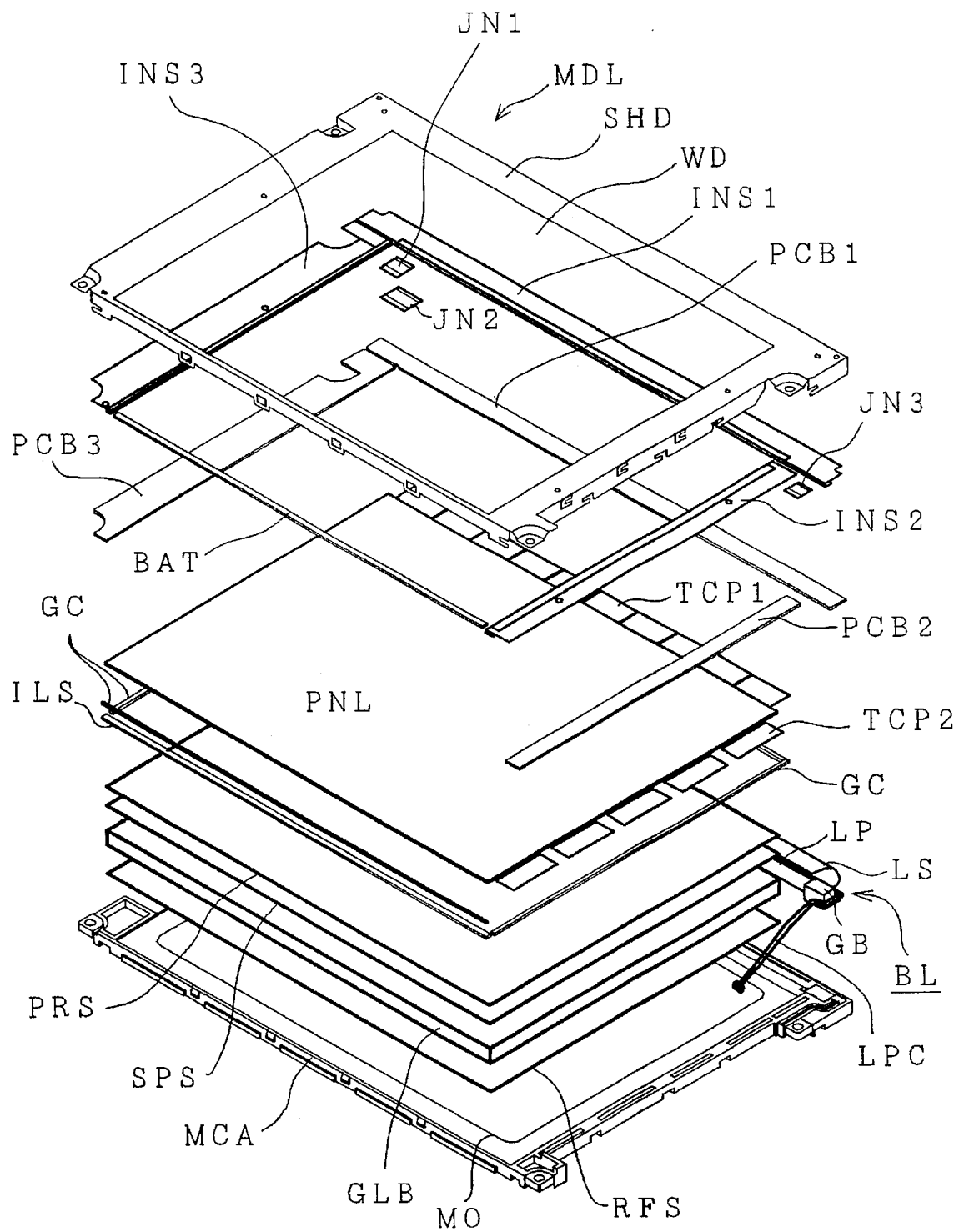
FIG. 1 is an exploded perspective view of a liquid crystal display module of an active matrix type color liquid crystal display device according to the present invention.

The present invention, other objects of the present invention, and other features of the present invention will become apparent from the following description to be made with reference to the accompanying drawings.

<<Active Matrix Liquid Crystal Display Device>>

Here will be described in the following the construction of the present invention in connection with embodiments of a color liquid crystal display device of active matrix type, to which is applied the present invention. Incidentally, the parts having identical functions are designated at identical reference characters throughout all the Figures for describing the embodiments, and their repeated descriptions will be omitted.

<<Summary of Matrix Portion>>

Figure 2:
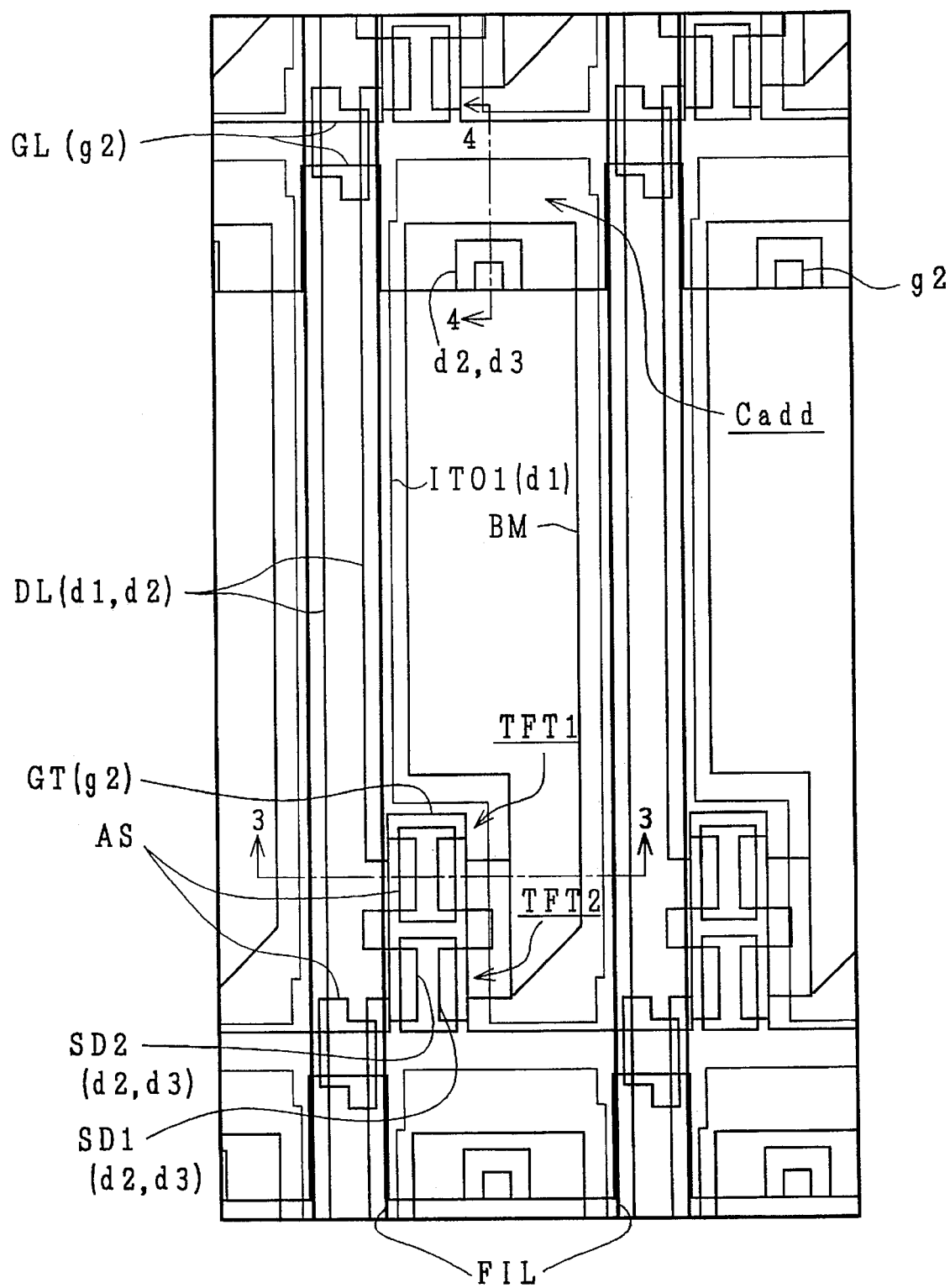
FIG. 2 is a top plan view of an essential portion and shows one pixel and its neighborhood of a liquid crystal display unit.
Figure 3:
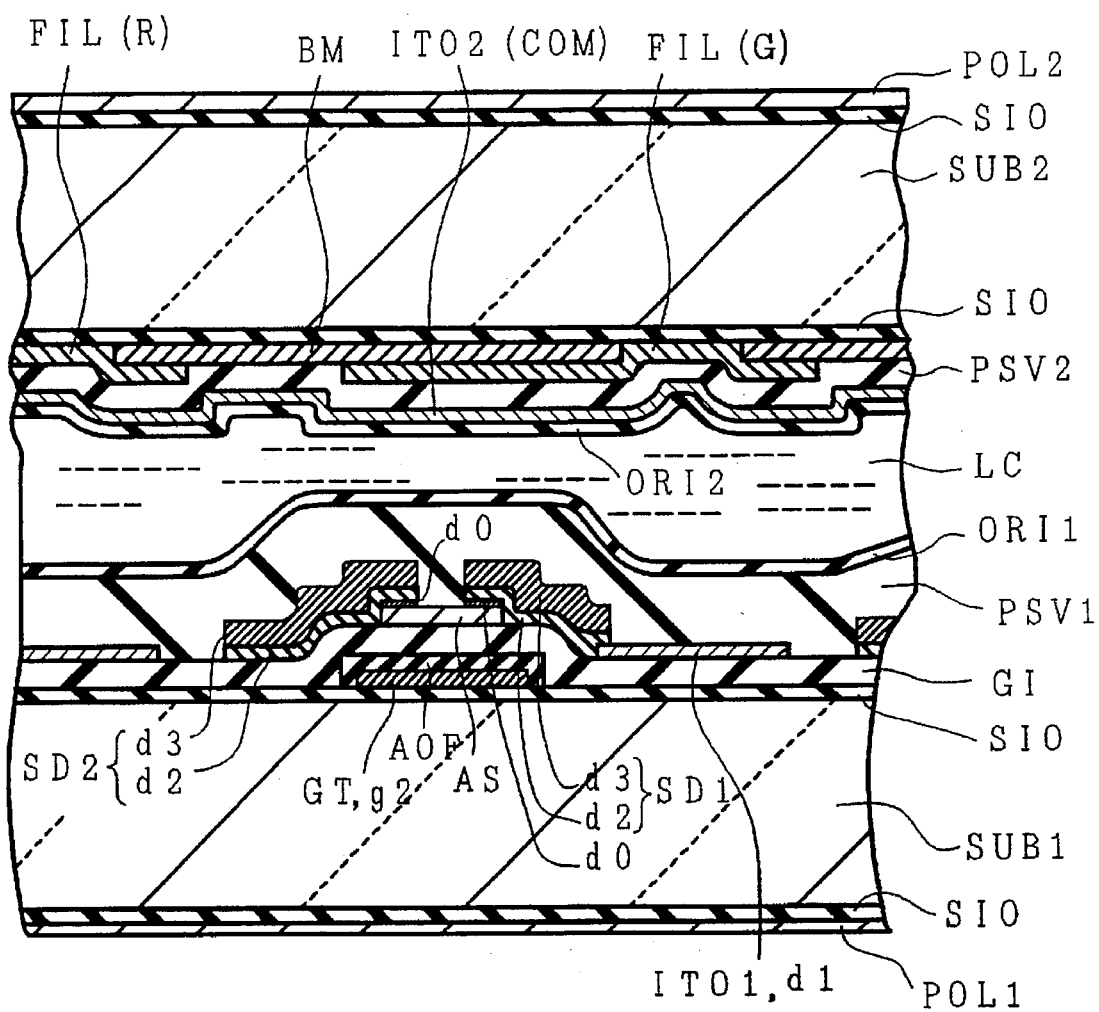
FIG. 3 is a section showing one pixel and its neighborhood, as taken along line 3—3 of FIG. 2.
Figure 4:
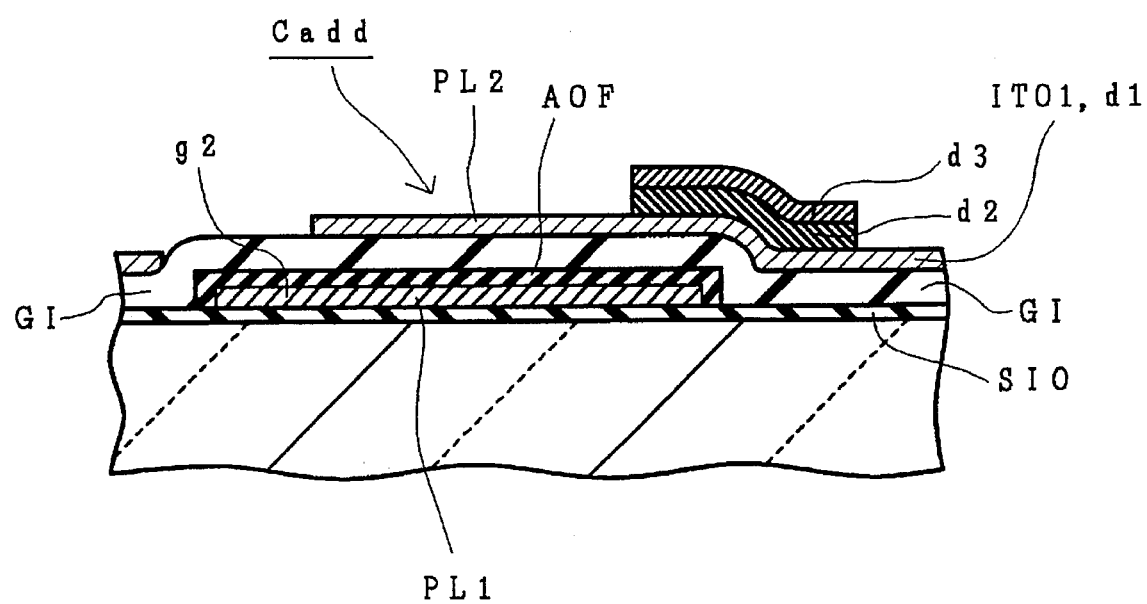
FIG. 4 is a section of an additional capacitor Cadd, as taken along line 4—4 of FIG. 2.
Figure 5:
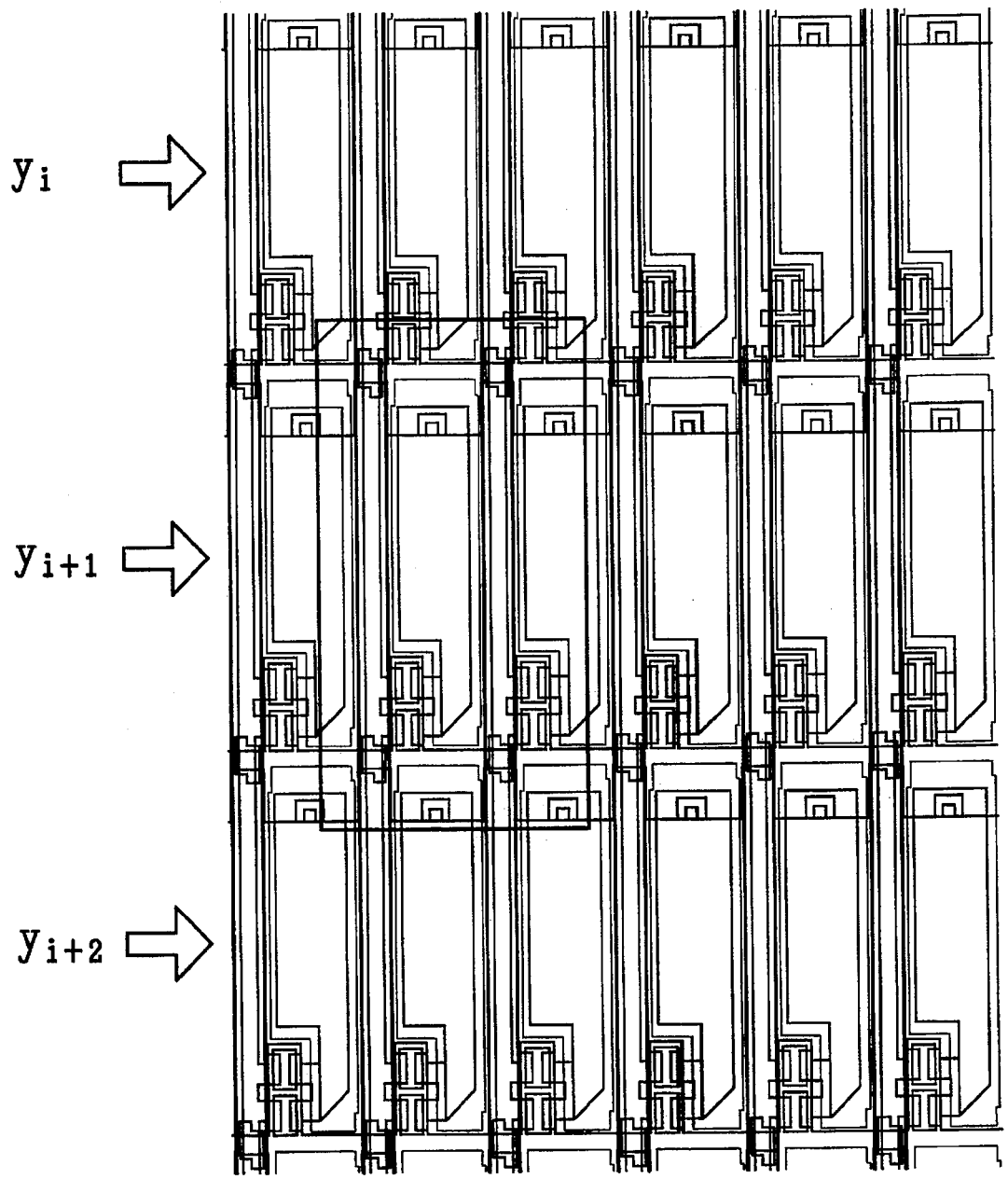
FIG. 5 is a top plan view of an essential portion of a liquid crystal display unit arranged with a plurality of pixels shown in FIG. 2.

FIG. 2 is a top plan view showing one embodiment of one pixel and its peripheral portion of the active matrix type color liquid crystal display device to which is applied the present invention. FIG. 3 is a section taken along line 3—3 of FIG. 2. FIG. 4 is a section taken along line 4—4 of FIG. 2. On the other hand, FIG. 5 is a top plan view showing the case in which a plurality of pixels shown in FIG. 2 are arranged.

As shown in FIG. 2, each pixel is arranged in a cross region (defined by four signal lines) between two adjacent scanning signal lines (e.g., gate signal lines or horizontal signal lines) GL and two video signal lines (e.g., drain signal lines or vertical signal lines) DL. Each pixel includes a thin film transistor TFT, a transparent pixel electrode ITO1 and a additional capacitor Cadd. The scanning signal lines GL are extended in the column direction and arranged in plurality in the row direction. The video signal lines DL are extended in the row direction and arranged in plurality in the column direction.

As shown in FIG. 3, the thin film transistor TFT and the transparent pixel electrode ITO1 are formed at the side of a lower transparent glass substrate SUB1 across a liquid crystal layer LC, and a color film FIL and a back matrix pattern BM for light shielding are formed at the side of an upper transparent glass substrate SUB2. The side of the lower transparent glass substrate SUB1 is made to have a thickness of about 1.1 mm, for example. On the both surfaces of the transparent glass substrates SUB1 and SUB2, there are formed silicon oxide layers SIO which are deposited by the dip treatment. As a result, a sharp flaw, even if formed in the surfaces of the transparent glass substrates SUB1 and SUB2, can be covered with the silicon oxide film SIO so that the scanning signal lines GL and the back matrix pattern BM to be deposited thereon can keep their film qualities homogeneous.

On the surface of the upper transparent glass substrate SUB2 at the inner side (or the side of the liquid crystal LC), there are sequentially laminated the light-shielding film BM, the color filter FIL, a passivation film PSV2, a common transparent pixel electrode ITO2 (or COM) and an upper orientation film ORI2.

<<Summary of Matrix Periphery>>

Figure 17:
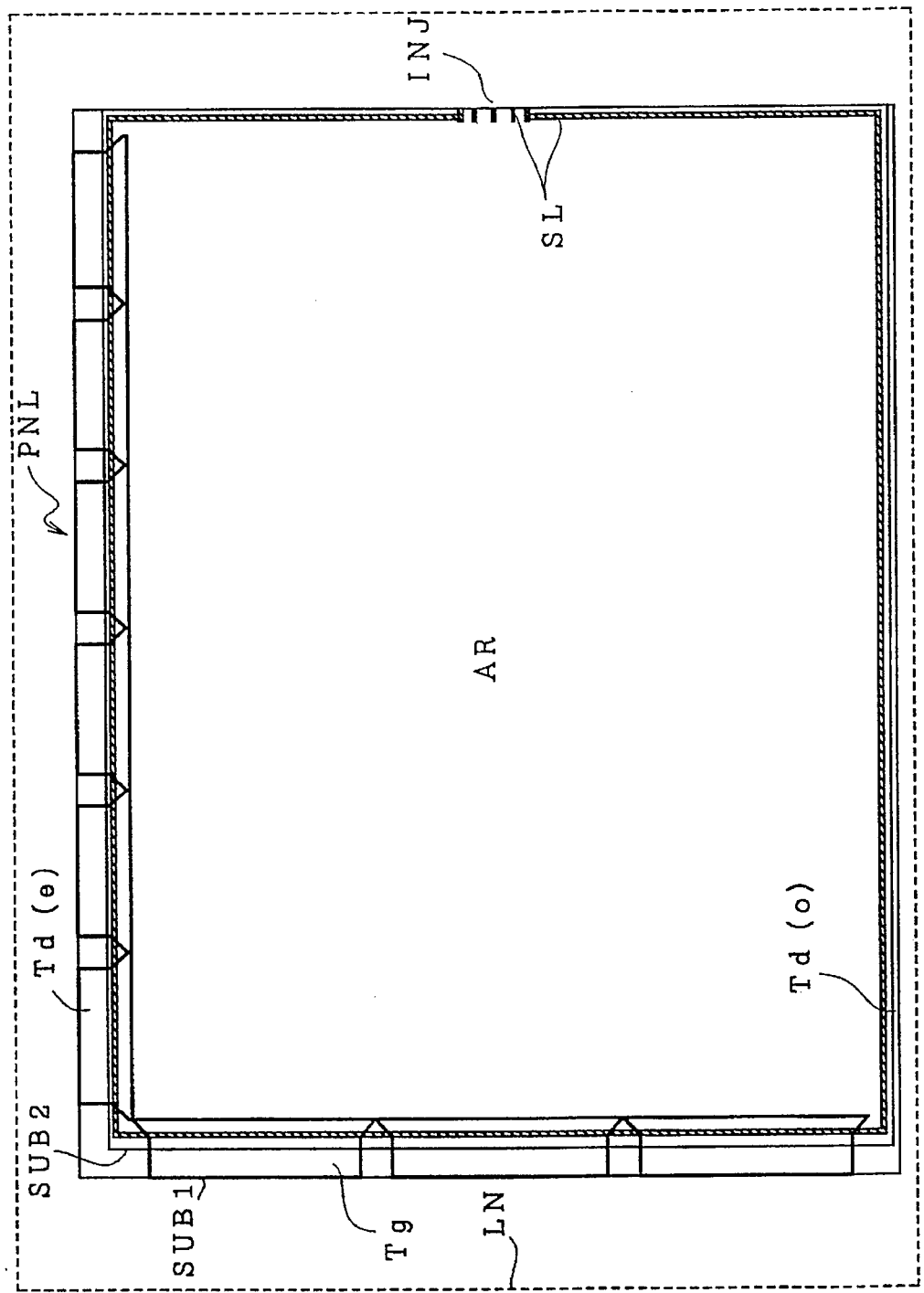
FIG. 17 is a top plan view for explaining the construction of a matrix peripheral portion of a display panel.
Figure 18:
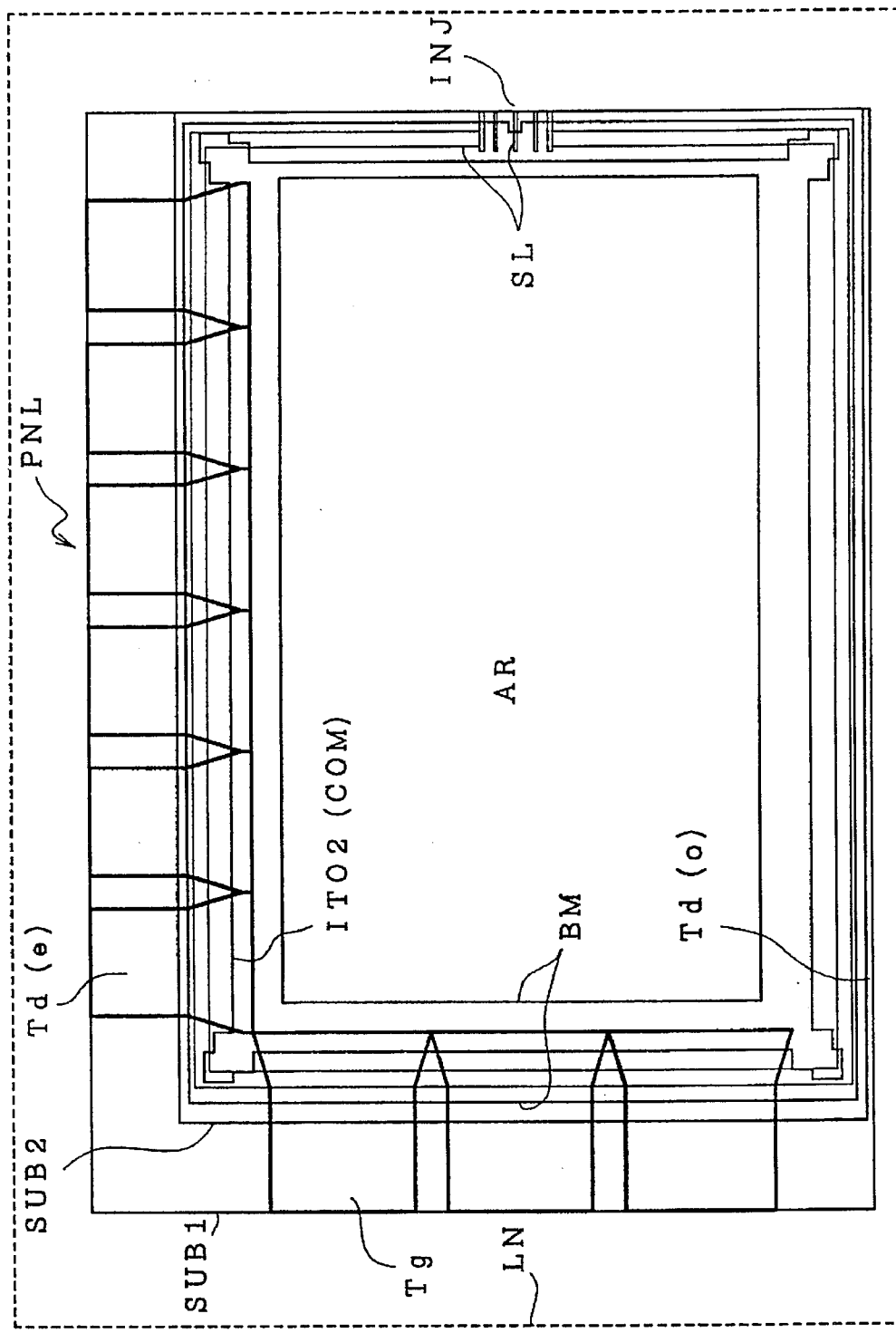
FIG. 18 is a panel top plan view for explaining the peripheral portion of FIG. 17 more specifically.
Figure 19:
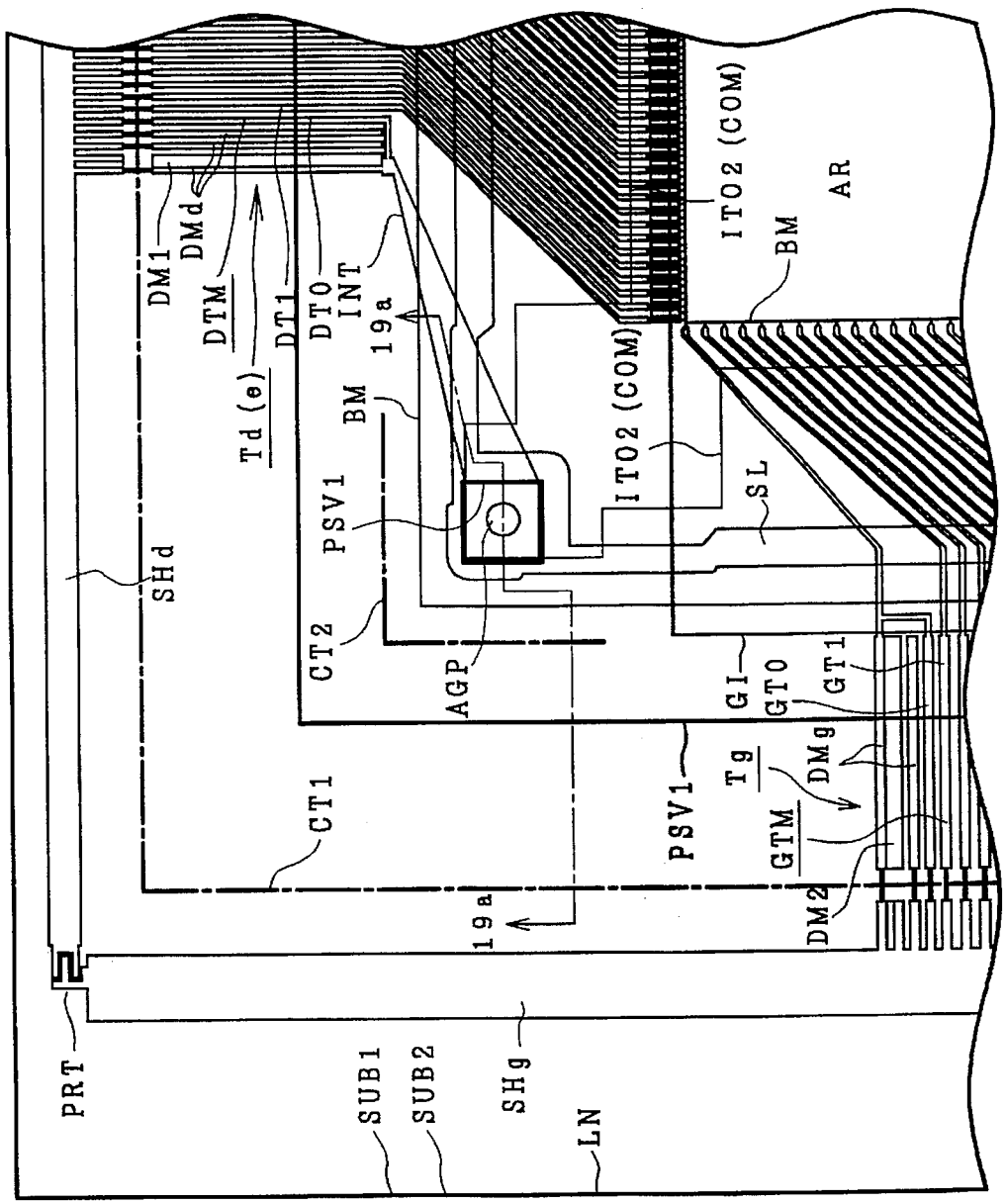
FIG. 19 is an enlarged top plan view of a corner of the display panel including an electric connection portion of upper and lower substrates.
Figure 20:
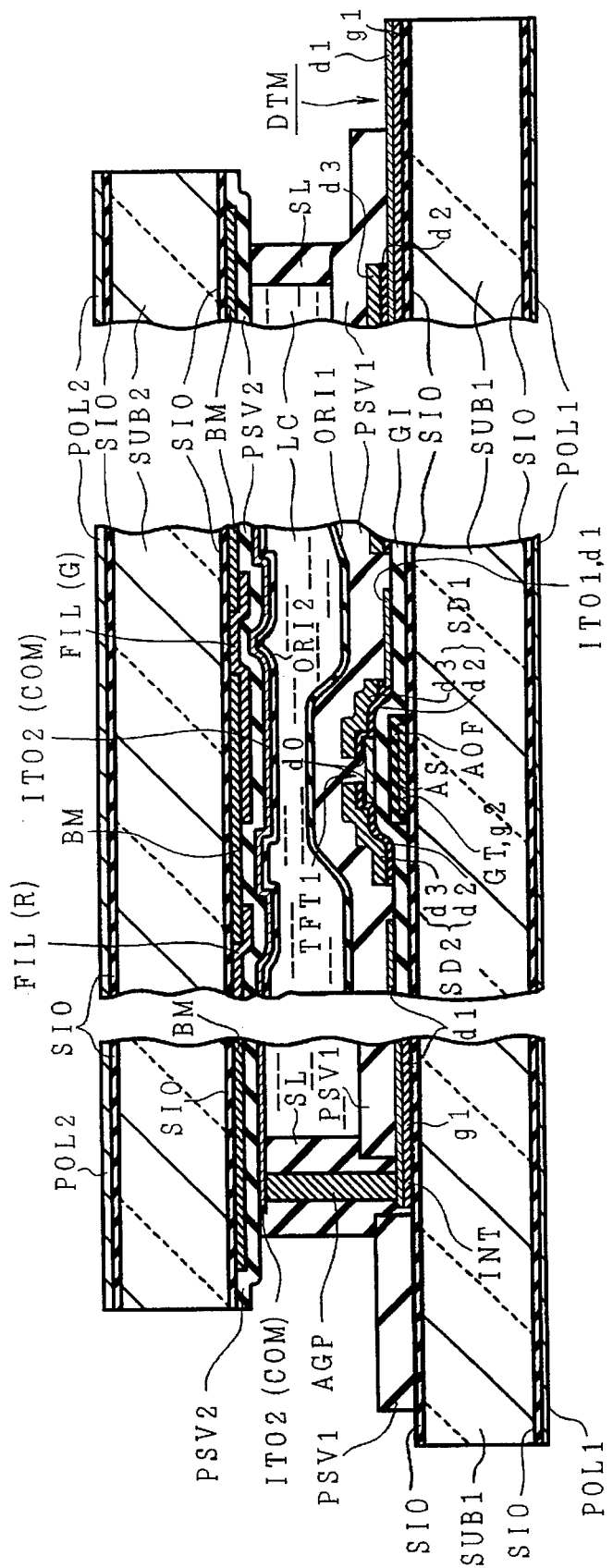
FIGS. 20(a)–(c) are sections showing the pixel portion of the matrix at the center and the vicinity of a panel corner and the vicinity of a video signal terminal portion at the two sides.
Figure 21:
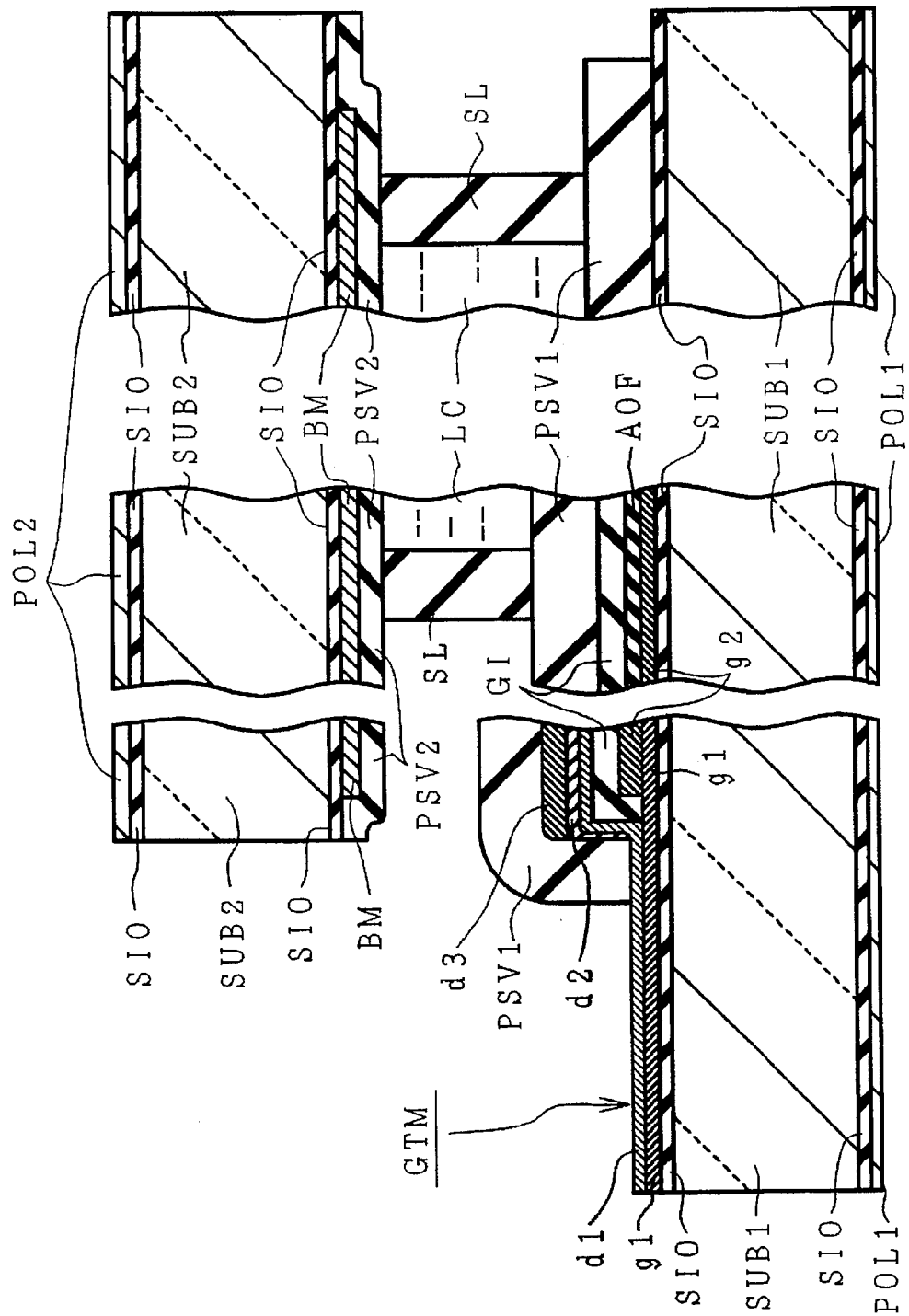
FIGS. 21(a)–(b) are sections showing a scanning signal terminal at the left hand side and the panel edge portion having no external connection terminal at the right hand side.

FIG. 17 is a top plan view showing an essential portion of the periphery of a matrix (AR) of a display panel PNL including the upper and lower glass substrates SUB1 and SUB2. FIG. 18 is a top plan view further exaggerating the peripheral portion. FIG. 19 is an enlarged top plan view showing the vicinity of a seal portion SL corresponding to the left hand upper corner of the panel of FIGS. 17 and 18. Moreover, FIG. 20 presents a section of FIG. 3 at the left hand side, a section taken from line 19a—19a of FIG. 19 at the right hand side, and a section showing the vicinity of an external connection terminal DTM, to which is connected a video signal drive circuit. Likewise, FIG. 21 presents a section showing the vicinity of an external connection terminal GTM, to which is connected a scanning circuit, at the left hand side and a section showing the vicinity of a seal portion having no external connection terminal at the right hand side.

Figure 22:
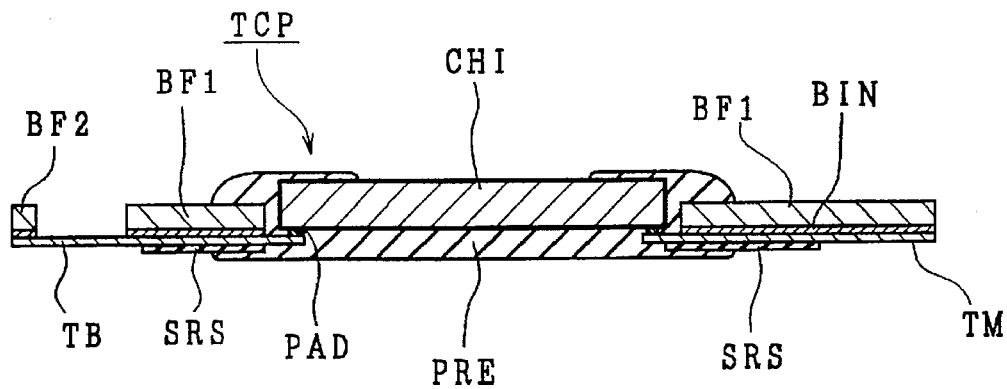
FIG. 22 is a section showing a structure of a tape carrier package TCP, in which an integrated circuit chip CHI constituting a drive circuit is mounted on a flexible wiring substrate.
Figure 23:
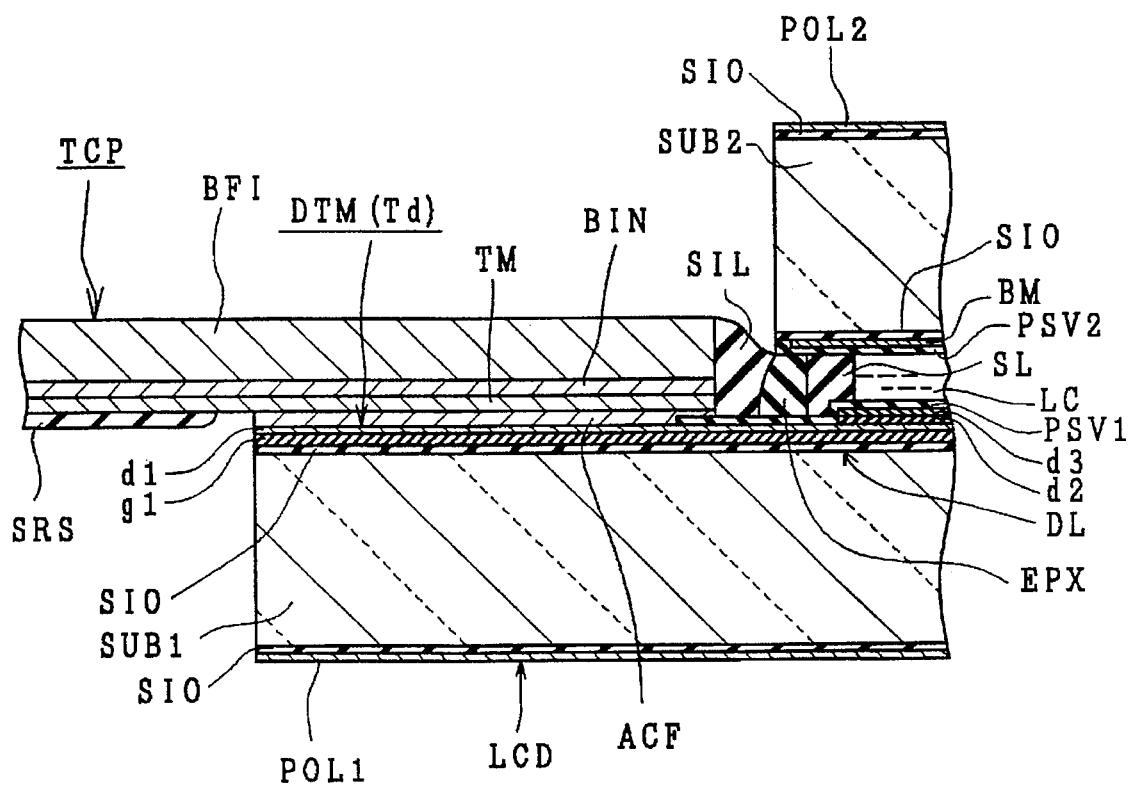
FIG. 23 is a section of an essential portion and shows the state in which the tape carrier package TCP is connected with the video signal circuit terminal DTM of the display panel PNL.

In a fabrication of this panel, a plurality of devices are simultaneously worked and divided by a single sheet of glass substrate so as to improve the throughput, if the panel has a small size, but a glass substrate having a standardized size for any kind is worked and is reduced to the sizes matching the individual kinds so as to share the fabrication facilities, if the size is large. In either case, the glass is cut after a series of steps. In FIGS. 17 to 19 showing the latter example, FIGS. 17 and 18 show the state after the upper and lower substrates SUB1 and SUB2 have been cut, and FIG. 19 shows the state before the cutting operation. Letters LN designate the edges of the two substrates before the cutting operation, and characters CT1 and CT2 designates the individual positions at which the substrates SUB1 and SUB2 are to be cut. In either case, the size of the upper substrate SUB2 is so limited to the inside of the lower substrate SUB1 that the portions (as located at the upper and lower sides and the left hand side in the Figures), in which external connection terminal groups Tg and Td (although suffixes are omitted) are present in the completed state, may be exposed to the outside. The terminal groups Tg and Td are named such that the scanning line connecting terminal GTM, the video signal circuit connecting terminal DTM and their leading lines are collected in plurality at the unit of a tape carrier package TCP (as shown in FIGS. 22 and 23) on which is packaged an integrated circuit chip CHI. The leading line from the matrix portion of each group to the external connection terminal portion is inclined toward the two ends. This is because the terminals DTM and GTM of the display panel PNL are made to match the array pitch of the package TCP and the connection terminal pitch at each package TCP.

Between and along the edges of the transparent glass plates SUB1 and SUB2, there is formed the seal pattern SL for sealing the liquid crystal LC excepting a liquid crystal entrance INJ. The seal material is made of an epoxy resin, for example. The common transparent pixel electrode ITO2 at the side of the upper transparent glass substrate SUB2 is connected at the four corners in the present embodiment with a leading line INT, which is formed at the side of the lower transparent glass substrate SUB1, in at least one portion by a silver paste material AGP. The leading line INT is formed at the same fabrication step as that of the later-described gate terminal GTM and drain terminal DTM.

The orientation films ORI1 and ORI2, the transparent pixel electrode ITO1, the common transparent pixel electrode ITO2, and the individual layers are formed in the seal pattern SL. Polarization plates POL1 and POL2 are individually formed on the outer surfaces of the lower transparent glass substrate SUB1 and the upper transparent glass substrate SUB2. The liquid crystal LC is filled in the region which is defined by the seal pattern SL between the lower orientation film ORI1 and the upper orientation film ORI2 for setting the orientations of the liquid crystal molecules. The lower orientation film ORI1 is formed over a passivation film PSV1 at the side of the lower transparent glass substrate SUB1.

This liquid crystal display device is assembled: by superposing the individual layers at the sides of the lower transparent glass substrate SUB1 and the upper transparent glass substrate SUB2; by forming the seal pattern SL at the side of the substrate SUB2; by superposing the lower transparent glass substrate SUB1 and the upper transparent glass substrate SUB2; by injecting the liquid crystal LC from the opening INJ of the seal member SL to seal the injection entrance INJ with the epoxy resin or the like; and by cutting the upper and lower substrates.

<<Thin Film Transistor TFT>>

If a positive bias is applied to the gate electrode GT, the thin film transistor TFT has its channel resistance reduced between its source and drain. If the bias is reduced to zero, the thin film transistor TFT operates to have its channel resistance increased.

The thin film transistor TFT of each pixel is divided into two (or plurality) in the pixel so that it is composed of thin film transistors (or divided thin film transistors) TFT1 and TFT2. These thin film transistors TFT1 and TFT2 are individually made to have a substantially equal size (in the channel length and width). Each of these divided thin film transistors TFT1 and TFT2 is composed mainly of a gate electrode GT, a gate insulating film GI, an i-type (i.e., intrinsic type not doped with a conductivity type determining impurity) amorphous silicon (Si) semiconductor layer AS, and a pair of source electrode SD1 and drain electrode SD2. Incidentally, the source and drain are intrinsically determined in dependence upon the bias polarity inbetween, and this polarity is inverted during the operation in the circuit of the present display device. Thus, it should be understood that the source and drain are interchanged during the operation. In the following description, however, one is fixed as the source whereas the other is fixed as the drain, for conveniences only.

<<Gate Electrode GT>>

Figure 6:
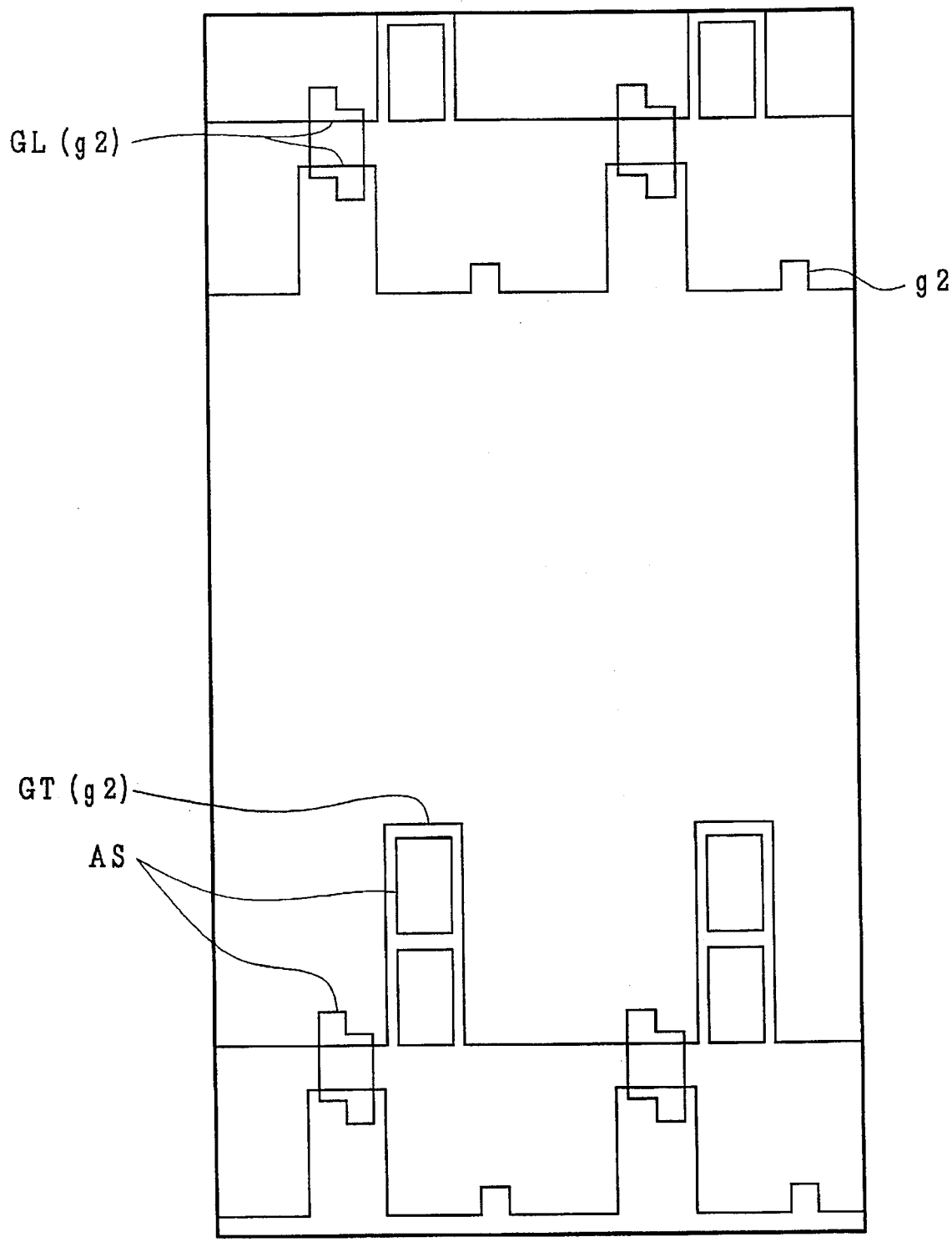
FIG. 6 is a top plan view showing only layers g2 and As of the pixel shown in FIG. 2.

The gate electrode GT is formed to project perpendicularly (i.e., upward, as viewed in FIGS. 2 and 6) from the scanning signal lines GL (or branched in the "T-shape"), as shown in detail in FIG. 6 (presenting a top plan view showing the second conductive layer g2 and i-type semiconductor layer AS of FIG. 2 only). The gate electrode GT is extended to the regions to be individually formed with the thin film transistors TFT1 and TFT2. These thin film transistors TFT1 and TFT2 have their individual gate electrodes GT integrated (as their common gate electrode) to merge into the scanning signal line GL. The gate electrode GT is constituted by the single level conductive layer g2. The second conductive layer g2 is formed, for example, by sputtering aluminum (Al) in the thickness of about 1,000 to 5,500 angstroms. On the gate electrode GT, there is provided an anodized oxide film AOF of Al.

This gate electrode GT is made so slightly large as to cover the semiconductor layer AS completely (as viewed upward), as shown in FIGS. 2 and 3 and FIG. 6. In case, therefore, back lights BL such as fluorescent lamps are attached to the bottom of the substrate SUB1, this opaque Al gate electrode GT establishes a shadow to shield the semiconductor layer AS from the back lights, thus substantially eliminating the conducting phenomenon due to the optical irradiation, i.e., the deterioration of the OFF characteristics of the TFTs. Here, the intrinsic size of the gate electrode GT is given the least necessary width (include the positioning allowance of the gate electrode GT, the source electrode SD1 and the drain electrode SD2) for extending between the source and drain electrodes SD1 and SD2. The depth for determining that channel width W is determined in dependence upon the factor W/L determining the mutual conductance gm, i.e., the ratio to the distance (i.e., the channel length) L between the source and drain electrodes SD1 and SD2. The size of the gate electrode GT in the present liquid crystal display device is naturally made larger than the aforementioned intrinsic size.

<<Scanning Signal Line GL>>

The scanning signal line GL is constituted by the second conductive film g2. The second conductive film g2 of the scanning signal line GL is formed at the same step as and integrally with the second conductive film g2 of the gate electrode GT. Moreover, the scanning signal line GL is also formed thereon with the anodized oxide film AOF of Al.

<<Gate Insulating Film GI>>

The insulating film GI is used as the individual gate insulating films of the thin film transistors TFT1 and TFT2. The insulating film GI is formed over the gate electrode GT and the scanning signal line GL. The insulating film GI is formed of, for example, a silicon nitride film prepared by the plasma CVD, to have a thickness of 1,200 to 2,700 angstroms (e.g., about 2,000 angstroms in the present liquid crystal display device). The gate insulating film GI is formed to enclose the entirety of the matrix portion AR, as shown in FIG. 18, and to have its peripheral portion removed to expose the external connection terminals DTM and GTM to the outside.

<<i-Type Semiconductor Layer AS>>

The i-type semiconductor layer AS is used as the individual channel forming regions of the thin film transistors TFT1 and TFT2 divided into a plurality of parts, as shown in FIG. 6. The i-type semiconductor layer AS is formed of an amorphous silicon film or polycrystalline silicon film to have a thickness of about 200 to 2,200 angstroms (e.g., about 2,000 angstroms in the present liquid crystal display device).

This i-type semiconductor layer AS is formed subsequent to the formation of the $Si_3N_4$ gate insulating film GI by changing the components of supply gases but by using the common plasma CVD system such that it is not exposed from the system to the outside. On the other hand, an N(+)-type layer d0 (shown in FIG. 3) doped with 2.5% of phosphor (P) for the ohmic contact is like-wise formed subsequently to have a thickness of about 200 to 500 angstroms (e.g., about 300 angstroms in the present liquid crystal display device). After this, the lower substrate SUB1 is taken out of the CVD system, and the N(+)-type layer d0 and the i-type AS are patterned into independent islands by the photographic technology, as shown FIGS. 2 and 3 and FIG. 6.

The i-type semiconductor layer As is also formed between the intersecting portions (or crossover portions) of the scanning signal line GL and the video signal line DL, as shown in FIGS. 2 and 6. This crossover i-type semiconductor layer As is formed to reduce the short-circuiting between the scanning signal line GL and the video signal line DL at the intersecting portion.

<<Transparent Pixel Electrode ITO1>>

The transparent pixel electrode ITO1 constitutes one of the parts of a pixel electrode of a liquid crystal display.

The transparent pixel electrode ITO1 is connected with both the source electrode SD1 of the thin film transistor TFT1 and the source electrode SD1 of the thin film transistor TFT2. Even if, therefore, one of the thin film transistors TFT1 and TFT2 become defective, a suitable portion may be cut by a laser beam in case the defect invites an adverse action. Otherwise, the situation may be left as it is because the other thin film transistor is normally operating. Incidentally, both the two thin film transistors TFT1 and TFT2 scarcely become defective, and the probability of the point defect or line defect can be drastically reduced by that redundant system. The transparent pixel electrode ITO1 is formed of a first conductive film d1, which is made of a transparent conductive film (of Indium-Tin-Oxide, i.e., ITO or NESA film) to have a thickness of 1,000 to 2,000 angstroms (e.g., about 1,400 angstroms in the present liquid crystal display device).

<<Source Electrode SD1 and Drain Electrode SD2>>

Figure 7:
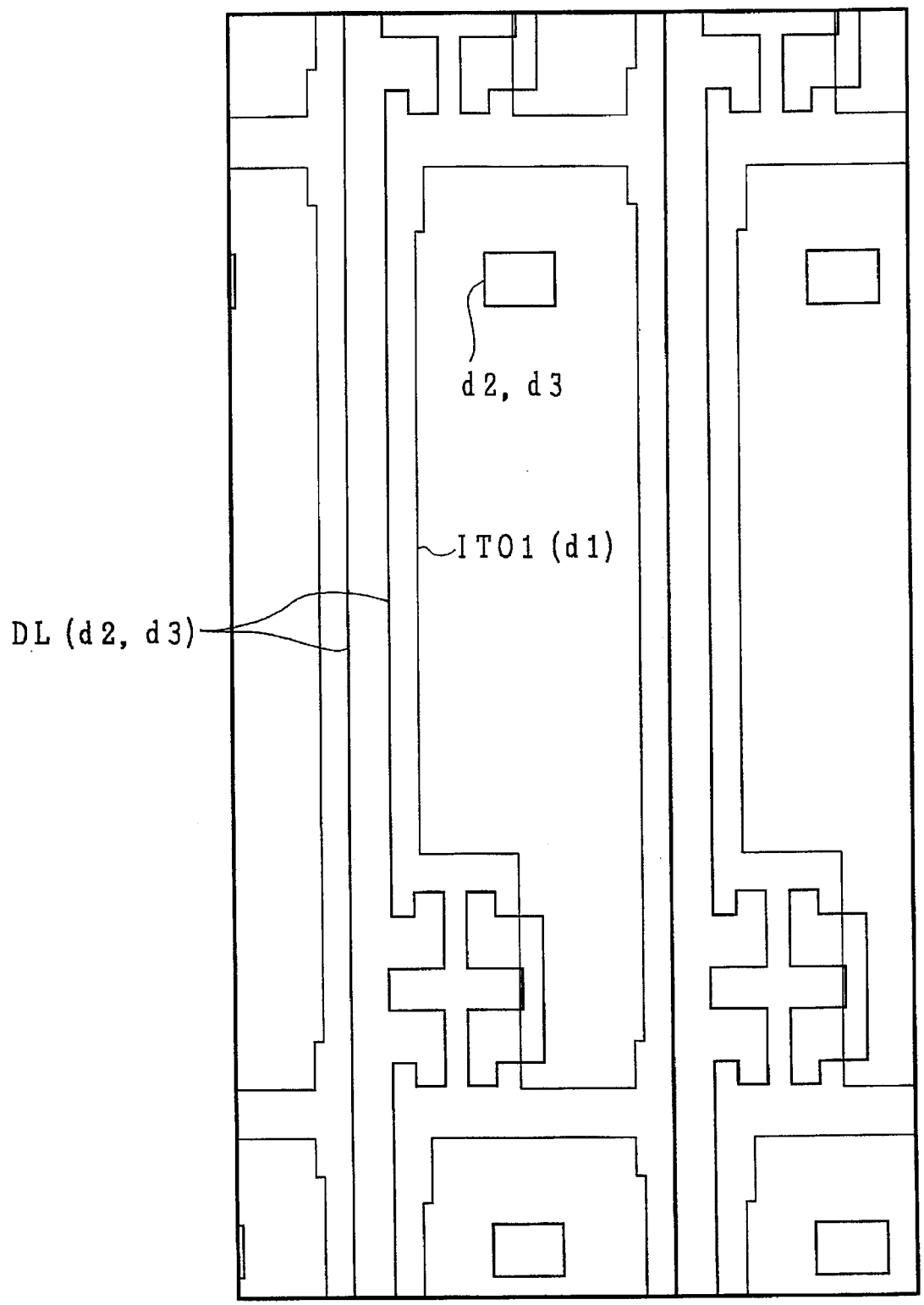
FIG. 7 is a top plan view showing only layers d1, d2 and d3 of the pixel shown in FIG. 2.

The individual source electrodes SD1 and drain electrodes SD2 of the divided thin film transistors TFT1 and TFT2 are formed over the semiconductor layer AS and separately from each other, as shown in FIGS. 2 and 3 and FIG. 7 (presenting a to plan view showing the layers d1 to d3 of FIG. 2 only).

Each of the source electrode SD1 and the drain electrode SD2 is formed by overlaying a second conductive film d2 and a third conductive film d3 sequentially from the lower side contacting with the N(+)-type semiconductor layer d0. These second conductive film d2 and third conductive film d3 of the source electrode SD1 are formed at the same fabrication step as those of the drain electrode SD2.

The second conductive film d2 is formed of a sputtered chromium (Cr) film to have a thickness of 500 to 1,000 angstroms (e.g., about 600 angstroms in the present liquid crystal display device). The Cr film is formed to have a thickness no more than 2,000 angstroms because it establishes a high stress if it is made excessively thick. The Cr film has an excellent contact with the N(+)-type semiconductor layer d0. The Cr film constitutes the so-called "barrier layer" preventing the Al of the third conductive film d3 described hereinafter from diffusing into the N(+)-type semiconductor layer d0. The second conductive film d2 may be made of not only the aforementioned Cr film but also a refractory metal (e.g., Mo, Ti, Ta or W) film or its silicide (e.g., $MoSi_2$, $TiSi_2$, $TaSi_2$ or $WSi_2$).

The third conductive film d3 is formed by sputtering Al to have a thickness of about 3,000 to 5,000 angstroms (e.g., about 4,000 angstroms in the present liquid crystal display device). The Al layer is less stressed than the Cr layer so that it can be formed to have a larger thickness thereby to reduce the resistances of the source electrode SD1, the drain electrode SD2 and the video signal line DL. The third conductive film d3 may be formed of not only the pure Al film but also an Al film containing silicon or copper (Cu) as an additive.

After the second conductive film d2 and the third conductive film d3 have been patterned with the same mask pattern, the N(+)-type layer d0 is removed by using the same photographic mask or the second conductive film d2 and the third conductive film d3. Specifically, the N(+)-type layer d0 left on the i-type layer AS is removed in self-alignment while leaving the second conductive film d2 and the third conductive film d3 as they are. Since, at the same time, the N(+)-type layer d0 is etched to remove its whole thickness, the i-type layer AS is slightly etched off at its surface portion, but this removal may be controlled by the etching period.

The source electrode SD1 is connected with the transparent pixel electrode ITO1. The source electrode SD1 is formed along the stepped shape (i.e., the step corresponding to the sum of the thicknesses of the second conductive film g2, the anodized oxide film AOF, the i-type semiconductor layer AS and the N(+)-type semiconductor layer d0) of the i-type semiconductor layer AS. More specifically, the source electrode SD1 is composed of the second conductive film d2 formed along the stepped shape of the i-type semiconductor layer AS and the third conductive film d3 formed over the second conductive film d2. This third conductive film d3 of the source electrode SD1 is formed to ride over the i-type semiconductor AS, because the Cr film of the second conductive film d2 cannot be made so thick because of the increase in the stress as to ride over the stepped shape of the i-type semiconductor layer AS. In short, the second conductive film d2 is made thick to improve the step coverage. The third conductive film d3 can be made thick so that it can highly contribute to the reduction of the resistance of the source electrode SD1 (as well as those of the drain electrode SD2 and the video signal line DL).

<<Passivation Film PSV1>>

Over the thin film transistor TFT and the transparent pixel electrode ITO1, there is formed the passivation film PSV1, which is provided mainly for protecting the thin film transistor TFT against humidity or the like. Thus, the passivation film PSV1 to be used is highly transparent and humidity resistant. The passivation film PSV1 is formed of a silicon oxide film or silicon nitride film prepared by the plasma CVD, to have a thickness of about 1 micron.

The passivation film PSV1 is formed, as shown in FIG. 19, to enclose the entirety the matrix portion AR and is removed at its peripheral portion to expose the external connection terminals DTM and GTM to the outside and at the portion, in which the common electrode COM at the side of the upper substrate SUB2 is connected with the external connection terminal connecting leading line INT of the lower substrate SUB1 by means of the silver paste AGP. In connection with the thickness connection between the passivation film PSV1 and the gate insulating film GI, the former is made thick considering the passivation effect whereas the latter is made thin considering the mutual conductance gm of the transistor. As a result, as shown in FIG. 19, the passivation film PSV1 having a high passivation effect is made so larger than the gate insulating film GI as to have its peripheral portion passivated as wide as possible.

<<Shielding Film BM>>

Figure 8:
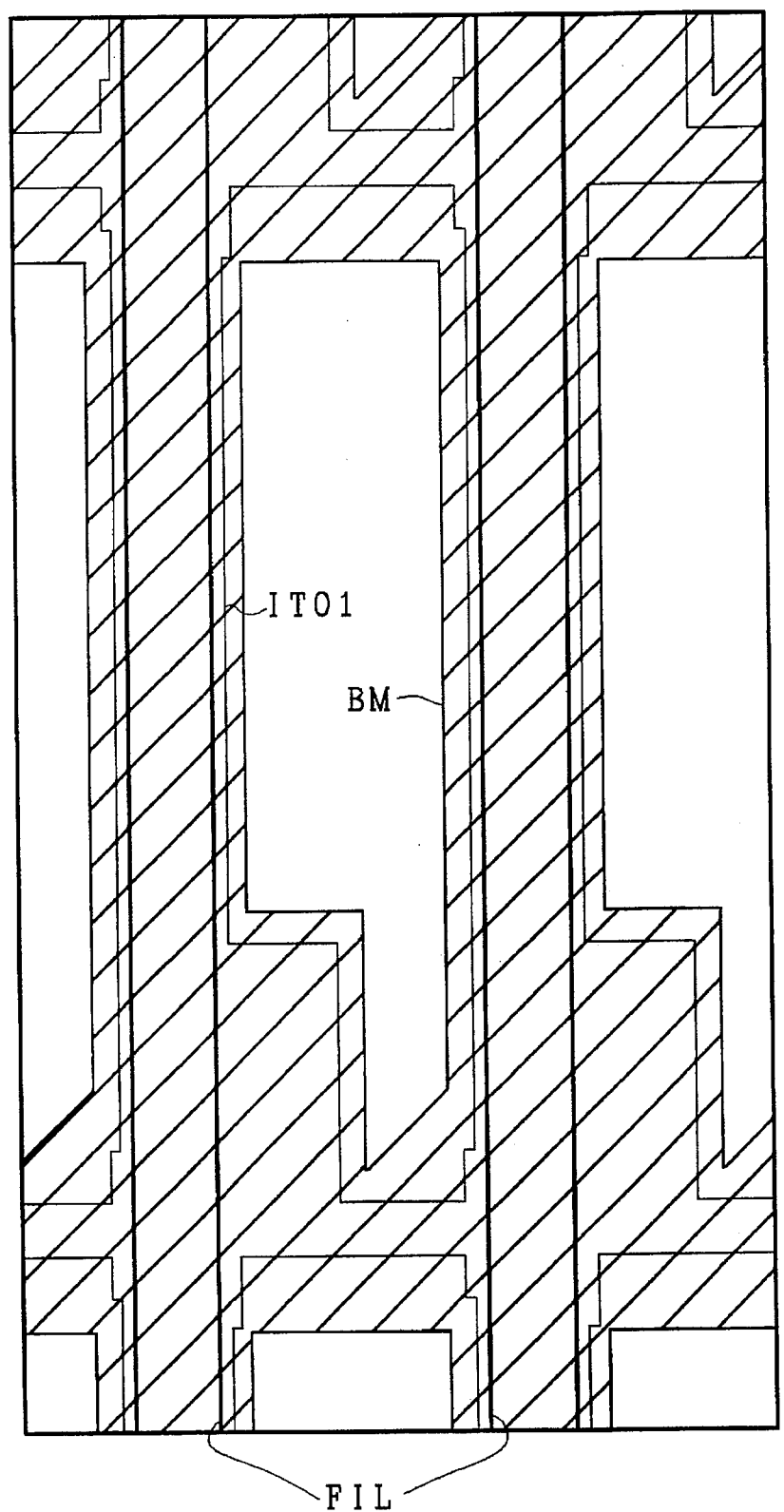
FIG. 8 is a top plan view showing only a pixel electrode layer ITO1, a light-shielding film BM and a color filter layer FIL of the pixel shown in FIG. 2.

At the side of the upper substrate SUB2, there is disposed the shielding film BM for shielding any external light (i.e., the light coming from the top of FIG. 3) from entering the i-type semiconductor layer AS to be used as the channel forming region, as hatched to have the pattern shown in FIG. 8. Here, FIG. 8 is a top plan view showing only the first conductive layer d1 comprised of the ITO film, the filter layer FIL and the shielding film BM of FIG. 2. The shielding film BM is formed of a film having a high shielding property to the light, e.g., an aluminum film or chromium film. In the present liquid crystal display device, the shielding film BM is formed of a chromium film by the sputtering, to have a thickness of about 1,300 angstroms.

As a result, the common semiconductor layer AS shared by the thin film transistors TFT1 and TFT2 is sandwiched between the upper shielding film BM and the lower but larger gate electrode GT so that it is shielded from the outside natural light or the back lights. The shielding film BM is formed around the pixel, as hatched in FIG. 8. Specifically, the shielding film BM is formed in a lattice (of black matrix) shape, which defines the effective display region of one pixel. As a result, the contour of each pixel is clarified to improve the contrast by the shielding film BM. In other words, this shielding film BM has two functions, i.e., the shielding for the semiconductor layer AS and the black matrix functions.

Further, since the portion of the transparent pixel electrode ITO1 (at the lower right hand portion of FIG. 2) opposed to the foot of the rubbing direction is shielded from the light by the shielding film BM, even if a domain is induced at the above portion, the display characteristics are hardly deteriorated because the domain is shaded.

Incidentally, the back lights may be attached to the side of the upper transparent glass substrate SUB2, whereas the lower transparent glass substrate SUB1 may be disposed at the observation side (exposed to the outside).

The shielding film BM is additionally formed at its peripheral portion with a framed pattern, as shown in FIG. 18, which is formed to merge into the pattern of the matrix portion having a plurality of dot-shaped openings, as shown in FIG. 8. The shielding film BM at the peripheral portion is extended to the outside of the seal portion SL, as shown in FIGS. 18 to 21, thereby to prevent the leakage light such as the light reflected from an implemented machine such as a personal computer from entering the matrix portion. On the other hand, the shielding film BM is limited to the inside of the edge of the substrate SUB2 within about 0.3 to 1.0 mm and is formed to avoid the cut region of the substrate SUB2.

<<Color Filter FIL>>

Figure 9:
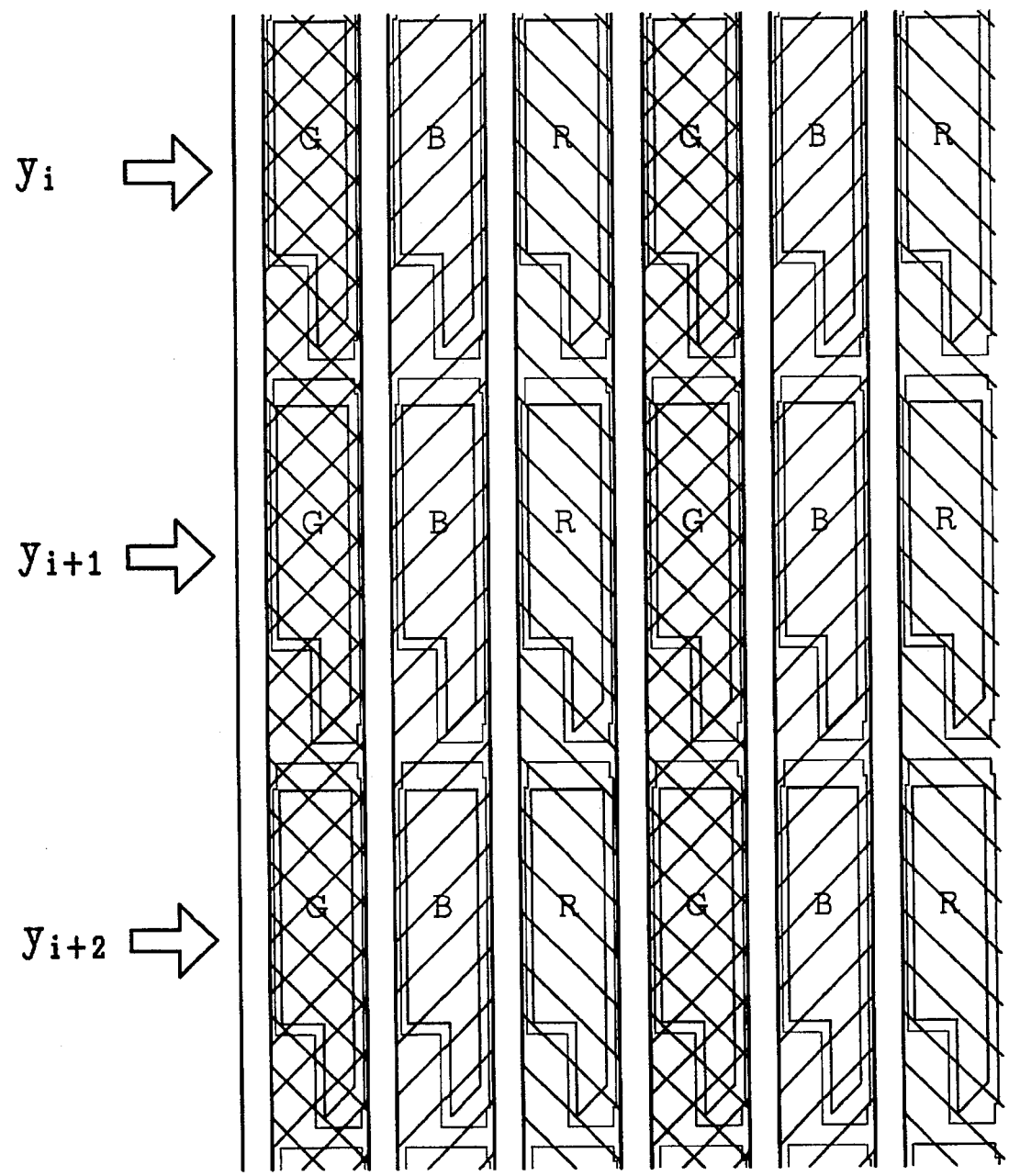
FIG. 9 is a top plan view of an essential portion and shows only the pixel electrode layer, the light-shielding film and the color filter layer of the pixel array shown in FIG. 5.

The color filter FIL is prepared by cooling a dyeing base, which is made of a resin material such as an acrylic resin, with a dye. The color filter FIL is formed (as shown in FIG. 9) in the shape of stripe and in a position to face the pixel. (FIG. 9 shows the first conductive film d1, the black matrix layer BM and the color filter layer FIL of FIG. 5 only, and the B, G and R filters are hatched at 45 degrees and 135 degrees and in a crossing manner, respectively.) The color filter FIL is made slightly large to cover the pixel electrode ITO1 in its entirety, as shown in FIGS. 8 to 9. The shielding film BM is so formed inside of the peripheral edge of the pixel electrode ITO1 as to overlap the color filter FIL and the pixel electrode ITO1.

The color filter FIL can be formed in the following manner. First of all, the dyeing base is formed on the surface of the upper transparent glass substrate SUB2, and the dyeing base other than that in the red color filter forming region is removed by the photolithographic technology. After this, the dyeing base is dyed with the red dye and fixed to form the red filter R. Next, the green filter G and the flue filter B are sequentially formed by the similar steps.

<<Passivation Film PSV2>>

The passivation film PSV2 is provided for preventing the dyes for different colors of the color filter FIL from leaking into the liquid crystal LC. The passivation film PSV2 is made of a transparent resin material such as an acrylic resin or epoxy resin.

<<Common Transparent Pixel Electrode ITO2>>

The common transparent pixel electrode ITO2 is opposed to the transparent pixel electrode ITO1, which is provided for each pixel at the side of the lower transparent glass substrate SUB1, so that the liquid crystal LC has its optical state varied in response to the potential difference (or electric field) between each pixel electrode ITO1 and the common pixel electrode ITO2. This common transparent pixel electrode ITO2 is fed with the common voltage Vcom. In the present embodiment, this common voltage Vcom is set at an intermediate potential between a driving voltage Vdmin at the low level and a driving voltage Vdmax at the high level, both of which are applied to the video signal line DL. An AC voltage may be applied in case the supply voltage of the integrated circuit to be used in the video signal drive circuit is to be reduced to one half. Incidentally, the top plan shape of the common transparent pixel electrode ITO2 should be referred to FIGS. 18 and 19.

<<Gate Terminal Portion>>

FIG. 10 presents a connection structure from the scanning signal line GL of the display matrix to its external connection terminal GTM, and (A) is a top plan view whereas (B) is a section taken along line B—B of (A). Incidentally, FIG. 10 corresponds to the lower portion of FIG. 19, and the hatched line portions are shown by straight lines for conveniences.

Letters AO designate a photolithographic mask pattern, namely, a photo resist pattern for selective anodization. As a result, this photo resist is anodized and then removed so that the shown pattern AO is not left as a complete but as a trace because the oxide film AOF is selectively formed in the gate line GL, as shown in section. With reference to the boundary line AO of the photo resist in the top plan view, the left hand side is the region which is covered with the resist and is not anodized, whereas the right hand side is the region which is exposed from the resist to the outside and is anodized. The anodized Al layer g2 has its surface formed with its oxide $Al_2O_3$ film AOF and its lower conductive portion reduced in volume. Of course, the anodization is so carried out for a proper time and at a proper voltage that the conductive portion may be left. The mask pattern AO is made to intersect the scanning line GL not in a straight line but in a folded crank shape.

The Al layer g2, as shown, is hatched for easy understanding, but the region left non-anodized is patterned in a comb shape. This is intended to suppress the probability of the line breakage and the sacrifice of the conductivity to the minimum while preventing any formation of whiskers by narrowing the width of each Al layer and bundling a plurality of them in parallel, because the whisker will occur in the surface for the wide Al layers. In the present embodiment, therefore, the portion corresponding to the root of the comb is displaced along the mask AO.

The gate terminal GTM is formed of: a Cr layer g1 having an excellent contact with the silicon oxide SiO layer and a higher resistance to galvanic corrosion than Al or the like; and the transparent conductive layer d1 protecting the surface of the Cr layer g1 and having the same level (belonging to the same layer and formed simultaneously) as the pixel electrode ITO1. Incidentally, the conductive layers d2 and d3 formed over and on the sides of the gate insulating film GI are left as a result that the conductive layers g2 and g1 are covered with the photo resist so that they may not be etched off by pin holes or the like at the time of etching the conductive layers d3 and d2. Moreover, the ITO layer d1 extended rightward across the gate insulating film GI is provided for further completing the similar countermeasures.

In the top plan view, the gate insulating film GI is formed at the more right hand side than its boundary, and a passivation film PSV1 is also formed at the more right hand side than the boundary so that the terminal portion GTM at the left hand side can be exposed from them into electric contact with the external circuits. Although only one pair of the gate line GL and the gate terminal is shown, a plurality of pairs are arranged vertically in FIG. 19 as a matter of fact, to constitute the terminal group Tg (as shown in FIGS. 18 and 19), and the gate terminals have their left hand ends are extended in the fabrication process across the cut region CT1 of the substrate and are short-circuited by a line SHg. This short-circuiting line SHg in the fabrication process is useful for supplying the electric power at the anodizing time and for preventing the electrostatic breakdown at the time of rubbing the orientation film ORI1.

<<Drain Terminal DTM>>

FIG. 11 is a diagram showing the connection from the video signal line DL to its external connection terminal DTM, and (A) presents a top plan view whereas (B) presents a section taken along line B—B of (A). Incidentally, FIG. 11 corresponds to the upper right hand portion of FIG. 19 and has its right hand direction corresponding to the upper end portion (or the lower end portion) of the substrate SUB1, although the direction of the drawing is changed for conveniences.

Letters TSTd designate a test terminal which is not connected with any external terminal but widened to contact with a probe or the like. Likewise, the drain terminal DTM is also made wider than the wiring portion as to connected with the external terminal. The test terminal TSTd and the external connection drain terminal DTM are so alternately arrayed in plurality as to be vertically staggered so that the test terminal TSTd terminates without reaching the end portion of the substrate SUB1, as shown. But, the drain terminals DTM constitute the terminal group Td (whose suffix is omitted), as shown in FIG. 19, and are further extended across the cut line CT1 of the substrate SUB1 so that all of them are short-circuited to each other through lines SHd so as to prevent any electrostatic breakdown during the fabrication step. The drain connection terminals are connected to the opposite sides of the video signal lines DL, in which the test terminal TSTd are present, across the matrix, whereas the test terminals are connected to the opposite sides of the video signal lines DL, in which the drain connection terminals DTM are present, across the matrix.

By a reason similar to the gate terminal GTM, the drain connection terminal DTM is formed of two layers, i.e., the Cr layer g1 and the ITO layer d1 and is connected with the video signal line DL through the portion, from which is removed the gate insulating film GI. The semiconductor layer AS formed over the end portion of the gate insulating film GI is provided for etching the edge of the gate insulating film GI in a taper shape. For connection with an external circuit, the passivation film PSV1 is naturally removed from the terminal DTM. Letters AO designate the aforementioned anodizing mask which has its boundary formed to enclose the entirety of the matrix. As shown, the left hand side is covered with the mask, but the remaining uncovered portion has no layer g2 so that it has no relation to the pattern.

The leading lines from the matrix portion to the drain terminal portion DTM are constructed, as shown at (C) in FIG. 19, such that the layers d2 and d3 at the same level as the video signal lines DL are laminated midway of the seal pattern SL just over the layers d1 and g1 at the same level as the drain terminal portion DTM. This construction is intended to minimize the probability of breakage of lines thereby to protect the galvanically corrosive Al layer as much as possible with the passivation film PSV1 and the seal pattern SL.

<<Structure of Additional Capacitor Cadd>>

The transparent pixel electrode ITO1 is formed to overlap the adjoining scanning signal line GL at the end opposed to the end to be connected with the thin film transistor TFT. This superposition constitutes a latching capacity element (or an electrostatic capacity element) Cadd which uses the transparent pixel electrode ITO as its one electrode PL2 and the adjoining scanning signal line GL as its other electrode PL1, as is apparent from FIGS. 2 and 4. This latching capacity element Cadd has its dielectric films formed of: the insulating film GI used as the gate insulating film of the thin film transistor TFT; and the anodized film AOF.

The additional capacitor Cadd is formed in the widened portion of the second conductive layer g2 of the scanning gate line GL, as is apparent from FIG. 6. Here, the second conductive film g2 at the portion intersecting the video signal line DL is thinned to reduce the probability of the short-circuiting with the video signal line DL.

Even if the transparent pixel electrode ITO1 is broken at the stepped portion of the electrode PL1 of the additional capacitor Cadd, its defect is compensated by the island region which is constructed of the second conductive film d2 and the third conductive film d3 formed across that step.

<<Equivalent Circuit of Whole Display Circuit>>

Figure 12:
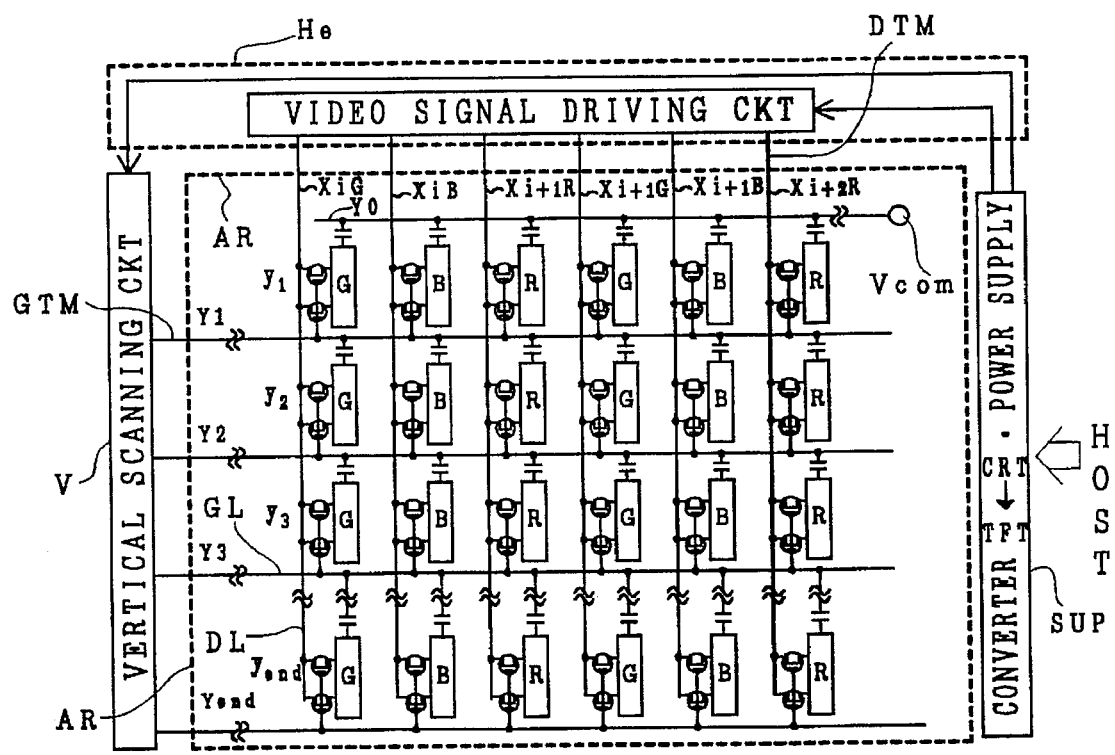
FIG. 12 is an equivalent circuit diagram showing a liquid crystal display unit of an active matrix type color liquid crystal display device.

FIG. 12 shows an equivalent circuit diagram of the display matrix portion and a wiring diagram of its peripheral circuits. Although this drawing is a circuit diagram, it is depicted in a manner to correspond to a practical geometric disposition. Letters AR designate a matrix array formed by disposing a plurality of pixels two-dimensionally.

In the drawing, letter X designates the video signal line, and suffixes G, B and R are added to correspond to green blue and red pixels, respectively. Letter Y designates the scanning signal line GL, and suffixes 1, 2, 3, . . . , and so on are added in accordance with the sequence of the scanning timing.

The video signal line X (although its suffixes are omitted) is connected with the upper video signal drive circuit He. Specifically, the video signal line X has its terminal led out like the scanning signal line Y only at one side of the liquid crystal display panel PNL.

The scanning signal line Y (whose suffix is omitted) is connected with a vertical scanning circuit V.

Letters SUP designate a circuit which includes a power supply circuit for obtaining a plurality of divided and stabilized voltage sources from one voltage source, and a circuit for converting data for CRT (i.e., Cathode Ray Tube) from a host (i.e., a higher-order operational processor) to data for the TFT liquid crystal display device.

<<Equivalent Circuit of Additional capacitor Cadd and its Operations>>

Figure 13:
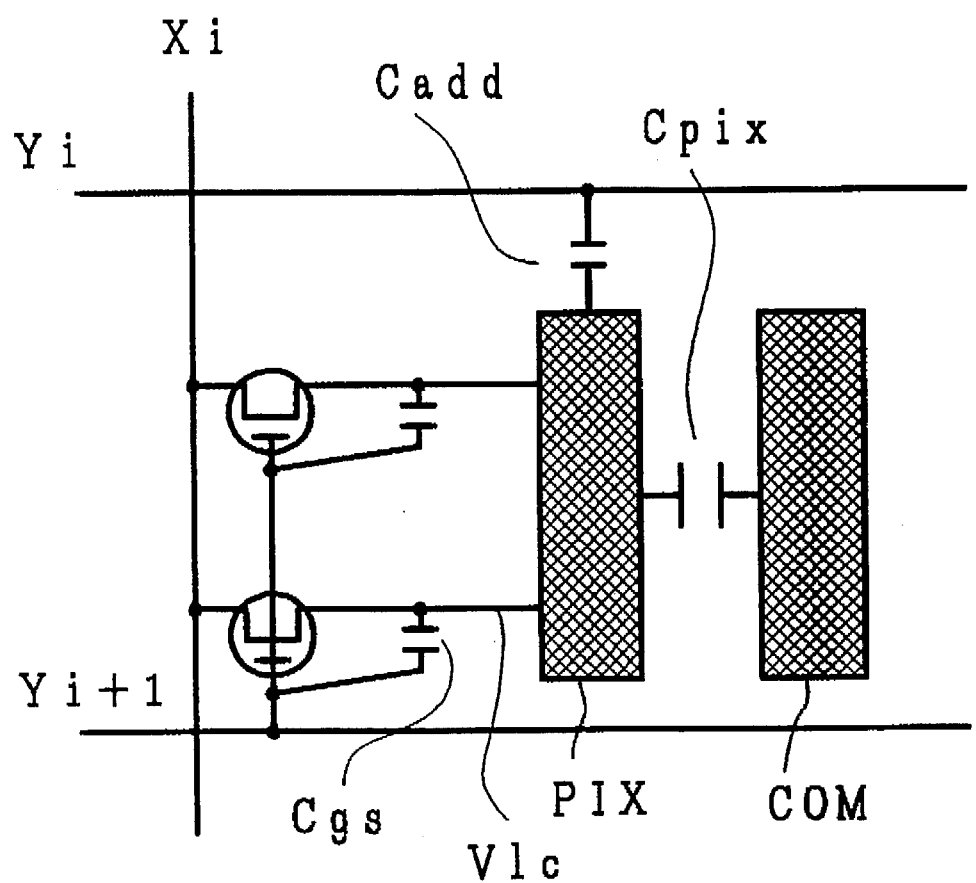
FIG. 13 is an equivalent circuit diagram of the pixel shown in FIG. 2.

The equivalent circuit of the pixel shown in FIG. 2 is shown in FIG. 13. In FIG. 13, letters Cgs designate a parasitic capacitor to be formed between the gate electrode GT and the source electrode SD1 of the thin film transistor TFT. The parasitic capacitor Cgs has its dielectric film made of the insulating film GT and the anodized oxide film AOF. Letters Cpix designate a liquid crystal capacitor to be formed between the transparent pixel electrode ITO1 (or PIX) and the common transparent pixel electrode ITO2 (or COM). The dielectric film of the liquid crystal capacitor Cpix is formed of the liquid crystal LC< the passivation film PSV1 and the alignment films ORI1 and ORI2. Letters V1c designate amid point potential.

The latching capacity element Cadd functions to reduce the influences of the gate potential variation delta Vg upon the center potential (e.g., the pixel electrode potential) V1c when the thin film transistor TFT switches, as expressed by the following formula:

$$\text{delta V1c} = \{Cgs/(Cgs+Cadd+Cpix)\} \times \text{delta Vg},$$

wherein delta V1c indicates the variation of the central potential due to delta Vg. This variation delta V1c causes the DC component to be added to the liquid crystal LC and can be reduced the more for the higher additional capacitor Cadd. Moreover, the additional capacitor Cadd functions to elongate the discharge time and stores the video information for a long time after the thin film transistor TFT is turned off. The DC component to be applied to the liquid crystal LC can improve the lifetime of the liquid crystal LC, to reduce the so-called "printing", by which the preceding image is left at the time of switching the liquid crystal display frame.

Since the gate electrode GT is enlarged to such an extent as to cover the semiconductor layer AS completely, as has been described hereinbefore, the overlapped area with the source electrode SD1 and the drain electrode SD2 is increased to cause an adverse effect that the parasitic capacity Cgs is increased to make the center potential V1c liable to be influenced by the gate (scanning) signal Vg. However, this demerit can be eliminated by providing the additional capacitor Cadd.

The latching capacity of the additional capacitor Cadd is set from the pixel writing characteristics to a level four to eight times as large as that of the liquid crystal capacity Cpix (4*Cpix<Cadd<8*Cpix) and eight to thirty two times as large as that of the capacity Cgs (8*Cgs<Cadd<32*Cgs).

<<Method of Connecting Electrode Line of Additional Capacitor Cadd>>

The initial stage scanning signal line GL (i.e., $Y_0$) to be used only as the capacity electrode line is set to the same potential as that of the common transparent pixel electrode (Vcom) ITO2, as shown in FIG. 12. In the example of FIG. 19, the initial stage scanning signal line is short-circuited to the common electrode COM through the terminal GTO, the leading line INT, a terminal DTO and an external line. Alternatively, the initial stage latching capacity electrode line $Y_0$ may be connected with the final stage scanning signal line Yend or a DC potential point (or AC ground point) other than the Vcom, or connect to receive one excess scanning pulse $Y_0$ from the vertical scanning circuit V.

<<Structure for Connection with External Circuit>>

FIG. 22 is a diagram showing a sectional structure of the tape carrier package TCP, in which the integrated circuit chip CHI is mounted on the flexible wiring substrate (as called "TAB": Tape Automated Bonding), to construct the scanning signal driving circuit V or the video signal driving circuits He and Ho. FIG. 23 is a section showing the state of an essential portion, in which the tape carrier package TCP is connected in the present example with the video signal circuit terminal DTM.

In the same drawing, letters TTB designate an input terminal/wiring portion of the integrated circuit CHI, and letters TTM designate an output terminal/wiring portion of the integrated circuit CHI. These portions are made of Cu, for example, and have their individual inner leading end portions (as called the "inner leads") connected with a bonding pad PAD of the integrated circuit CHI by the so-called "faced-down bonding method". The terminals TTB and TTM have their outer leading end portions (as called the "outer leads") corresponding to the input and output of the semiconductor integrated circuit chip CHI, respectively, and are connected with the CRT/TFT converter circuit and the power supply circuit SUP by the soldering method and with the liquid crystal display panel PNL through an anisotropic conductive film ACF. The package TCP is so connected with the panel that its leading end portion covers the passivation film PSV1 having the connection terminal DTM exposed at the side of the panel PNL. As a result, the external connection terminal DTM (GTM) is strong against the galvanic corrosion because it is covered with at least one of the passivation film PSV1 or the package TCP.

Letters BF1 designate a base film made of polyimide or the like, and letters SRS designate a solder resist film for masking to prevent the solder from leaking to an unnecessary portion at the soldering time. The gap between the upper and lower glass substrates outside of the seal pattern SL is protected after the rinsing step by the epoxy resin EPX or the like, and this protection is multiplexed by filling a silicone resin SIL between the package TCP and the upper substrate SUB2.

<<Manufacturing Process>>

Next, a process for manufacturing the side of the substrate SUB1 of the aforementioned liquid crystal display device will be described with reference to FIGS. 14 to 16. In these Figures, the central letters indicate the abbreviations of the step names, and the left hand sides show the pixel portions shown in FIG. 3 whereas the right hand sides show the process flow, as viewed in suction from the vicinity of the gate terminals shown in FIG. 10. Steps A to I excepting Step D are divided to correspond to the individual photolithographic steps, and any sections of the individual steps indicate the steps, at which the photo resists are removed after the photolithographic treatments. Incidentally, these photolithographic treatments are intended in the present description to imply a series of operations from the application of a photo resist to the development through a selective exposure using a mask, and their repeated description will be omitted. The description will be made in accordance with the steps divided, as follows.

Figure 14A:
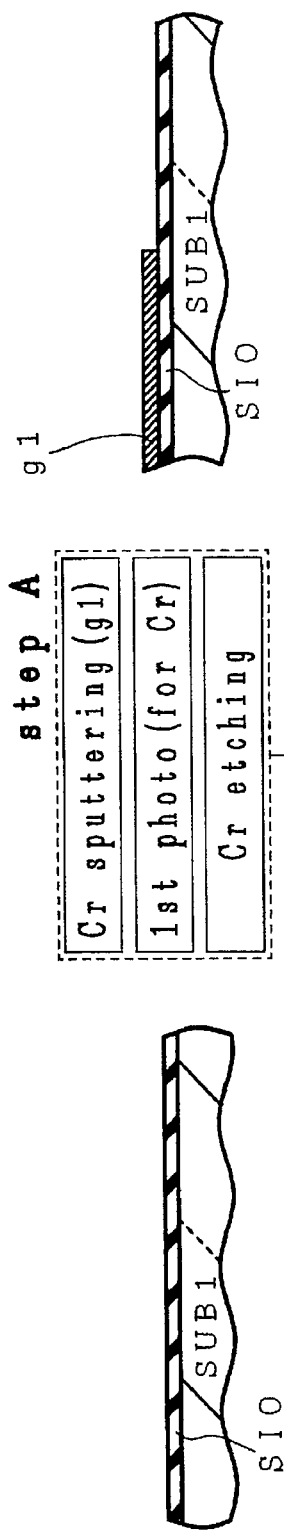
FIGS. 14(A)–14(C) show a flow chart of a section of a pixel portion and a gate terminal portion and shows the manufacture steps A to C at the side of a substrate SUB1.

Step A, FIG. 14(A)

A silicon dioxide film SIO is deposited by the dip treatment on both surfaces of a lower transparent glass substrate SUB1 made of 7059 glass (under the trade name), and then a baking is carried out at 500 degree for 60 minutes. A first conductive film g1 consisting of a 1,100 angstrom chromium film is deposited on the lower transparent glass substrate SUB1 by the sputtering. After the photolithographic treatment, the first conductive film g1 is etched selectively by the photoetching using a ceric ammonium nitrate solution as an etching solution, thereby forming a gate terminal GTM and a drain terminal DTM and forming also a power bus line SMg for anodization for connecting the gate terminal GTM, and a pad (although not shown) connected with the power bus line SHg for anodization.

Figure 14B:
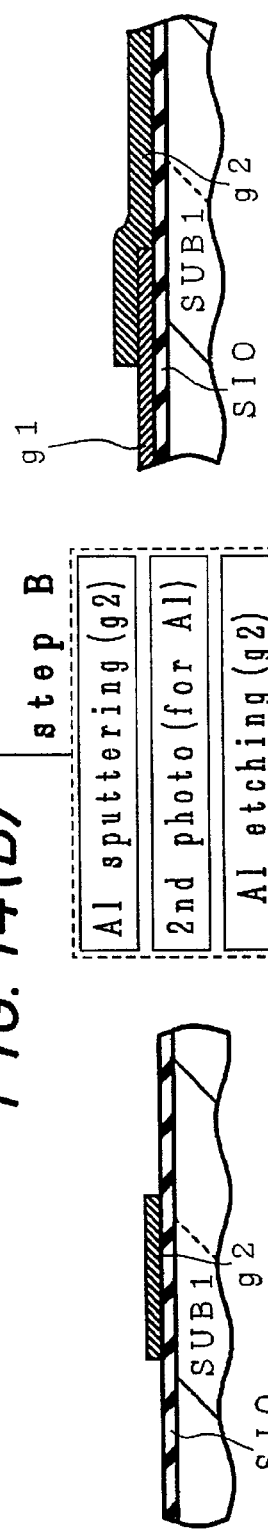

Step B, FIG. 14(B)

A second conductive film g2 having a thickness of 2,800 angstroms and made of Al—Pd, Al—Si, Al—Si—Ti or Al—Si—Cu is formed by the sputtering. After the photolithographic treatment, the second conductive film g2 is selectively etched with a mixed acid solution of phosphoric acid, nitric acid and glacial acetic acid.

Figure 14C:
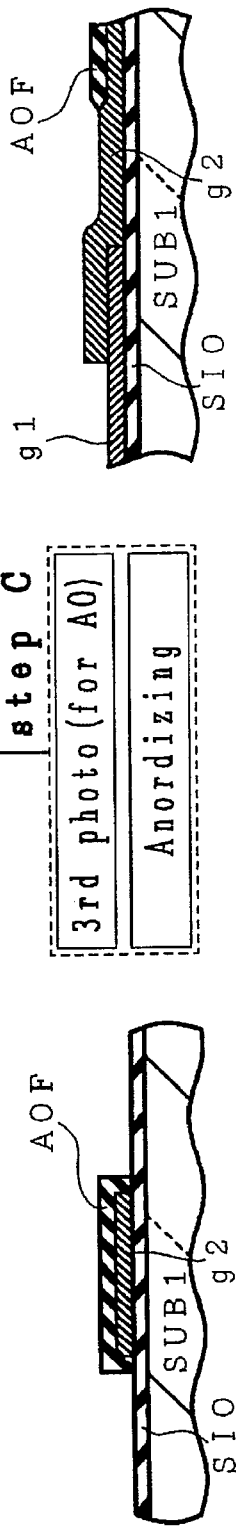

Step C, FIG. 14(C)

After the photolithographic treatment (i.e., after the formation of the aforementioned anodized mask AO), the substrate SUB1 is dipped in the anodizing liquid which is prepared by diluting a solution containing 3% of tartaric acid adjusted to PH 6.2 to 6.3 with a solution of ethylene glycol, and the anodizing current density is adjusted to 0.5 mA/cm$^2$ (for anodization at a constant current). Next, an anodization is carried out till an anodization current of 125 V necessary for a predetermined $Al_2O_3$ film thickness is reached. After this, the substrate SUB1 is desirably held in this state for several ten minutes (for anodization at a constant voltage). This is important for achieving a uniform $Al_2O_3$ film. Thus, the conductive film g2 is anodized to form an anodized film AOF having a thickness of 1,800 angstroms over the scanning signal line GL, the gate electrode GT and the electrode PL1.

Step D, FIG. 15(A)

Ammonia gas, silane gas and nitrogen gas are introduced into a plasma CVD apparatus to form a Si nitride film having a thickness of 2,000 angstroms, and silane gas and hydrogen gas are introduced into the plasma CVD apparatus to form an i-type amorphous Si film having a thickness of 2,000 angstroms. After this, hydrogen gas and phosphine gas are introduced into the plasma CVD apparatus to forman N(+)-type amorphous Si film having a thickness of 300 angstroms.

Step E, FIG. 15(B)

After the photolithography, the N(+)-type amorphous Si film and the i-type amorphous Si film are selectively etched by the photoetching using $SF_6$ and $CCl_4$ as the dry etching gas to form an island of an i-type semiconductor layer AS.

Step F, FIG. 15(C)

After the photolithography, the Si nitride film is selectively etched by using $SF_6$ as the dry etching gas.

Figure 16A:
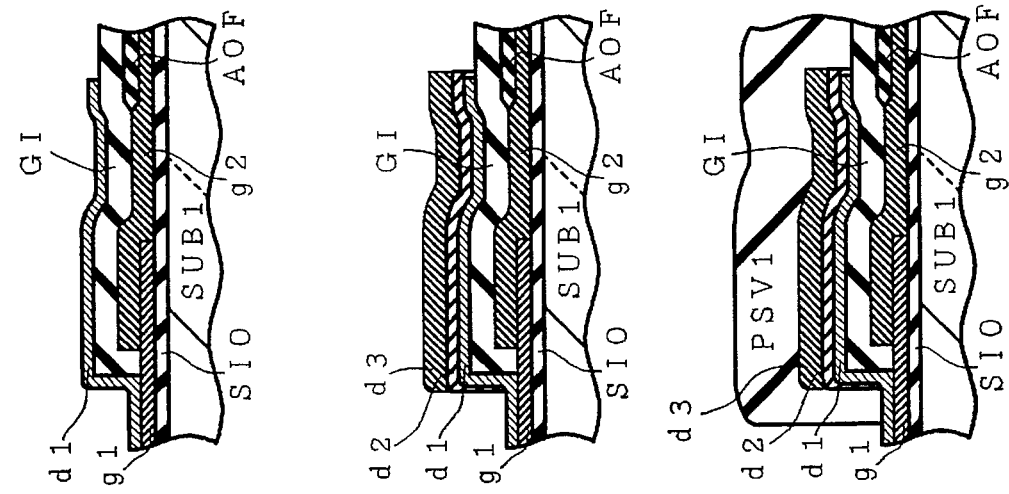
FIGS. 16(A)–16(C) show a flow chart of a section of a pixel portion and a gate terminal portion and shows the manufacture steps A to C at the side of a substrate SUB1.

Step G, FIG. 16(A)

A first conductive film d1 formed of an ITO film having a thickness of 1,400 angstroms is formed by the sputtering. After the photolithography, the first conductive film d1 is selectively etched by using a mixed acid solution of hydrochloric acid and nitric acid as the etching solution, to form the uppermost layer of the gate electrode GTM and the drain terminal DTM and the transparent pixel electrode ITO1.

Figure 16B:
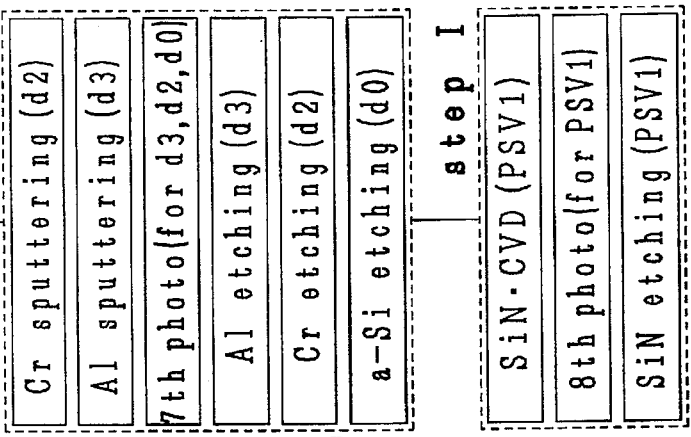

Step H, FIG. 16(B)

A second conductive film d2 of Cr having a thickness of 600 angstroms is formed by the sputtering, and a third conductive film d3 of Al—Pd, Al—Si, Al—Si—Ti or Al—Si—Cu having a thickness of 4,000 angstroms is formed by the sputtering. After the photolithography, the third conductive film d3 is etched by a solution similar to that of Step B, and the second conductive film d2 is etched by a solution similar to that of Step A, to form the video signal line DL, the source electrode SD1 and the drain electrode SD2. Next, $CCl_4$ and $SF_6$ are introduced into a dry etching apparatus to etch the N(+)-type amorphous Si film thereby to remove the N(+)-type semiconductor layer d0 selectively from between the source and the drain.

Figure 16C:
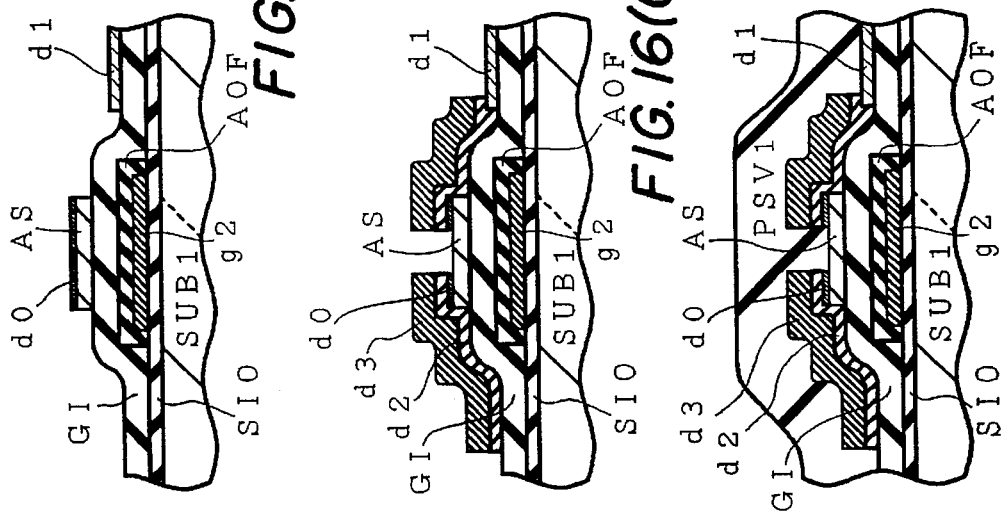

Step I, FIG. 16(C)

Ammonia gas, silane gas and nitrogen gas are introduced into a plasma CVD apparatus to form a Si nitride film having a thickness of 1 micron. After the photolithography, the Si nitride film is selected by the photoetching technique using $SF_6$ as the dry etching gas, to form the passivation film PSV1.

<<Structure of Whole Liquid Crystal Display Module>>

FIG. 1 is an exploded perspective view showing a liquid crystal display module MDL, and the specific construction of the individual components is shown in FIGS. 24 to 45.

Letters SHD designate a shield casing (which may also be called the "metal frame") made of a metal plate; letters WD a display window; letters INS1 to INS3 designate insulating sheets; letters PCB1 to PCB3 designate circuit substrates (composed of a drain side circuit substrate PCB1, a gate side circuit substrate PCB2, and an interface circuit substrate PCB3); letters JN designate a joiner for electrically connecting the circuit substrates PCB1 to PCB3 with each other; letters TCP1 and TCP2 designate tape carrier packages; letters PNL a liquid crystal display panel; letters GC designate a rubber cushion; letters ILS designate a shade spacer ILS; letters PRS designate a prism sheet; letters SPS designate a diffusion sheet; letters GLB designate a light guide plate; letters RFS designate a reflecting sheet; letters MCA designate a lower casing (or mold casing) formed by the monolithic molding; letters LP designate a fluorescent tube; letters LPC designate a lamp cable; and letters GB designate a rubber bush supporting the fluorescent tube LP; and letters BAT designate double sided adhesive tape. These members are individually stacked in the following arrangement relation, as shown, to assemble a liquid crystal display module MDL.

The module MDL has two kinds of accommodating and holding members of a lower casing MCA and a shield casing SHD. The module MDL is assembled by uniting the metallic shield casing SHD, which accommodates and fixes the insulating sheets INS1 to INS3, the circuit substrates PCB1 to PCB3 and the liquid crystal display panel PNL, and the lower casing MCA, which accommodates a back light BL composed of the fluorescent tube LP, the optical guide plate GLB and the prism sheet PRS.

Here will be described those individual members in detail in the following.

<<Metallic Shield Casing SHD>>

FIGS. 25(A)–25(D) present the upper side, front side, rear side, right hand side and left hand side of the shield casing SHD, and a perspective view, as taken obliquely from above the shield casing SHD.

The shield casing (or metal frame) SHD is fabricated by punching or folding a metal sheet by the pressing technique.

Letters WD designate a window for exposing the display panel PNL to the field of view, as will be called the "display window".

Figure 25:
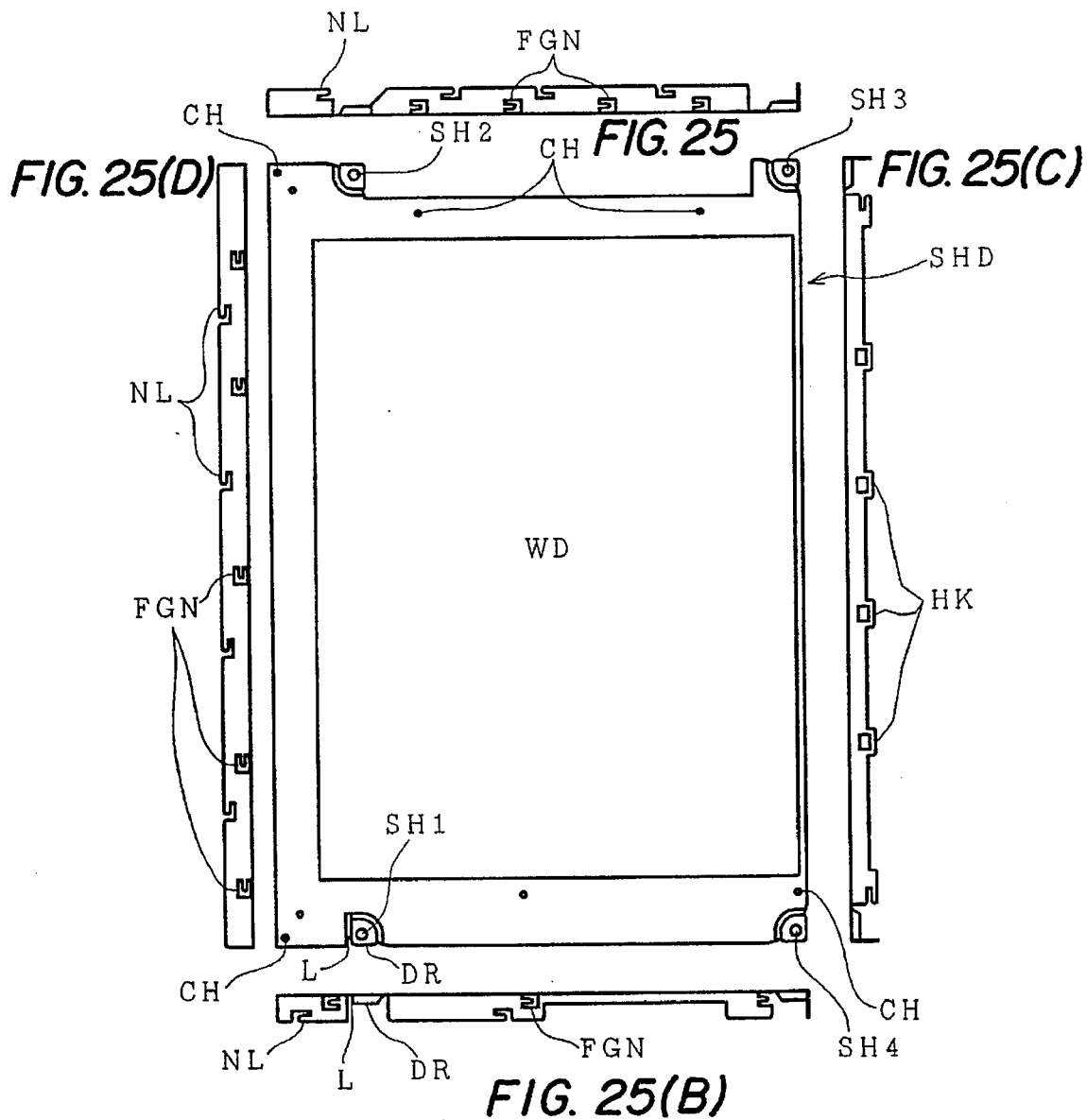
FIG. 25 is a top plan view, FIG. 25(A) front side, FIG. 25(B) rear side, FIG. 25(C) right hand side and FIG. 25(D) left hand side of the shield casing SHD.
Figure 43:
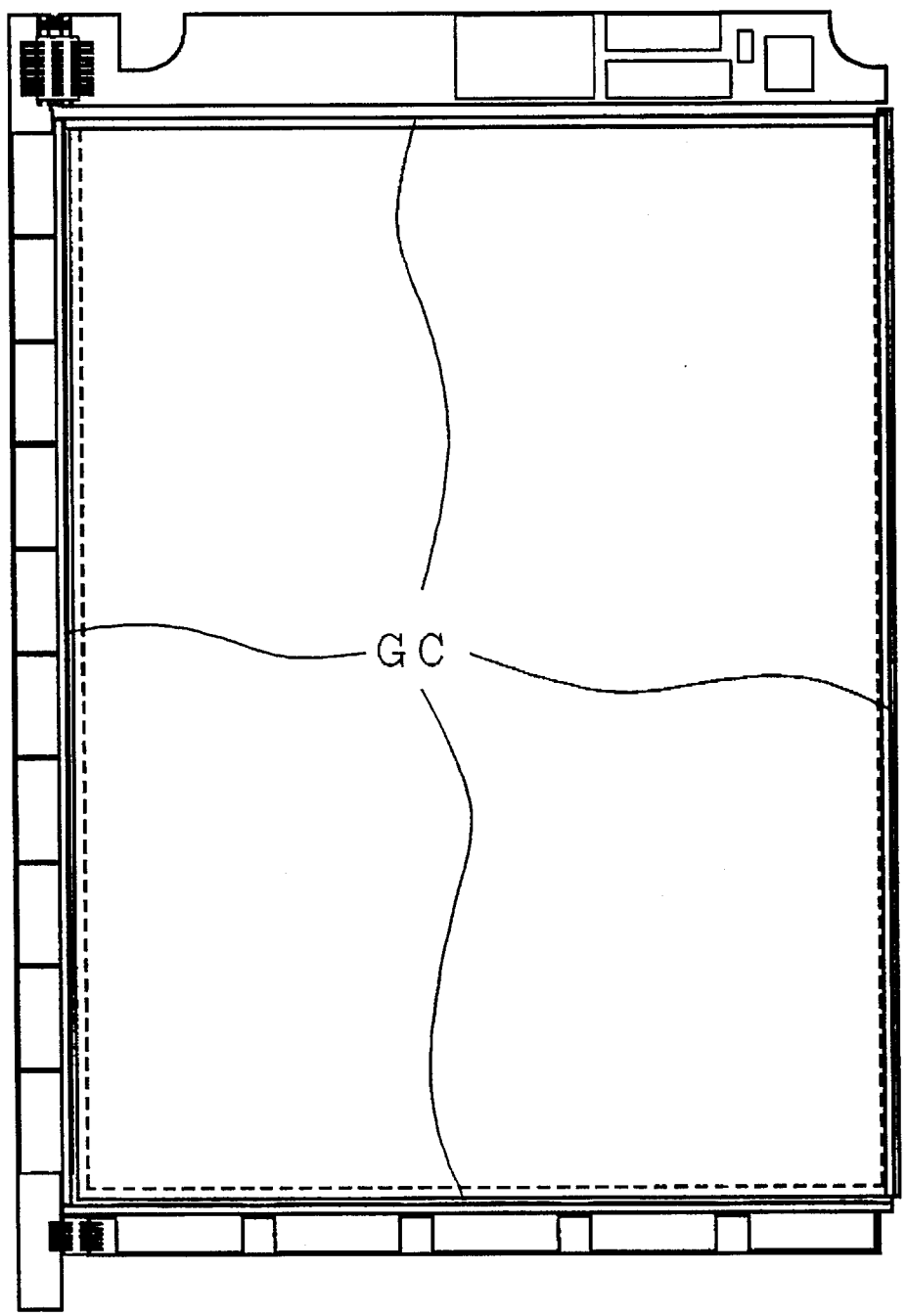
FIG. 43 is a bottom view of the liquid crystal display panel PNL, the circuit substrates PCB1 to PCB3 having the tape carrier package TCP packaged therein, and rubber cushions GC.

Letters NL designate fixing pawls (totally twelve in number) for fixing the shield casing SHD and the lower casing MCA, and letters HK also designate fixing hooks (totally four in number) integrally formed in the shield casing SHD. Before the fixing pawls NL shown in FIGS. 1 and 25 are folded, the circuit substrates PCB1 to PCB3 are accommodated in the shield casing SHD. After this, the fixing pawls NL are folded inward and inserted into the rectangular fixing recesses NR (as shown at the individual side elevation of FIG. 37) which are formed in the lower casing MCA. The fixing hooks HK are individually fitted on the fixing projections HP (as shown at the side elevation of FIG. 37) formed in the lower casing MCA. As a result, the shield casing SHD holding and accommodating the circuit substrates PCB1 to PCB3, and the lower casing MCA holding and accommodating the light guide plate GLB and the fluorescent tube LP are firmly fixed. On the other hand, such four sides of the lower side of the display panel PNL, as will exerts no influence upon the display, have their edges equipped with the thin and long rubber cushion GC (which may also be called the "rubber spacer", as shown in FIGS. 1 and 43) having a rectangular shape. This rubber cushion GC is sandwiched between the display panel PNL and the light guide plate GLB. By pushing the shield casing SHD into the device by making use of the elasticity of the rubber cushion GC, the fixing hooks HK are caught by the fixing projections HP, and the fixing pawls NL are folded into the fixing recesses NR. As a result, those individual fixing members function as stoppers to fix the shield casing SHD and the lower casing MCA so that the module is firmly held in its entirety while requiring no other fixing members. Thus, the assembly can be facilitated to reduce the production cost. Moreover, the mechanical strength can be increased to enhance the vibration and impact resistances thereby to improve the reliability of the device. Since, on the other hand, the fixing pawls NL and the fixing hooks HK can be easily removed (merely by straightening the fixing pawls NL and removing the fixing hooks HK), these two members can be easily disassembled and assembled so that they can be easily repaired to facilitate the replacement of the fluorescent tube LP of the back light BL. In the present embodiment, moreover, one side is fixed mainly by the fixing hooks HK whereas the opposed other side is fixed by the fixing pawls NL, as shown in FIG. 25, so that the disassembly can be effected merely by removing not all but some of the fixing pawls NL. As a result, the repair and the replacement of the back light can be facilitated.

Letters CH designate common through holes which are formed in common plan positions shared among the circuit substrates PCB1 to PCB3. At the manufacturing time, the shield casing SHD and the circuit substrates PCB1 to PCB3 are sequentially packaged by fitted the individual common through holes CH on fixed upright pins, so that they may be accurately positioned relative to each other. Moreover, the common through holes CH can be used as positioning references when the module MDL is to be packaged in an appliance such as a personal computer.

Figure 24:
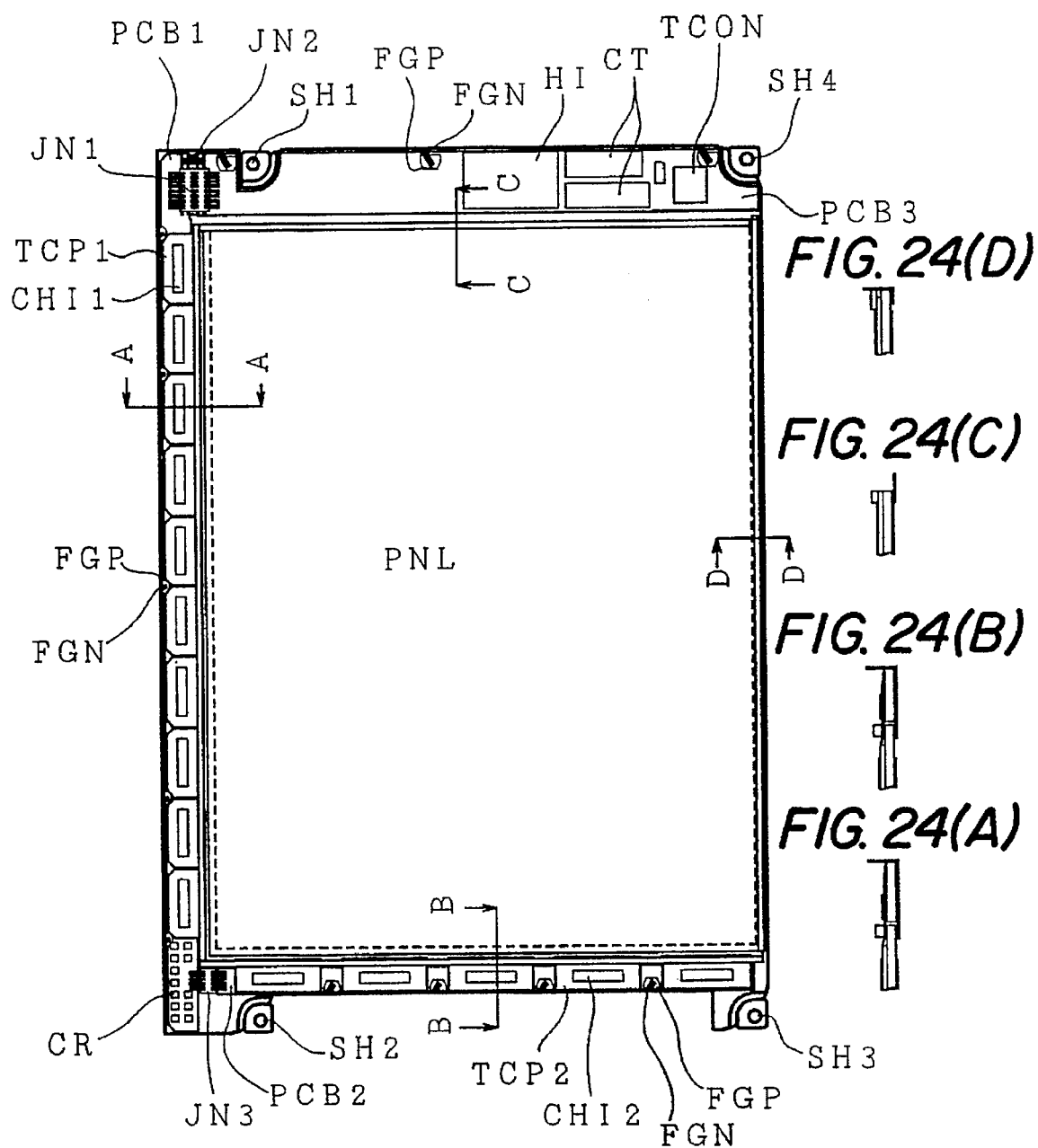
FIG. 24 is a bottom view of a shield casing SHD having a liquid crystal display panel PNL and circuit substrates PCB1 to PCB3 assembled therein.
Figure 27:
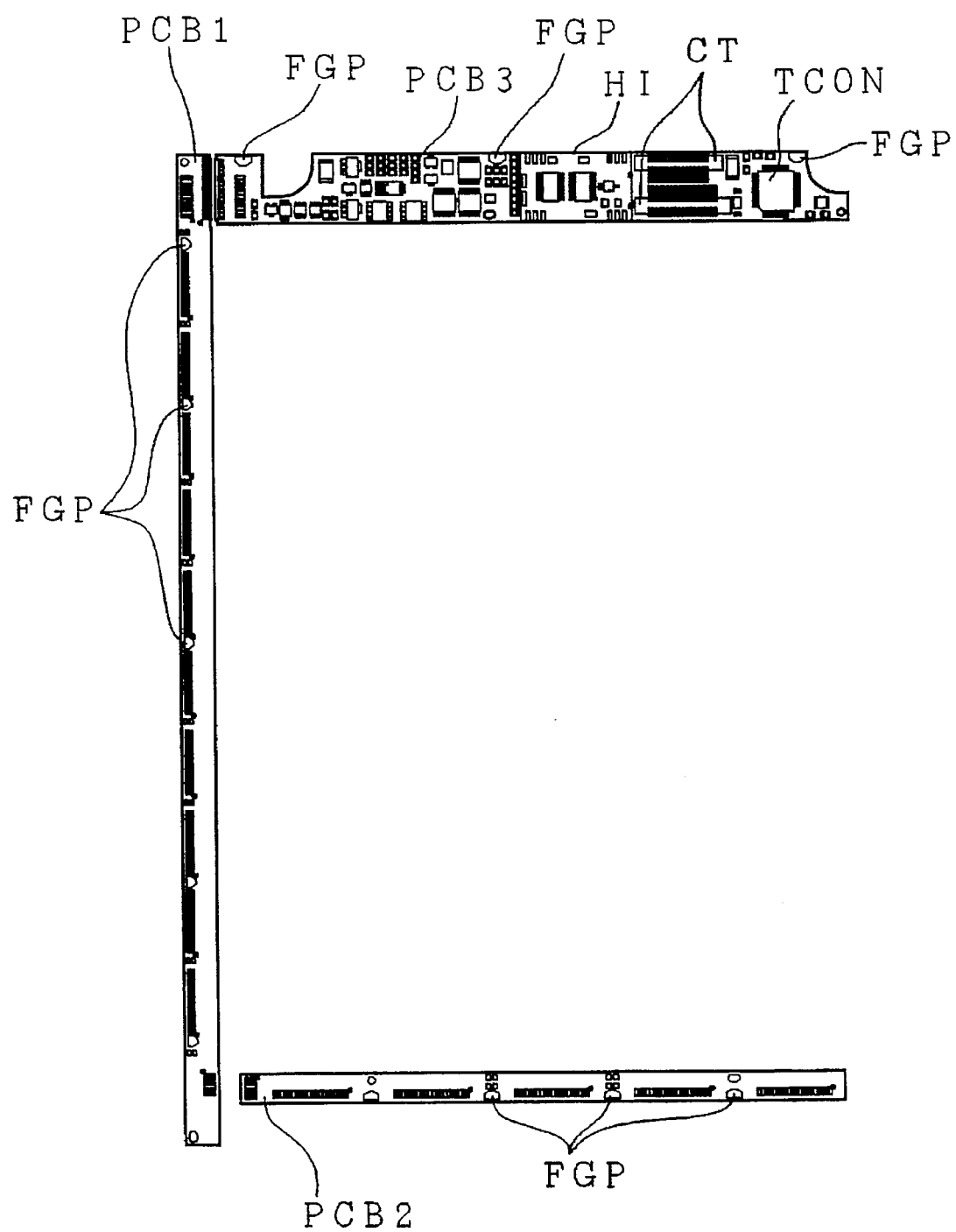
FIG. 27 is a detailed bottom view of the circuit substrates PCB1 to PCB3 having no tape carrier package TCP packaged therein.

Letters FGN designate totally twelve frame ground pawls formed integrally with the metallic shield casing SHD. These frame ground pawls FGN are constructed of rectangular projections extending into square openings, i.e., the C-shaped openings which are formed in the side of the shield casing SHD. These slim projections, i.e., the pawls FGN are individually folded at their roots inward of the device and are soldered and connected to the frame ground pads FGP (as shown in FIGS. 24 and 27) which are connected with the (now-shown) ground wiring lines of the circuit substrates PCB1 to PCB3. Incidentally, since the pawls FGN are formed on the side of the shield casing SHD, the works of folding the pawls FGN into the device and soldering the same to the frame ground pads FGP can be effected with the shield casing SHD having its inner side (or lower side) being directed upward, after the circuit substrates PCB1 to PCB3 integrated with the liquid crystal display panel PNL have been accommodated in the shield casing SHD, so that the workability is satisfactory. Moreover, the pawls FGN are free, when folded, from abutment against the circuit substrates PCB1 to PCB3, so that the folding works are satisfactory. In the soldering works, moreover, the soldering iron can be applied from the inner side of the opened shield casing SHD so that the soldering works are satisfactory. As a result, the reliability of the connections between the pawls FGN and the frame ground pads FGP can be improved.

Figure 37:
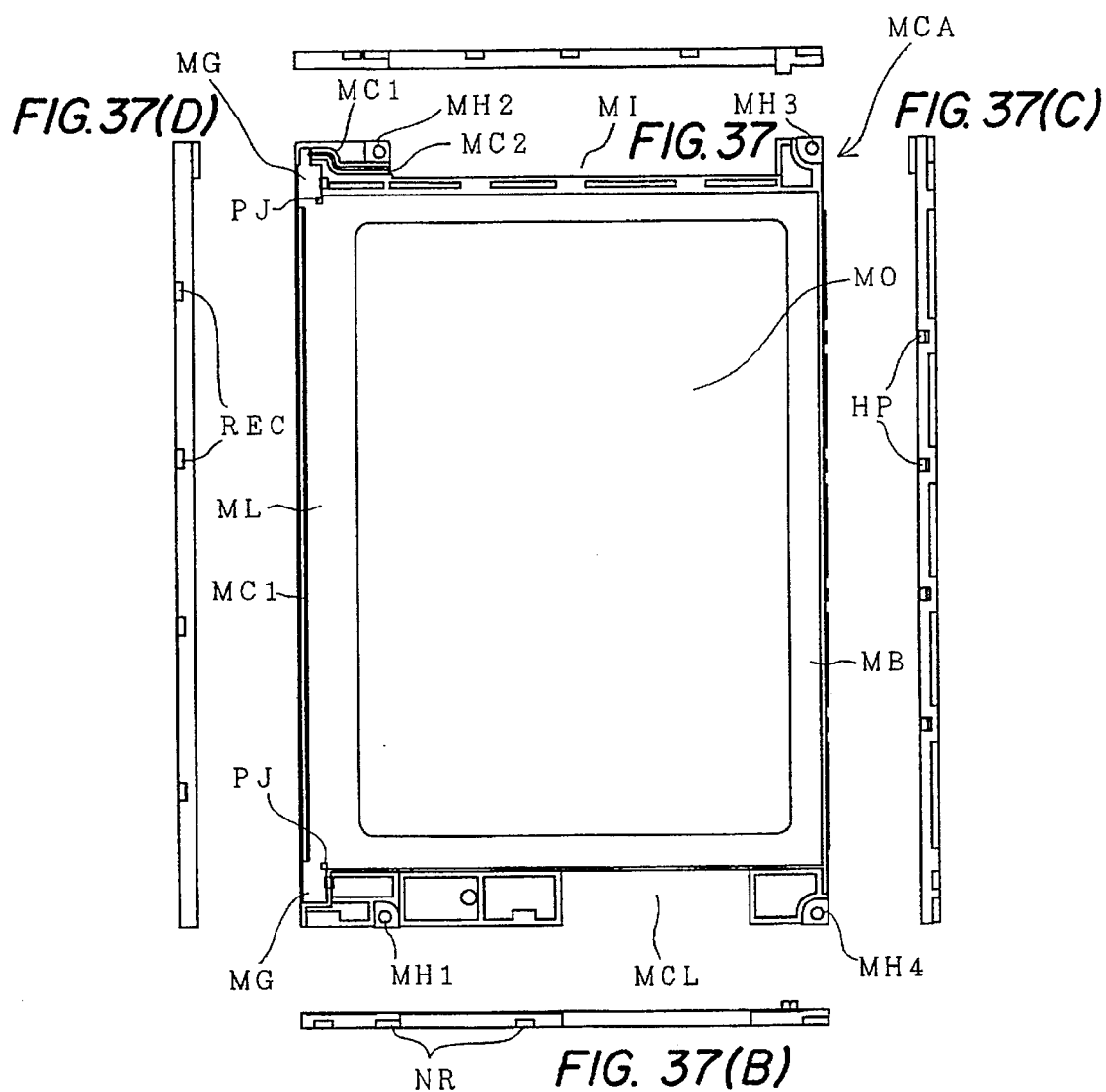
FIG. 37 is a top plan view, FIG. 37(A) front side, FIG. 37(B) rear side, FIG. 37(C) right hand side and FIG. 37(D) left hand side of a lower casing MCA.
Figure 38:
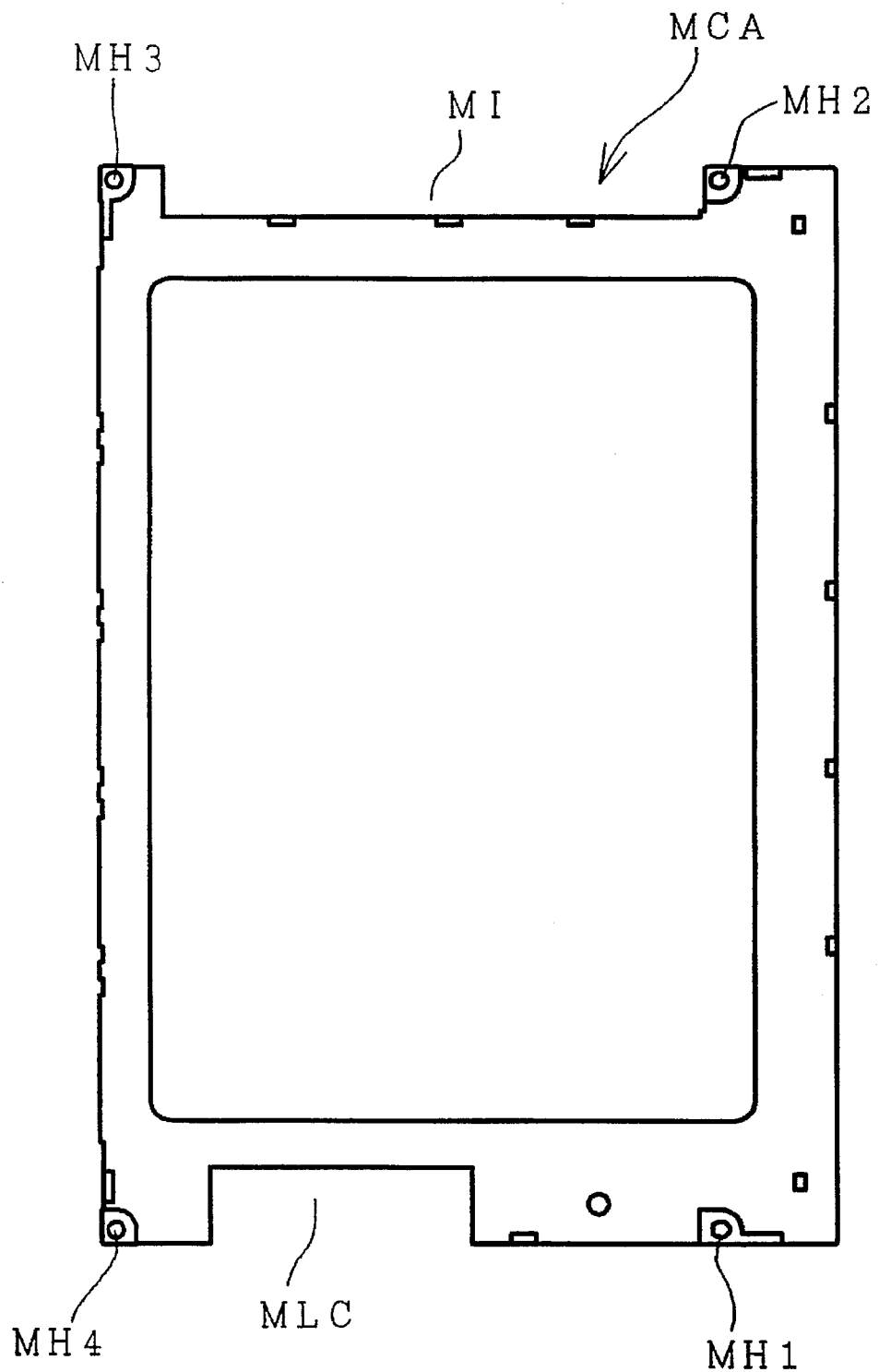
FIG. 38 is a bottom view of the lower casing MCA.

Letters SH1 to SH4 designate four mounting holes which are formed in the shield casing SHD so as to the module MDL as a display unit in a data processing device such as a personal computer or word processor. The lower casing MCA is also formed with mounting holes MH1 to MH4 which are aligned with the mounting holes SH1 to SH4 of the shield casing SHD (as shown in FIGS. 37 and 38), and screws are threaded into the two mounting holes to fix and package the data processing device. Incidentally, in case the mounting holes are to be formed in the corners of the metallic shield casing SHD, the drawn portions (i.e., the drawn portions which are integral with a metal plate forming the metallic shield casing SHD and which form a parallel plane at a level different from that of the metal plate) of the mounting holes can be formed into a quadrant shape. In case, however, the mounting holes SH are intended to be formed not in the corners but in intermediate portions at a predetermined distance from the corners from the standpoints of both the arrangement of the packaged parts of the circuit substrate PCB3 and the electric connection between the circuit substrates PCB1 and PCB2, the shape of the drawn portions DR of the mounting holes SHD cannot be the quadrant shape but a semicircular shape from the conveniences of the drawing operation so that the areas necessary for the mounting holes are enlarged. As shown in FIG. 25, therefore, notches L are formed in the radial portions of the quadrant shapes between the drawn portions DR and the adjoining metal plate to facilitate the drawing operation so that the drawn portions DR of the mounting holes SH1 can be formed into the quadrant shape to reduce the areas necessary therefor. As a result, the module MDL can be small-sized and light-weighted to reduce the production cost. In other words, the mounting holes SH can be formed at the intermediate portions at the predetermined distance from the corners of the module MDL while realizing the size reduction of the module MDL.

<<Circuit Substrates PCB1 to PCB3>>

Figure 26:
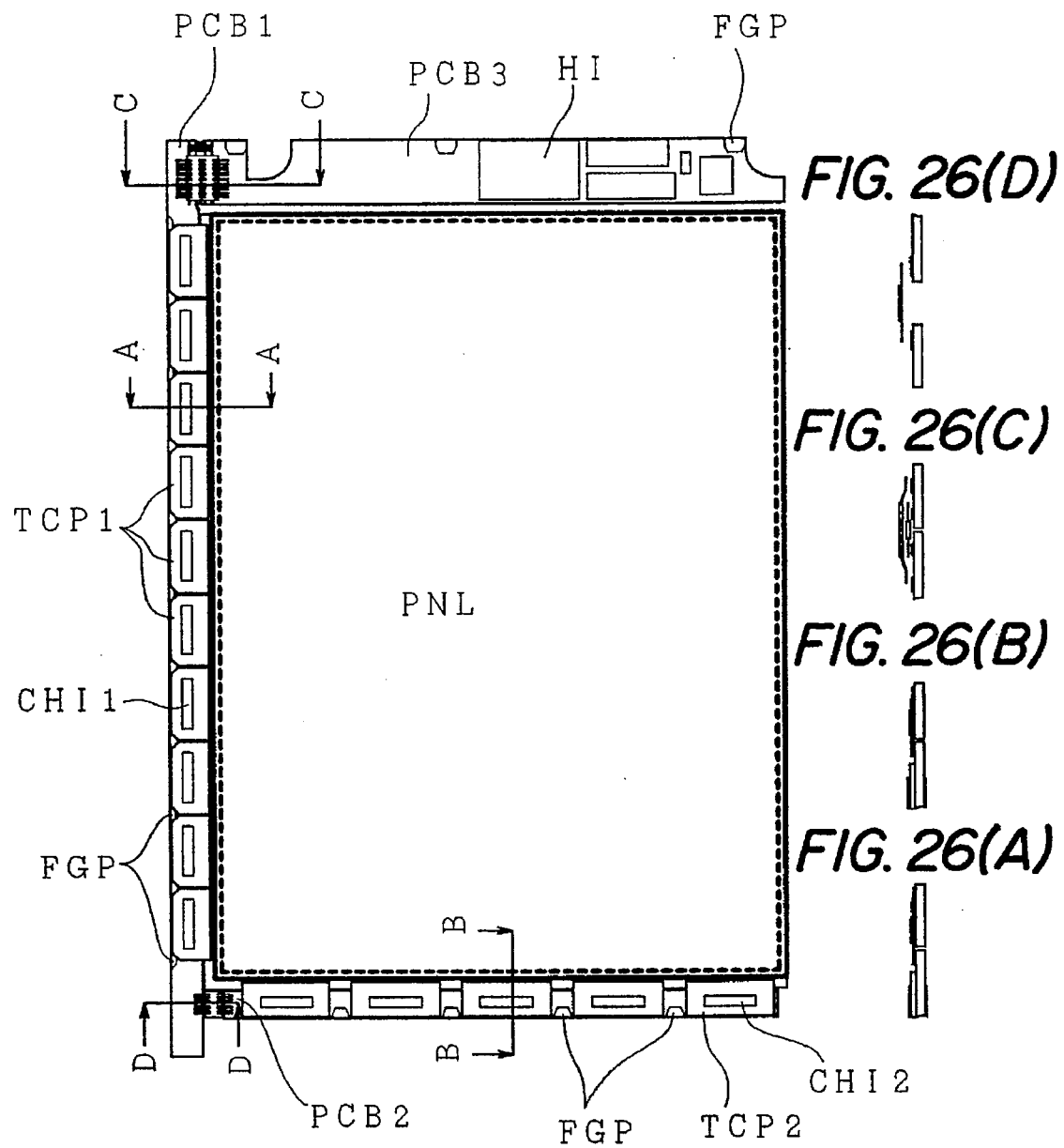
FIG. 26 is a bottom view of the circuit substrates PCB1 to PCB3 having the liquid crystal display panel PNL and a tape carrier package TCP packaged therein.
Figure 31:
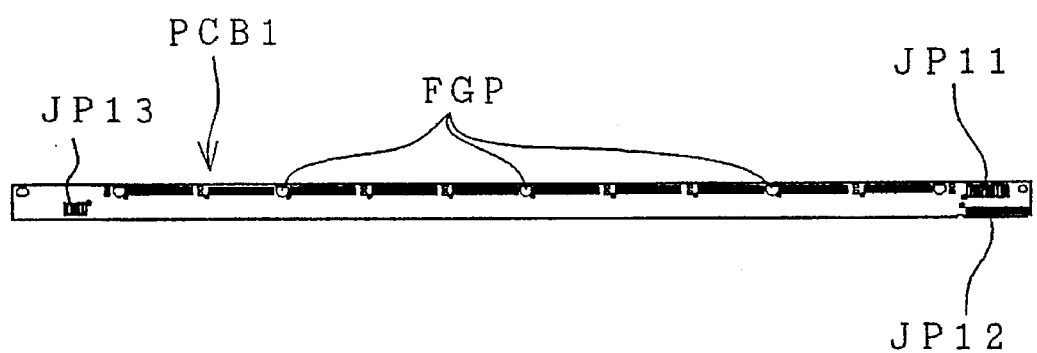
FIG. 31 is a bottom view of the gate side circuit substrate PCB1.
Figure 32:
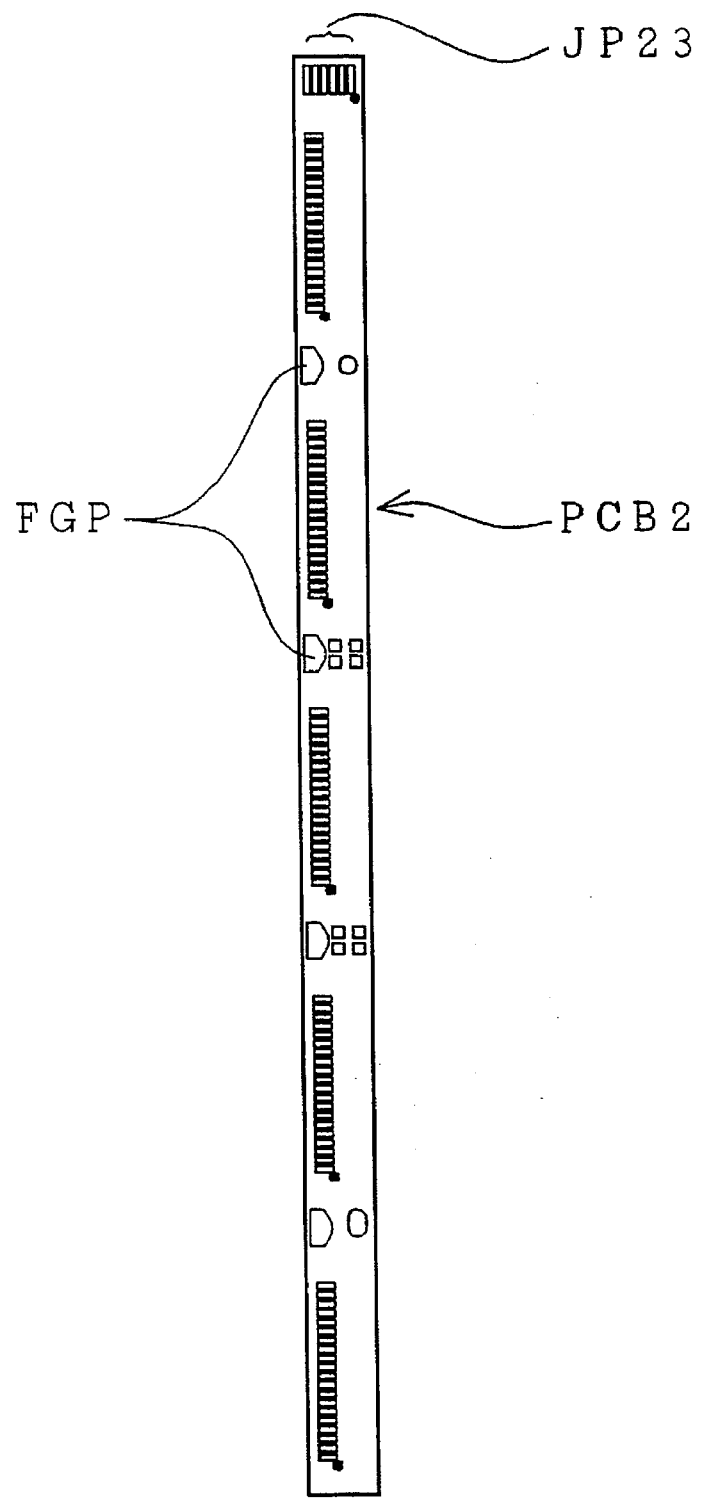
FIG. 32 is a bottom view of the gate side circuit substrate PCB2.

FIG. 26 presents the lower side and respective sections showing the state in which the circuit substrates PCB1 to PCB3 are packaged in the outer peripheral portions of the display panel PNL; FIG. 24 presents the lower side and individual sections showing the state in which the display panel PNL and the circuit substrates PCB1 to PCB3 are accommodated and packaged in the shield casing SHD; FIG. 27 presents the lower sides of the circuit substrates PCB1 to PCB3 (showing that the tape carrier package TCP is not packaged in the circuit substrates PCB1 and PCB2 but the circuit substrate PCB3 in more detail than FIGS. 24 and 26);

FIG. 29(A) presents the lower side of the circuit substrate PCB3 in the state having no electric parts packaged; FIG. 29(B) presents the lower side showing the same in the state having the electric parts packaged; FIG. 31 presents the lower side of the circuit substrate PCB1 (not having the tape carrier package TCP packaged); and FIG. 32 presents the lower side of the circuit substrate PCB2 (not having the tape carrier package TCP packaged).

Letters CHI1 and CHI2 designate the drive IC (i.e., integrated circuit) chips (of which the lower five of FIG. 26 are drive IC chips at the vertical scanning circuit side whereas the left hand ten are drive IC chips at the video signal drive circuit side) for driving the display panel PNL. Letters TCP1 and TCP2 designate the tape carrier packages in which the driving IC chip CHI is packaged by the tape automated bonding (i.e., TAB) method, as described with reference to FIG. 23, and letters PCB1 and PCB2 designate circuit substrates which are made of the PCB (i.e., printed circuit board) individually having the TCP, a capacitor CDS and so on packaged therein. Letters FGP designate a frame ground pad; letters JN3 designate a joiner for electrically connecting the drain side circuit substrate PCB1 and the gate side circuit substrate PCB2; and letters JN1 and JN2 designate joiners for electrically connecting the drain side circuit substrate PCB1 and the interface circuit substrate PCB3. The joiners JN1 to JN3, as shown in FIG. 35, are constructed by sandwiching and supporting a plurality of lead wires (made of a phosphor bronze material plated with Sn) between a striped polyethylene layer and a polyvinyl alcohol layer. Incidentally, the JN1 to JN3 can also be constructed by using an FPC (i.e., flexible printed circuit).

Specifically, the display panel PNL has its three outer peripheral portions arranged with the circuit substrates PCB1 to PCB3 of the display panel PNL in the shape of letter "C". The outer peripheral portion of one longer side (as located at the left hand side of FIG. 24) of the display panel PNL is arranged with the drain side circuit substrate PCB1 in which there are packaged a plurality of tape carrier packages TCP1 each having the drive IC chip (or driver) CHI1 mounted for feeding the drive signals to the video signal lines (i.e., drain signal lines) of the display panel PNL. On the other hand, the outer peripheral portion of one shorter side (as located at the lower side of FIG. 24) of the display panel PNL is arranged with the gate side circuit substrate PCB2 in which there are packaged a plurality of tape carrier packages TCP2 each having the drive IC chip CHI2 mounted for feeding the drive signals to the scanning signal lines (i.e., gate signal lines) of the display panel PNL. Moreover, the outer peripheral portion of the other shorter side (as located at the upper side of FIG. 24) of the display panel PNL is arranged with the interface circuit substrate (which may also be called the "control circuit substrate" or "converter circuit substrate") PCB3.

Since the circuit substrates PCB1 to PCB3 are divided into three generally rectangular shapes, the stresses to be established in the directions of their longer axes due to the difference in the coefficients of thermal expansion between the display panel PNL and the circuit substrates PCB1 to PCB3 are absorbed at the portions of the joiners JN1 to JN3. As a result, the separations between the output leads (i.e., TTM of FIGS. 22 and 23) of the tape carrier package TCP having a low connection strength and the external terminals (i.e., DTM (or GTM) of FIGS. 22 and 23) of the liquid crystal display panel PNL can be prevented, and the stress of the input leads of the tape carrier package TCP can be damped to improve the reliability of the module against the heat. Since such substrates are given a simpler rectangular shape than the C-shape of the substrate, the numerous sheets of circuit substrates PCB1 to PCB3 can be made of a single sheet of substrate material so that the using percentage of the printed substrate material can be increased to effectively reduce the cost for the parts/materials (e.g., to about 50% in the case of the present embodiment). Incidentally, if the circuit substrates PCB1 to PCB3 are made of a soft FPC (i.e., flexible printed circuit) in place of the PCB (i.e., printed circuit board) made of a glass epoxy resin, the FPC can warp to further enhance the lead separation preventing effect. Moreover, an integral C-shaped PCB can also be used. Then, there are achieved effects that the management of the manufacturing steps can be simplified by reducing the step number and the parts number, and that the reliability can be improved by abolishing the joiners between the circuit substrates.

The frame ground pads FGP, as connected to the individual ground wiring lines of the three circuit substrates PCB1 to PCB3, are provided, five, four and three, that is, totally twelve in number, as shown in FIG. 27. In case the circuit substrate is divided into a plurality, no electric problem will arise if at least one of the drive circuit substrates is connected with the frame ground in the DC manner. If the number of the drive circuit substrates is small in the higher frequency range, a potential for establishing the unnecessary radiative electric waves for causing the EMI (i.e., electromagnetic interference) is raised by the causes of the reflections of electric signals and the deflections of the potentials of the ground wiring lines due to the difference in the characteristic impedances of the individual drive circuit substrates. The counter-measures for that EMI are difficult especially in the module MDL of the active matrix type using thin film transistors. In order to prevent this, for each of a plurality of divided circuit substrates, the ground wiring lines (at the AC grounded potential) are connected with the common frame (i.e., the shield casing SHD) having a sufficiently low impedance. As a result, the ground wiring lines are strengthened in the higher frequency range, the electric field intensity is improved by 5 dB or more in the case of the twelve pads of the present embodiment, as compared with the case in which only one is connected with the shield casing SHD as a whole.

The frame grounding pawls FGN of the shield casing SHD are formed of the slender metal projections, as described, and can be connected to the frame ground pads FGP of the circuit substrates PCB1 to PCB3 by folding them, while requiring no special wires (or lead wires) for the connections. Moreover, the shield casing SHD and the circuit substrates PCB1 to PCB3 can be mechanically connected through the pawls FGN to improve the mechanical strengths of the circuit substrates PCB1 to PCB3.

In order to suppress the emission of the unnecessary radiative electric waves to cause the EMI, a plurality of resistors/capacitors for smoothing the signal wave forms are discretely arranged in the prior art in the vicinity of the signal source integrated circuit or in the course of the signal transmission route. As a result, there are required several spaces for interposing the resistors/capacitors in the vicinity of the signal source integrated circuit and between the taper carrier packages, so that the dead spaces are so enlarged that the electronic parts cannot be packaged in a high density. In the present embodiment, as shown in FIG. 24, the plurality of capacitors/resistors CR for the EMI are concentratedly arranged at the end portion of the drain side circuit substrate PCB1 downstream of the signals of the plurality of drive IC chips CHI1, far from the signal source integrated circuit TCON (as will be described in detail hereinafter) mounted in the interface circuit substrate PCB3, and farther from the drive IC chip CHI1 of the drain side circuit substrate PCB1 for receiving the signals from the signal source integrated circuit TCON. As compared with the discrete arrangement, therefore, the dead spaces can be reduced to package the electronic parts highly densely. As a result, the module MD can be small-sized and light-weighted to reduce the production cost.

<<Drain Side Circuit Substrate PCB1>>

Figure 47:
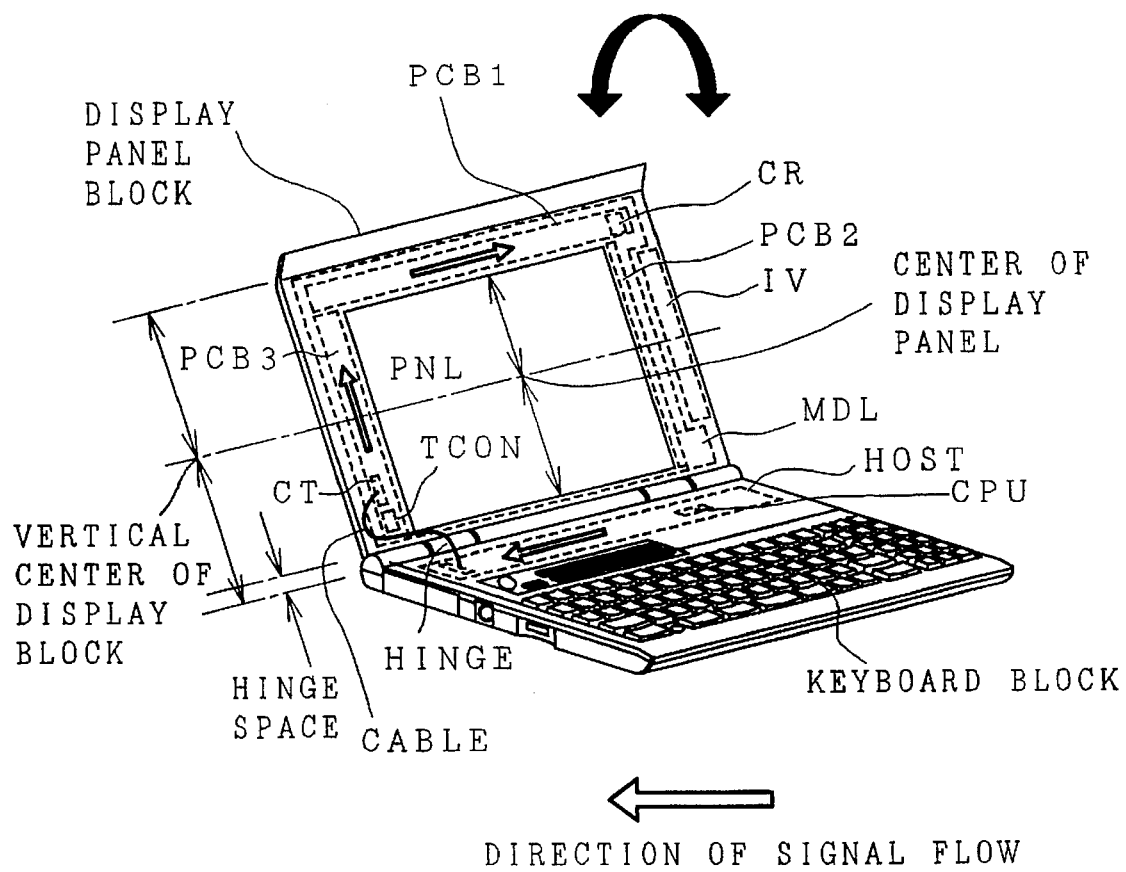
FIG. 47 is a perspective view of a notebook type personal computer or word processor having the liquid crystal display module MDL packaged therein.

One sheet of drain side circuit substrate PCB1 is arranged only at one longer side (i.e., at the left hand side of FIG. 24) of the display panel PNL, as shown in FIG. 24. Specifically, the video signal lines DL have their terminals extracted like the scanning signal lines GL at only one side of the liquid crystal display panel PNL. As a result, the area of the periphery of the display unit, i.e., the so-called "frame portion" can be reduced, as compared with the construction in which the video signal lines are alternately extracted to the two opposed longer sides of the display panel PNL and in which the drain side circuit substrates are individually arranged outside of the individual longer sides. As a result, the external size of the liquid crystal display module MDL and the data processing device (as shown in FIG. 47) such as a personal computer or word processor having the liquid crystal display module MDL assembled as the display unit can be reduced to reduce the weight. As a result, the material can be decreased to reduce the production cost. Incidentally, the drain side circuit substrate PCB1 is arranged at the side which is located at the upper side of the display, as shown in FIG. 47, when the module MDL is packaged in the personal computer or word processor. For this, a notebook type personal computer or word processor is required usually at the lower portion of the display to have the space for providing hinges to attach the display unit to the keyboard portion, so that the vertical positioning of the display can be made proper by arranging the drain side circuit substrate in the upper portion of the display. Incidentally, in FIG. 31: letters JP11 designate pads to be connected with the joiner JN1; letters JP12 designates pads to be connected with the joiner JN2; and letters JP13 designate pads to be connected with the joiner JN3.

In the module of the prior art, in which the video signal lines are alternately extracted to the upper and lower portions of the liquid crystal display panel and in which the two drain side circuit substrates are arranged at the upper and lower sides of the outer periphery of the liquid crystal display panel, the electronic parts are arranged along the flow of the signals which come from the external personal computer of the like into that module. Thus, there are arranged at the central portion of the interface circuit substrate with the connector to be connected with the personal computer or the like and the signal source integrated circuit TCON. In case the drain side circuit substrate PCB1 is arranged at one side of the liquid crystal display panel PNL, as in the present embodiment, the following layout is taken, if the arrangement of the electronic parts along the signal flow is taken as in the prior art. Specifically, the connector CT is arranged in the end portion closest to the corner of the shield casing SHD (as shown in FIG. 24, but not in the corner of the shield casing SHD in the present embodiment), and the signal source integrated circuit TCON is arranged adjacent in the direction apart from that corner. If the connector circuit CT is to be arranged at the remotest end of the circuit substrate PCB3, i.e., in the corner of the shield casing SHD, it cannot be covered with the lower casing MCA because it is connected with the personal computer (because the notches MLC of the lower casing MCA are positioned above the connector CT, as shown in FIG. 37). As a result, the corner of the shield casing SHD having the mounting holes SH4 cannot be covered with the lower casing MCA having the aligned mounting holes MH5. In the present embodiment, therefore, the signal source integrated circuit TCON, as at a lower level, is arranged at the remotest end of the circuit substrate PCB 3, i.e., over the circuit substrate PCB 3 in the vicinity of the corner of the shield casing SHD, and the vicinity of the corner can be covered with the lower casing MCA whereas the connector CT is arranged adjacent in the direction apart from that corner. Specifically, the vicinity of the corner of the shield casing SHD having the mounting hole SH4 is covered with the lower casing MCA having the aligned mounting hole MH4. As a result, when the module MDL is packaged in the data processing device such as the personal computer, the shield casing SHD and the lower casing MCA of the module MDL have their corners firmly held and fixed by screws or the like through their mounting holes SH4 and MH4 so that the mechanical strength is improved to improve the reliability of the product. Incidentally, as shown in FIG. 47, the signals coming from the personal computer or the like flow at first from the connector CT once to the signal source integrated circuit TCON and then to the drive IC chip CHI1 of the drain side circuit substrate PCB1. As a result, the signal flow is regulated to eliminate any useless signal flow so that the useless wiring lines can be reduced to reduce the area of the circuit substrate.

In the embodiment shown in FIG. 24, moreover, the signal source integrated circuit TCON and the connector CT are disposed on the interface circuit substrate PCB3 at the opposite side of the connection side (i.e., at the side of the joiners JN1 and JN2) with the drain side circuit substrate PCB1. As a result, as shown in FIG. 47, the liquid crystal display module MDL is packaged in the personal computer, the word processor or the like such that its side having the drain circuit substrate PCB1 is opposed to the hinges, so that the connection cables with the host can be shortened. As a result, it is possible to reduce the noise which might invade from the connection cables between the host and the liquid crystal display module MDL. Moreover, the connection between the host and the signal source integrated circuit TCON can be most shortened to strengthen the resistance to the invasion of the noise and the smoothing delay of the wave forms.

<<Gate Side Circuit Substrate PCB2>>

FIG. 32 is a top plan (or lower side) view of the circuit substrate PCB2. Letters JP23 designate a pad to be connected with the joiner JN3.

<<Tape Carrier Package TCP>>

FIG. 33 is a top plan (or lower side) view of the tape carrier package TCP on which is mounted the integrated circuit chip CHI.

The structure of the tape carrier package TCP and the connection structure with the liquid crystal display panel PNL have already been described in <<Connection Structure with External Circuit>> with reference to FIGS. 22 and 23 presenting the sections.

The planar shape of the package TCP is shown in FIG. 33. The reason why the terminal portions TM and TB have small contour widths is to cope with the narrowing of the terminal pitch. Specifically, the output terminal portion TM to be connected with the display panel PNL has its size adjusted to the pitch of the input terminals of the panel PNL, and the input terminal portion TB to be connected with the circuit substrate PCB1 to PCB2 has its size adjusted to the pitch of the output terminals of the circuit substrate PCB1 or PCB2.

Incidentally, either the output terminal portion TM or the input terminal portion TB may have its width made smaller than the outermost width.

FIG. 34 presents the top plan (or lower side) and side elevation showing the behavior in which a plurality of sheets of tape carrier packages TCP are packaged on the circuit substrates PCB1 and PCB2.

<<Interface Circuit Substrate PCB3>>

FIG. 29(A) presents the upper side of the interface circuit substrate PCB3 (i.e., having the connector CT and the hybrid integrated circuit HI packaged therein), and FIG. 29(B) presents the upper side having the signal source integrated circuit TCON and the parts such as the IC, capacitors or resistors packaged therein (and the connector CT and the hybrid integrated circuit HI in the portions, as indicated by dotted lines). On the interface circuit substrate PCB3, there are mounted not only the electronic parts such as the IC, capacitors or resistors but also: a power source circuit for achieving a plurality of stabilized voltage sources from one voltage source; and a circuit for transforming the data for the CRT (i.e., cathode ray tube) coming from the host (i.e., host processor) into the data for the TFT liquid crystal display device (as shown in FIG. 12). Letters CT designate a connector to be connected with the data processor such as the personal computer having that module MD packaged therein, and letters TCON designate a signal source integrated circuit for processing the image data sent from the host to transform them into the liquid crystal driving signals and for generating timing pulses to drive/control the gate side circuit substrate PCB2 and the drain side circuit substrate PCB1 thereby to display the data in the liquid crystal display device. Letters JP31 designate a connection portion to be connected with the joiner JN1, and letters JP32 designate a connection portion to be connected with the joiner JN2.

<<Electric Connections between Circuit Substrates PCB1 to PCB3>>

Figure 36:
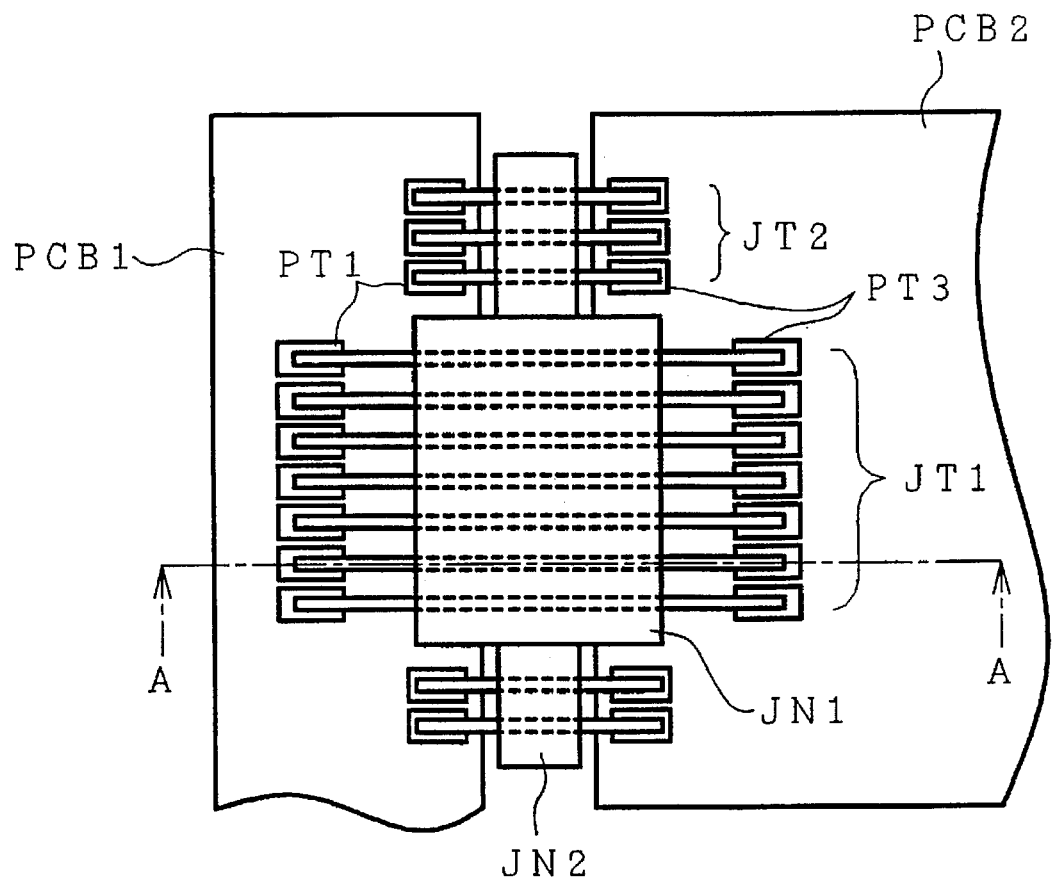
FIGS. 36(a)–(b) are a top plan view and side elevation of the joiners JN1 and JN2, as packaged.
Figure 36:
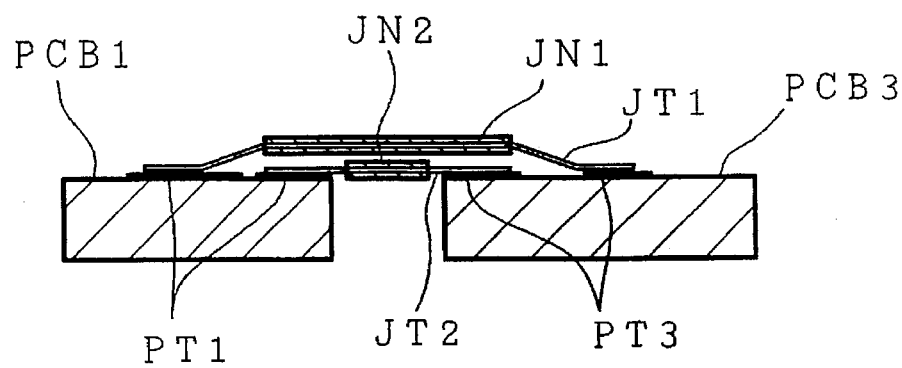

FIG. 36 presents the top plan and side elevation showing the state in which there are packaged in two stages the joiners JN1 and JN2 for electrically connecting the drain side circuit substrate PCB1 and the interface circuit substrate PCB3.

In accordance with development of recent years in the multiple colors of the color liquid crystal display device, the number of video signal lines for designating the gradations of red, green and blue colors increases together with the number of gradation voltages to that the portion having the function of the interface between that module and the setting side of the personal computer or the like to be assembled with that module is so complicated as to make difficult the electric connections between the drain side circuit substrate and the interface circuit substrate. Moreover, not only the number of video signal lines but also the number of connection lines are increased in accordance with the abrupt increase in the number of colors of the liquid crystal display device, because the connection lines effect the connections of the gradation voltages increasing in proportion to the color number, the clock and the power supply voltage.

At the corner of the shield casing SHD in which the two drain side circuit substrate PCB1 and interface circuit substrate PCB3 are adjacent to each other, as shown in FIG. 24, the individual connection lines are extracted to the individual adjoining end portions of the circuit substrate PCB1 and the circuit substrate PCB3, and the numeral terminals arrayed in two rows and in four columns are electrically connected by using the two joiners JN1 and JN2 which are arranged in two stages in the thickness direction of the circuit substrates. For thus connecting the circuit substrates, the space in the thickness direction of the module MDL is effectively exploited. By using the multistage joiners, the connection terminals can be connected in the small space even if their terminal number is large. As a result, the module MDL can be small-sized and light-weighted to reduce the production cost. In FIG. 36: letters JT1 designate the terminals of the joiner JN1; letters JT2 designate the terminals of the joiner JN2; letters PT1 designate the connection terminals of the circuit substrate PCB1; and letters PT3 designate the connection terminals of the circuit substrate PCB3.

Incidentally, the stage number of joiners should not be limited to two but can be three or more. Moreover, the electric connections between the drain side circuit substrate PCB1 and the gate side circuit substrate PCB2 are effected by using one joiner JN3 (as shown in FIG. 1) but may use a plurality of joiners stacked in multiple stages.

Figure 46:
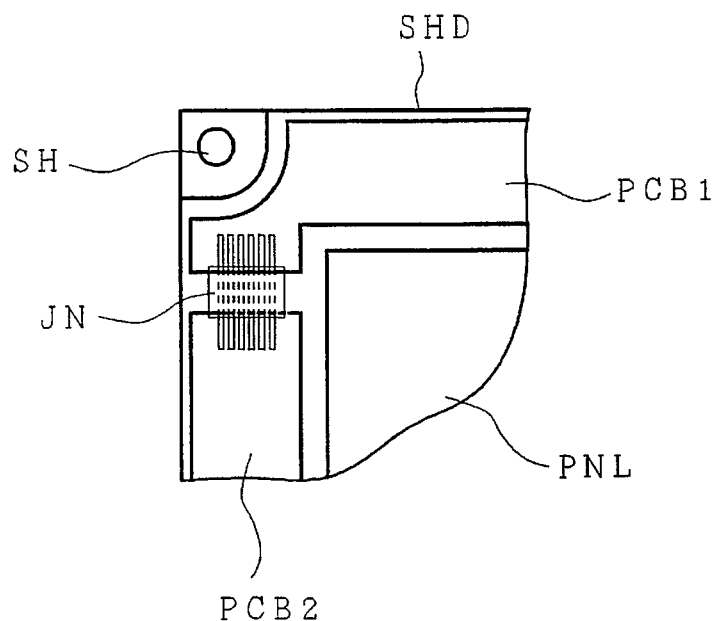
FIG. 46 is a diagram showing a mounting hole SH of the liquid crystal display module MDL of the prior art.

The mounting holes of the module MDL are usually arranged in the corners of the module MDL. When, however, the circuit substrates PCB1 and PCB3 are to be electrically disconnected by using the joiners JN, one circuit substrate PCB3 takes not the rectangular shape, as shown in FIG. 46, but a special shape having a protrusion. This special shape deteriorates the parting efficiency of the circuit substrate to raise the cost for the material of the circuit substrate. In the present embodiment, therefore, the mounting holes SH1 and SH2 of the shield casing SHD (and accordingly the mounting holes MH1 and MH2 of the lower casing MCA) are displaced from the corners of the module MDL or the shield casing SHD, as shown in FIG. 24. As a result, the space for connecting the joiners JN can be retained while leaving the circuit substrates PCB1, PCB2 and PCB3 generally rectangular (although the circuit substrate PCB3 is formed with the notch for the mounting hole SH1), so that the parting efficiency of the circuit substrate can be improved to reduce the cost for the material of the circuit substrate.

<<Hybrid Integrated Circuit HI and Electronic Parts EP Packaged in Two Stages on Interface Circuit Substrate PCB3>>

Figure 30:
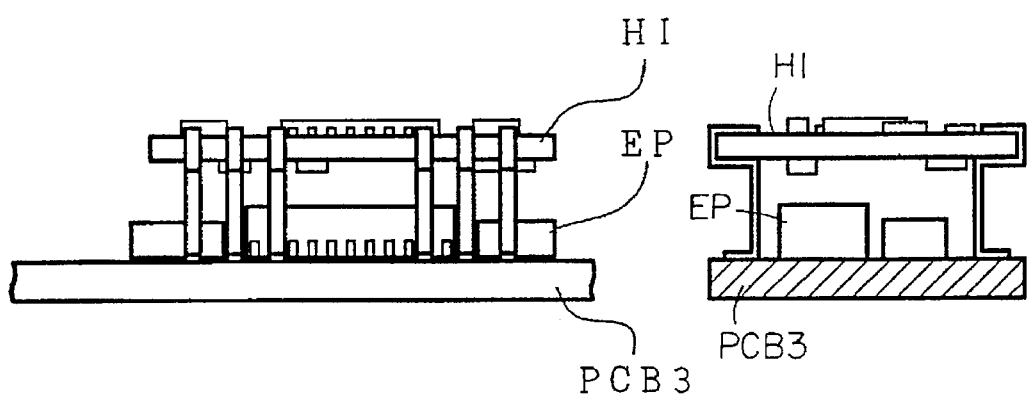
FIGS. 30(A)–(B) are a transverse side and front side of the hybrid integrated circuit HI mounted on the interface circuit substrate PCB3.

FIG. 30 presents the side elevation and front elevation of the hybrid integrated circuit HI mounted on the interface circuit substrate PCB3.

The hybrid integrated circuit HI, as shown in FIG. 24, is constructed by hybridly integrating its portion and by packaging a plurality of integrated circuits and electronic parts on the upper and lower sides of a small circuit substrate, and is packaged on the interface circuit substrate PCB3. As shown in FIG. 30, the leads HL of the hybrid integrated circuit HI are elongated to package a plurality of electronic parts EP on the circuit substrate PCB3 between the circuit substrate PCB3 and the hybrid integrated circuit HI. In case the number of parts is large, according to the prior art, the circuit substrates having the parts packaged therein are stacked in multiple stages and are connected by means of the joiners. As compared with this prior art, according to the present embodiment, the number of electronic parts can be reduced by the hybrid integration. Moreover, neither additional circuit substrate nor additional joiner is required (because the leads HL of the hybrid integrated circuit HI correspond to the joiners) so that the cost for the material and the number of working steps can be reduced. As a result, the production cost can be reduced while improving the reliability of the product.

<<Insulating Sheet INS>>

Figure 28:
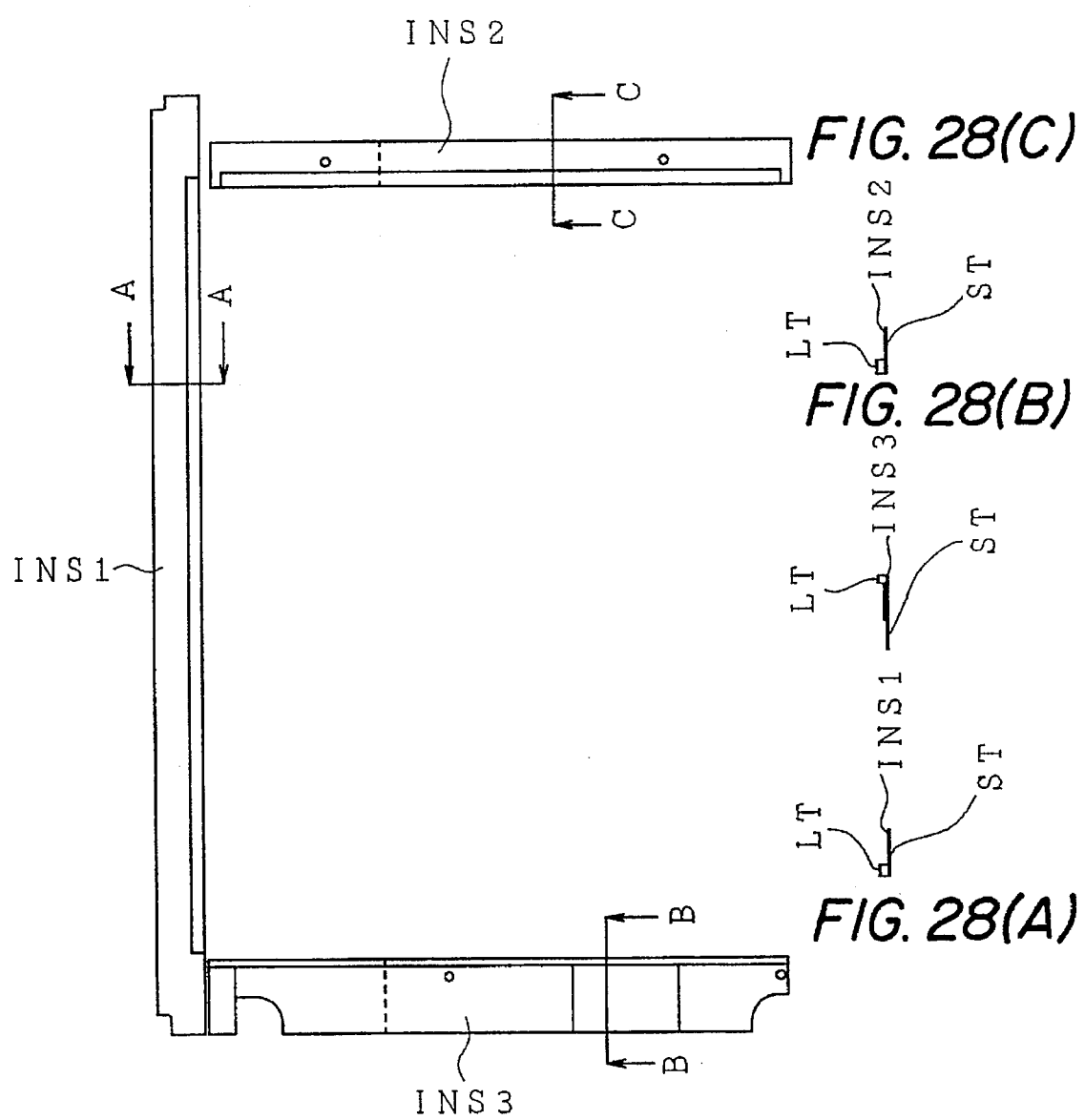
FIG. 28 is a top plan view of insulating sheets INS1 to INS3.

Between the metallic shield casing SHD and the circuit substrates PCB1 to PCB3, there are arranged the insulating sheets INS1 to INS3, as shown in FIG. 28, for insulating the two. Letters LT designate a double faced adhesive tape for bonding the insulating sheets INS1 to INS3 and the liquid crystal display panel PNL, and letters ST designate a double sided adhesive tape for bonding the insulating sheets INS1 to INS3 and the shield casing SHD.

<<Lower Casing MCA>>

FIG. 37 presents the top plan, upper side, rear side, right hand side and left hand side of the lower casing MCA, and FIG. 38 presents the lower side of the lower casing MCA.

The lower casing MCA, as molded, is a back light accommodating casing, i.e., a holding member for the fluorescent tube LP, the lamp cable LPC, the light conductive plate GLB and so on, and is monolithically molded of a synthetic resin by one mold. As has been described in detail in <Shield Casing SHD<>>, the lower casing MCA is firmly united with the metallic shield casing SHD by the actions of the individual fixing members and elastic members so that the module MDL can have its vibratory impulse resistance and thermal impulse resistance improved to improve the reliability.

The lower casing MCA is formed, in its bottom face at the central portion excepting the peripheral frame portion, with a large opening MO occupying a half or more area of the bottom face. As a result, after the module MDL has been assembled, the lower casing MCA can be prevented, by the repulsive force of the rubber cushion GC (of FIG. 42) between the liquid crystal display panel PNL and the light guide plate, from having its bottom face bulged by the vertical force applied downward to the bottom face of the lower casing MCA, thereby to suppress the maximum thickness. This makes it unnecessary to increase the thickness of the lower casing so as to suppress the bulging, so that the lower casing can be made thin to reduce the thickness and weight of the module MDL.

Letters MLC designate a notch (includes the notch for connecting the connector CT, as shown in FIG. 27), which is so formed in the lower casing MCA as to correspond to the exothermic parts of the interface circuit substrate PCB3, i.e., a packaged portion such as the hybrid IC power source circuit (e.g., a DC—DC converter) in the present embodiment. Thus, the heat liberation of the exothermic portions of the interface circuit substrate PCB3 can be improved not by covering the exothermic portion of the circuit substrate PCB3 with the lower casing MCA but by forming that notch. Specifically, at present, the multiple gradations and the single power source are demanded for improving the performance and the facility of the liquid crystal display device using the thin film transistors TFT. The circuit for realizing these demands consumes a high power. If the circuit means is to be packaged in compact, the packaging becomes so highly dense to raise the problem of the heat generation. As a result, the dense packaging and the compactness of the circuit can be improved by forming the lower casing MCA with the notch MLC corresponding to the exothermic portions. On the other hand, the signal source integrated circuit TCON is also considered as the exothermic parts, above which the lower casing MCA may be notched.

Letters MH1 to MH4 designate four mounting holes for mounting that module MD in the appliance such as a personal computer. The metallic shield casing SHD is also formed with the mounting holes SH1 to SH4 aligned with the mounting holes MH1 to MH4 of the lower casing MCA, so that it can be fixed and packaged in the appliance.

<<Back Light>>

FIG. 40(A) is a top plan view of an essential portion of the fluorescent tube LP, lamp cables LPC1 and LPC2 and rubber bushes GB1 and GB2 of the back light BL, FIG. 40(B) is a section taken along line B—B of FIG. 40(A) and FIG. 40(C) is a section taken along line C—C of FIG. 40(A).

The back light BL for supplying the light to the display panel PNL is composed of: the cold-cathode fluorescent tube LP; the lamp cables LPC1 and LPC2 of the fluorescent tube LP; the rubber bushes GB1 and GB2 for holding the fluorescent tube LP and the lamp cables LPC; the light guide plate GLB; the diffusive sheet SPS arranged in contact with the whole upper surface of the light guide plate GLB; the reflective sheet RFS arranged all over the whole lower surface of the light guide plate GLB; and the prism sheet PRS arranged in contact with the whole upper surface of the diffusive sheet SPS.

In the module MLD, the slender fluorescent tube LP is arranged in the space below the drain side circuit substrate PCB1 and the tape carrier package TCP1, which are packaged in one longer side of the liquid crystal display panel PNL. As a result, the module MDL can have its external size reduced so that it can be small-sized and light-weighted to reduce the production cost.

The rubber bushes GB1 and GB2 hold both the single cold-cathode fluorescent tube LP and the lamp cables LPC1 and LPC2. Specifically, the fluorescent tube LP is held in a larger-diameter hole $H_L$ of the hole (having a shape of a key hole joining the larger-diameter hole and a smaller-diameter hole, as shown in FIG. 40(B)), which is formed in the rubber bushes GB1 and GB2. The lamp cable LPC1, as connected with one end of the fluorescent tube LP, is inserted and held in the groove GBD formed in the rubber bush GB2. Moreover, the lamp cable LPC2, as extracted in the same direction as that of the lamp cable LPC1, is inserted and held in the smaller-diameter hole $H_S$ of the hole GBH of the rubber bush GB2 at the cable extraction side. Incidentally, the main portion of the hole GBH does not extend through the rubber bushes GB1 and GB2, but at least the rubber bush GB2 at the cable extraction side is formed with a smaller-diameter through hole which has communication with the smaller hole $H_S$ of the hole GBH so as to extract the lamp cable LPC2 from the rubber bush GB2. When the two lamp cables are to be extracted in one direction with that construction, according to the prior art, there is no space for threading the lamp cables, and the lamp cables are not threaded through the rubber bushes, so that the lamp cables bulge out of the module. According to the present embodiment, however, the lamp cable LPC1 does not bulge out of the lower casing MCA so that the module MDL can have its space reduced. As a result, the module MDL can be small-sized and light-weighted to reduce the production cost. Since, moreover, both the fluorescent tube LP and the lamp cables LPC are held by the rubber bushes GB1 and GB2, these rubber bushes GB1 and GB2 holding the fluorescent tube LP are held by the holding forces of the lamp cables LPC so that the holdability of the fluorescent tube LP can be improved. Incidentally, the rubber bush GB1 holds the fluorescent tube LP and one lamp cable LPC1, and the rubber bush GB2 holds the fluorescent tube LP and the two lamp cables LPC1 and LPC2. In order to reduce the kinds of parts, however, the rubber bush GB1 used is given a shape similar to that of the rubber bush GB2.

Incidentally, the holes or grooves, which are formed in the rubber bushes GB1 and GB2 for holding the fluorescent tube LP and the lamp cables LPC, should not have their shapes limited to the shown ones. For example, the holes or grooves for holding the fluorescent tube LP and the two lamp cables LPC may be made independent, or the holes or grooves of the fluorescent tube LP and one or two lamp cables LPC may be suitably shared. Moreover, the rubber bush GB1 and the rubber bush GB2 used may have different shapes such that the rubber bush GB1 is formed with a hole or groove for holding one lamp cable LPC1 whereas the rubber bush GB2 is formed with a hole or groove for holding the fluorescent tube LP and the two lamp cables LPC1 and LPC2.

<<Accommodations of Fluorescent Tube LP, Lamp Cables LPC and Rubber Bushes GB in Lower Casing MCA>>

FIG. 39(A) is a top plan view showing the state in which the back light BL (including the fluorescent tube LP, the lamp cables LPC, the rubber bushes GB and the light guide plate GLB) in the lower casing MCA; FIG. 39(B) is a section taken along line B—B of FIG. 39(A); and FIG. 39(C) is a section taken along line C—C of FIG. 39(A).

In FIG. 37 showing the inner side (or upper side) of the lower casing MCA; letters MB designate a holding portion of the light guide plate GLB; letters ML designate an accommodation portion of the fluorescent tube LP; letters MG designate an accommodation portion of the rubber bushes GB; letters MC1 designate an accommodation portion of the lamp cable LPC1; and letters MC2 designate an accommodation portion of the lamp cable LPC2.

Figure 39:
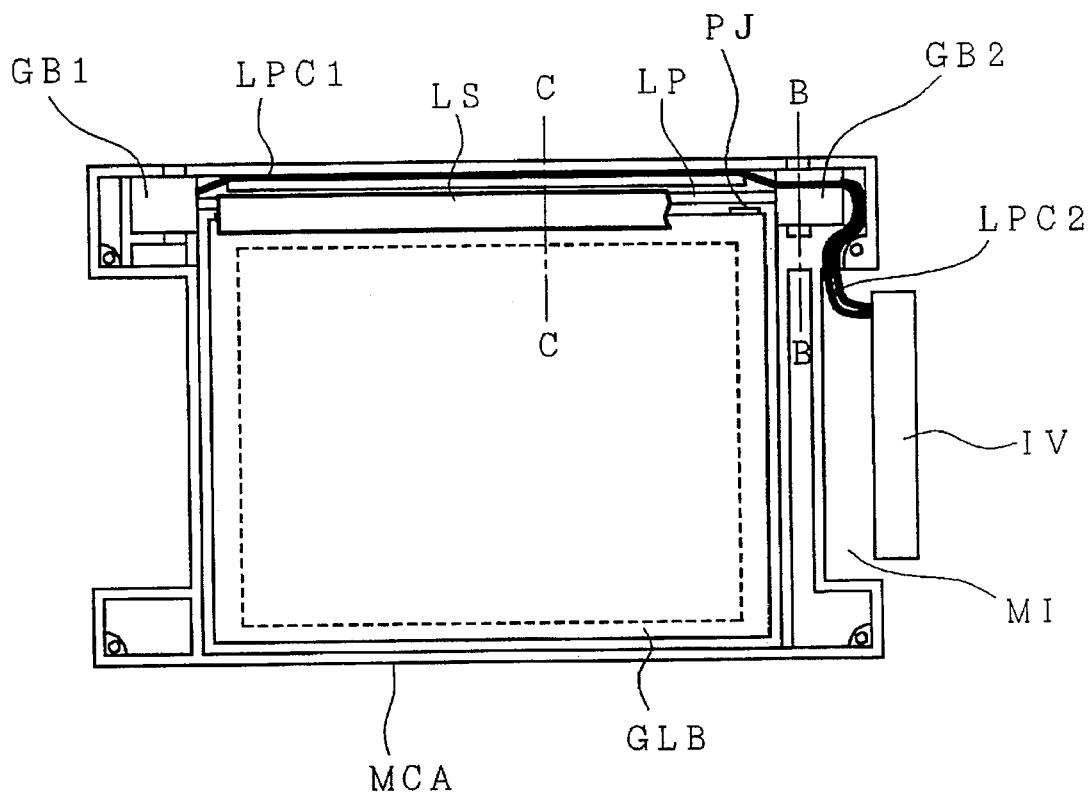
FIG. 39(A) is a top plan view of a light guide plate GLB, a fluorescent tube LP, a rubber bush GB and so on, as accommodated in the lower casing MCA.
FIG. 39(B) is a section taken along line B—B of FIG. 39(A) and FIG. 39(C) is a section taken along line C—C of FIG. 39(A).
Figure 39:
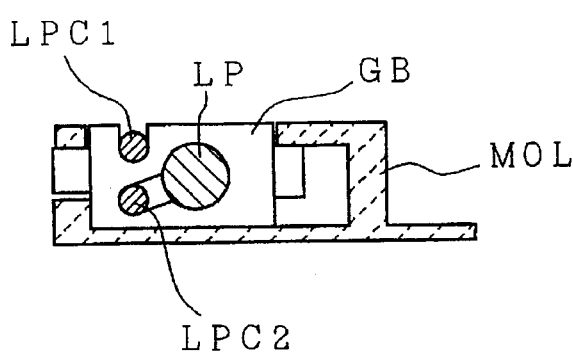
Figure 39:
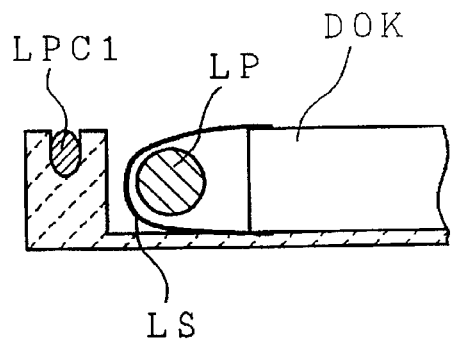
Figure 40:
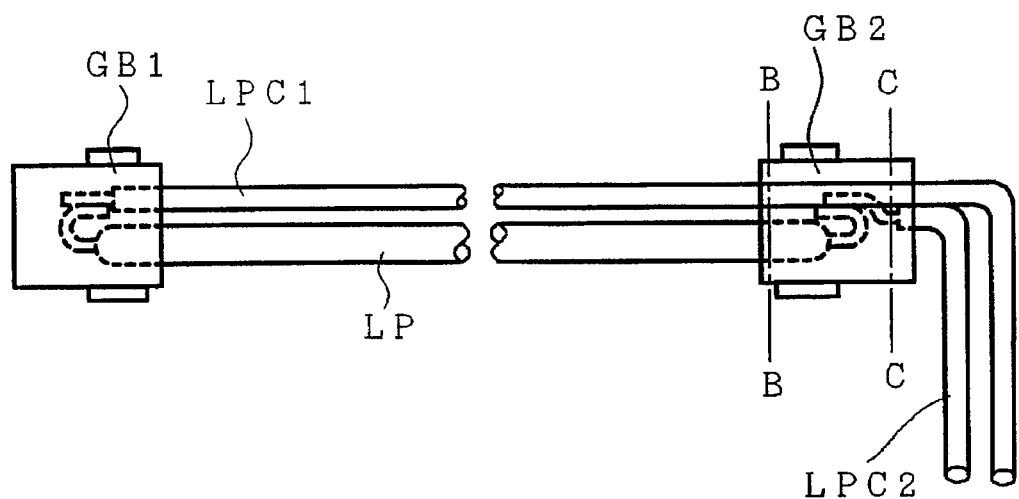
FIG. 40(A) is a top plan view of an essential portion of a back light BL (including the fluorescent tube LP, a lamp cable LPC and the rubber bush GB)
FIG. 40(B) is a section taken along line A—A of FIG. 40(A) and FIG. 40(C) is a section taken along line C—C of FIG. 40(A).
Figure 40:
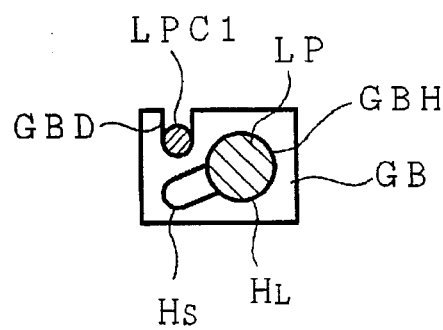
Figure 40:
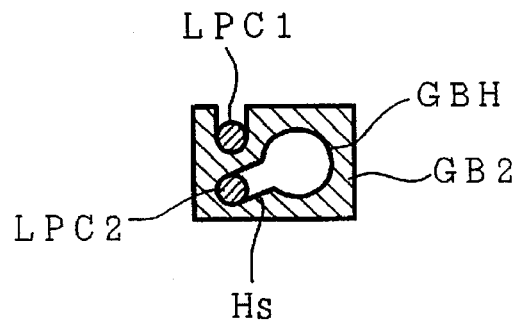

The back light BL is accommodated, as shown in FIGS. 39(A) to 39(C), in the lower casing MCA or the back light accommodating casing. Specifically, the rubber bushes GB1 and GB2 holding the fluorescent tube LP and the lamp cables LPC are fitted in the accommodation portion MG, which is formed to snugly fit the rubber bushes GB1 and GB2, as shown in FIG. 37, and the fluorescent tube LP is accommodated out of contact with the lower casing MCA in the accommodation portion ML. The line cables LPC1 and LPC2 are accommodated in the accommodation portions MC1 and MC2 which are composed of the grooves formed in the lower casing MCA substantially accurately along the shapes of the line cables LPC1 and LPC2. The line cables LPC1 and LPC2, as near the leading end to be connected with the inverter IV, i.e., at and downstream of the rubber bush GB2, turn generally at a right angle from the longer axis direction of the circuit substrate PCB2 (as shown in FIGS. 1 and 39) and are accommodated in the space between the mounting hole MB3 (of FIG. 37) and the circuit substrate PCB2. The leading end portions of the lamp cables LPC1 and LPC2 are connected with the inverter IV, which is accommodated in the inverter accommodating portion MI formed sideways of the circuit substrate PCB2, as shown in FIG. 39(A). Thus, in case the module MDL is assembled in an appliance such as a personal computer, the fluorescent tube LP, the lamp cables LPC, the rubber bushes GB and the inverter IV of the back light BL can be accommodated and packaged in compact such that neither the line cables LPC extend along the outer side of the module nor the inverter IV bulges out of the module MDL. As a result, the module MDL can be small-sized and light-weighted to reduce the production cost.

Incidentally, one fluorescent tube LP is arranged in the present embodiment, but two ore more can be arranged and at the shorter side of the light guide plate GLB.

<<Accommodation of Light Guide Plate GLB in Lower Casing MCA>>

Figure 41:
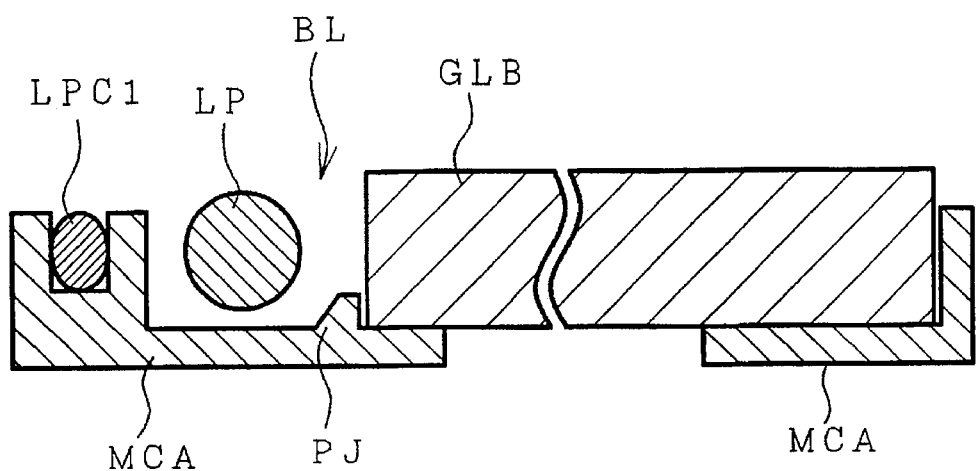
FIG. 41 is a section of an essential portion of the back light BL (including the light guide plate GLB, the fluorescent tube LP and so on) accommodated in the lower casing MCA.

FIG. 41 is a section of an essential portion of the lower casing MCA, the light guide plate GLB, the fluorescent tube LP, the lamp cables LPC and so on.

The light guide plate of the prior art has many useless regions in the module and is far larger than the size of the effective light emitting portion. As shown in FIG. 39(A), on the contrary, the light guide plate GLB of the present embodiment has a square (or rectangular) shape so that its entire size can be made as similar to that of the light emitting portion as possible. The light guide plate GLB has its three sides snugly held on the inner wall of its accommodating portion of the lower casing MCA and its remaining one side held by the two small projections (or pawls) PJ, which are integrally formed with the lower casing MCA, in the vicinity of the rubber bushes GB on the inner (or upper) face of the lower casing MCA between the light guide plate GLB and the fluorescent tube LP. Those projections PJ prevent the light guide plate GLB from moving toward the fluorescent tube LP and from impinging to break the fluorescent tube LP. Incidentally, the lamp reflecting sheet LS has a rectangular shape, before applied, but has its longer end portion bonded, after applied, to the lower end face of the reflective sheet RS to over the fluorescent tube LP throughout the whole length and its other longer end portion placed on and held by the upper end portion of the prism sheet PRS. The lamp reflecting sheet LS is formed to have a U-shaped section and such a length that it is arranged in the projections PJ. These projections PJ are made as small as possible so that they may not reduce the utilizing efficiency of the light.

Thus, the light guide plate GLB is made as small as the effective light emitting portion so that the electronic parts can be packaged in the space which has been occupied by the light guide plate of the prior art. At the same time, the light guide plate GLB is held by the projections PJ which are made integral with the lower casing MCA so that the it can be held in a small space. As a result, the module MDL can be small-sized and light-weighted to reduce the production cost. In other words, the light emitting efficiency of the light guide plate GLB can be improved while realizing the size reduction of the module MDL.

Incidentally, the projections PJ need not always be made integral with the lower casing MCA, but projections made of separate members of a metal may be attached to the lower casing MCA.

<<Diffusive Sheet SPS>>

The diffusive sheet SPS is placed on the light guide plate GLB to diffuse the light emitted from the upper face of the light guide plate GLB thereby to irradiate the liquid crystal display panel PNL uniformly with the light.

<<Prism Sheet>>

The prism sheet PRS is placed on the diffusive sheet SPS and has a lower smooth face and an upper prism face. This prism face is formed of a plurality of grooves which have V-shaped sections arrayed straight in parallel with each other. The prism sheet PRS is enabled to improve the brightness of the back light BL by collecting the light, which is diffused over a wide angular range from the diffusive sheet SPS, in a direction normal to the prism sheet PRS. As a result, the back light BL can be made to consume a low power so that the module MDL can be small-sized and light-weighted to reduce the production cost.

<<Reflective Sheet RFS>>

The reflective sheet RFS is arranged below the light guide plate GLB to reflect the light emitted from the lower face of the light guide plate GLB toward the liquid crystal display panel PNL.

<<Holding Structure of Light Guide Plate GLB and Liquid Crystal Display Panel PNL>>

Figure 42:
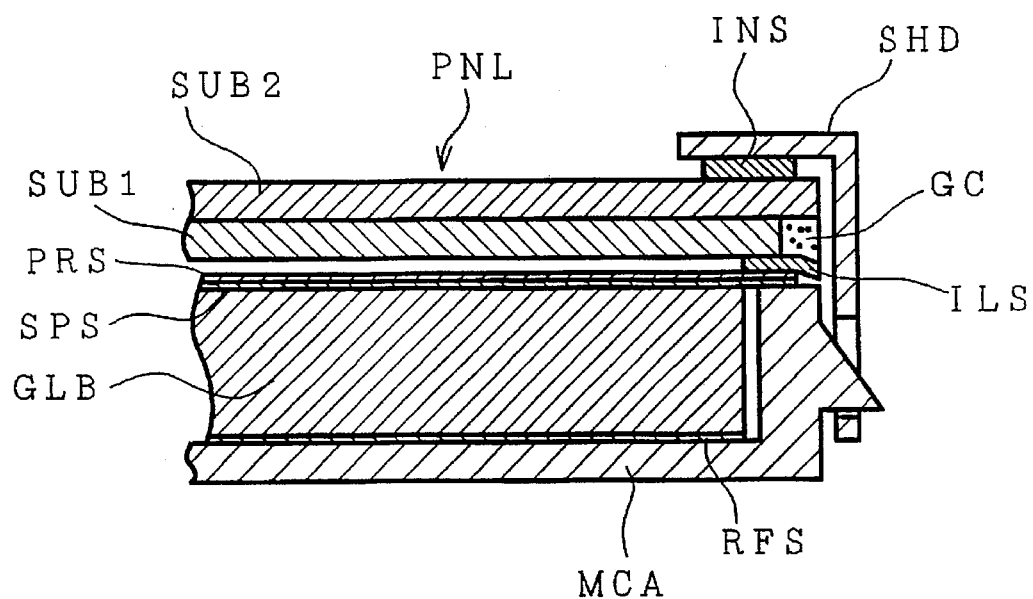
FIG. 42 is a section of an essential portion of a liquid crystal display module MD and shows a holding structure of the light guide plate GLB and the liquid crystal display panel PNL.

FIG. 42 is a section of an essential portion of the module MDL and shows a structure for holding the light guide plate GLB and the liquid crystal display panel PNL.

As shown in FIG. 42, the prism sheet PRS and the diffusive sheet SPS are made larger than the light guide plate GLB and their end portions protruded (or overhung) from the end portion of the light guide plate GLB onto the side wall of the lower casing MCA. On the overhung portions of the prism sheet PRS and the diffusive sheet SPS and the side wall of the lower casing MCA, there are arranged the rubber cushion GC and the shade spacer ILS which is made of rubber, to push and hold the upper transparent glass substrate SUB2 of the liquid crystal display panel PNL (as will be described in <<Holding Structure of Liquid Crystal Display Panel PNL>> and with reference to FIG. 44). As a result, both of the prism sheet PRS and the diffusive sheet SPS or only the diffusive sheet SPS steals into the gap between light guide plate GLB and the lower casing MCA so that the light guide plate GLB is prevented from chattering and is firmly held in the module MDL. According to the structure shown in FIG. 42, the pressures of the rubber cushions GC and the shade spacer ILS are applied through the prism sheet PRS and the diffusive sheet SPS to the lower casing MCA so that the liquid crystal display panel PNL is reliably held in the module MDL to improve the holding forces of the light guide plate GLB, the liquid crystal display panel PNL and so on thereby to improve the reliability of the product.

Here, both the prism sheet PRS and the diffusive sheet SPS are overhung from the light guide plate GLB, but one of them may be overhung. Here, moreover, the overhang is made over the whole periphery or four sides of the light guide plate GLB, but an effect can be achieved even the overhand is at one to three sides.

<<Holding Structure of Liquid Crystal Display Panel PNL>>

Figure 44:
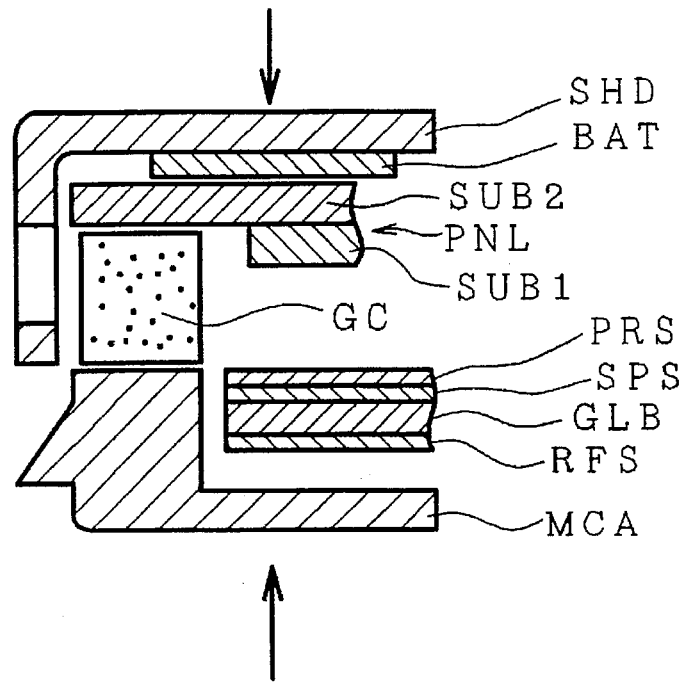
FIG. 44 is a section of an essential portion and shows the packaged states of the circuit substrate SHD, the liquid crystal display panel PNL, the rubber cushions GC and the lower casing MCA.
Figure 45:
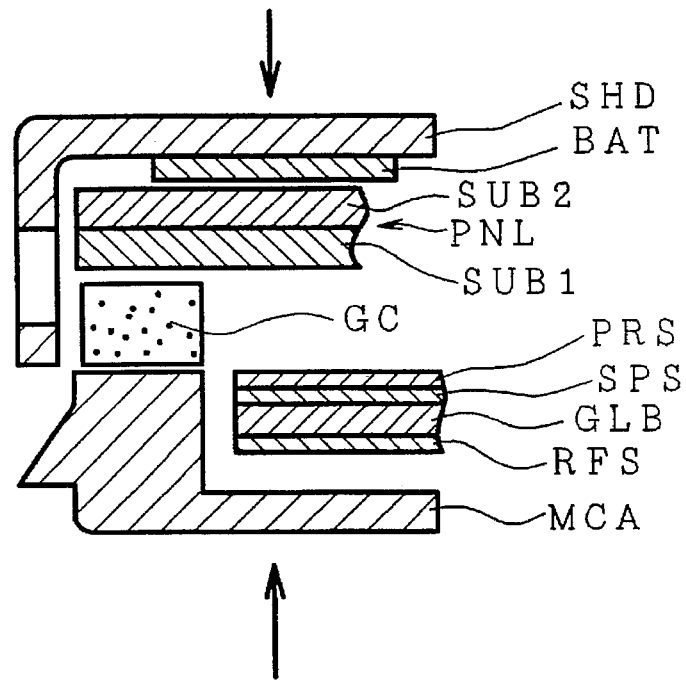
FIG. 45 is a section of an essential portion and shows the packaged states of the prior art of the circuit substrate SHD, the liquid crystal display panel PNL, the rubber cushions GC and the lower casing MCA.

FIG. 45 is a section of an essential portion and shows a holding structure of the liquid crystal display panel PNL in the liquid crystal display module MDL of the prior art. FIG. 44 is a section of an essential portion and shows a holding structure of the liquid crystal display panel PNL in the liquid crystal display module MDL of one embodiment of the present invention.

In the liquid crystal display module MDL of the prior art, as shown in FIG. 45, both the two transparent glass substrates constructing the liquid crystal display panel PNL are held through the rubber cushions GC so as to fix the liquid crystal display panel PNL in the module MDL. Specifically, as has been described in detail in <<Shield Casing SHD>>, the shield casing SHD is pushed into the device by making use of the elasticity of the rubber cushions GC so that the shield casing SHD and the lower casing MCA are fixed by the individual fixing members (that is, the fixing hooks HK are fixed by the fixing projections HP whereas the fixing pawls NL are folded inward and inserted into the fitting recesses NR). As a result, a the two transparent glass substrates are forcibly pushed in the prior art through the rubber cushions GC so that the liquid crystal between the two transparent glass substrates of the liquid crystal display panel PNL has its gap locally changed to cause a display unevenness. As a result, the liquid crystal display panel PNL cannot be so strongly pushed as to fail to retain a sufficient mechanical strength. According to the present invention, on the contrary, the two transparent glass substrates constructing the liquid crystal display panel PNL are given different sizes, that is, one transparent glass substrate is protruded from the other transparent glass substrate as to the side (as located at the side of the interface circuit substrate PCB3) having no terminal arranged, and the single glass plate portion is disposed all over the three sides of the liquid crystal display panel PNL so that only one transparent glass substrate is held through the rubber cushions GC placed on said single glass plate portion. As a result, the gap between the two transparent glass substrates is not changed to cause no display unevenness even if they are strongly pushed. As a result, the pushing force of the liquid crystal display panel PNL can be increased to improve the mechanical strength and the reliability. Moreover, the upper face of the single glass plate portion of the liquid crystal display panel PNL and the lower (or inner) face of the metallic shield casing SHD has a double sided adhesive tape BAT sandwiched inbetween so that they are fixed. Incidentally, FIG. 44 is a view schematically showing the holding structure of the liquid crystal display panel PNL. As a matter of fact, the light guide plate GLB is interposed between the rubber cushions GC and the lower casing MCA.

Incidentally, in the embodiment shown in FIG. 44, the structure is not limited to that in which the prism sheet PRS is overhung, as described above, so that the prism sheet PRS is not hung over the light guide plate GLB.

Although the present invention has been specifically described on the basis of its embodiments, it should not be limited thereto but can naturally be modified in various manners without departing from the gist thereof.

[Effects of the Invention]

As has been described hereinbefore, according to the liquid crystal display device of the present invention, the area of the frame portion around the display can be reduced by arraying the video signal line driving circuit substrate at only one of the sides of a display panel, so that the liquid crystal display device and the data processing device having the former assembled therein can be small-sized and light weighted. Moreover, the display unevenness can be prevented to improve the display quality, and the holding force of the liquid crystal panel in the device can be increased. As a result, the mechanical strength can be improved to improve the reliability. Thanks to the excellent using efficiency of the space for accommodating the fluorescent tube, still moreover, the liquid crystal display device can have its external size reduced so that it can be small-sized and light-weighted to reduce the production cost.

According to the present invention, on the other hand, the light guide plate and the liquid crystal display panel can be firmly held in the device without enlarging the external size to improve the mechanical strength. At the same time, the device can be small-sized and light-weighted to reduce the production cost. Since, moreover, the cables of the fluorescent tube of the back light can be accommodated without bulging out of the device, this device can be small-sized and light-weighted to reduce the production cost. Still moreover, it is possible to improve the holdability of the fluorescent tube. Furthermore, the light guide plate of the back light can be held in the small space so that the device can be small-sized and light-weighted to reduce the production cost. Furthermore, the bottom face of the mold casing has its central portion formed with a large opening so that it can be prevented from bulging out to reduce the size and weight of the liquid crystal display device. Furthermore, the cables and the inverter of the back light can be accommodated without bulging out of the device so that the liquid crystal display device can be small-sized and light-weighted to reduce the production cost.

According to the present invention, on the other hand, it is possible to provide a liquid crystal display device having such a circuit as can improve not only the heat liberation of the exothermic portions, the highly dense packageability of the circuit and the compactness and as can realize the multi-gradation, the single power source and the compact packaging. Moreover, the number of electronic parts can be reduced to reduce the cost for the material and the number of working steps. As a result, the production cost can be reduced to improve the reliability of the product.

According to the present invention, on the other hand, the plate extracting efficiency of the circuit substrate is enhanced to reduce the cost for the material of the circuit substrate thereby to reduce the production cost for the liquid crystal display device. Moreover, a plurality of circuit substrates can be electrically connected with a small space so that the liquid crystal display device can be small-sized and light-weighted to reduce the production cost and to take an advantage in the high performance of the device. Even in case, still moreover, the liquid crystal display device is formed at its intermediate portion with a mounting hole for mounting it in an appliance such as a personal computer, the drawn portion of the metallic casing to be formed with the mounting hole can be generally reduced to a quadrant shape. As a result, the liquid crystal display device can be small-sized and light-weighted to reduce the production cost.

According to the present invention, on the other hand, the pawls, as made integral with the side face of the metallic shield casing, are connected with the frame ground pads on the circuit substrate, as connected with the ground wiring lines. As a result, the harmful radiative electric waves can be suppressed, and the folding and soldering workability of the pawls can be improved to improve the connection reliability. Still moreover, the casing of the liquid crystal display device has its corner firmly held and fixed through the mounting holes by the screws or the like so that the mechanical strength is improved to improve the product reliability. Furthermore, a plurality of electronic parts for countermeasures of the EMI are arranged concentratedly on the circuit substrate so that the dead space can be reduced to package the electronic parts highly densely. As a result, the liquid crystal display device can be small-sized and light-weighted to reduce the production cost.

What is claimed is:

1. A liquid crystal display device comprising:
   a liquid crystal display panel;
      in which first and second insulating substrates are superposed at a predetermined gap such that their faces respectively formed with transparent pixel electrodes and an orientation film are opposed to each other, in which said two substrates are adhered to each other through a seal member applied in a frame shape on the edge portions between said two substrates while sealing a liquid crystal in said seal member between said two substrates, and in which a plurality of scanning signal lines and video signal lines arrayed on said opposed face of said first insulating substrate have their individual terminals disposed outside of said seal member;
   wherein a video signal line driving circuit substrate is arranged on only one of the longer sides of said display panel and is connected with the terminals of said video signal lines, wherein no circuit substrate is arranged at the other side of said display panel which is arranged with said video signal line driving circuit substrate; and
   wherein the liquid crystal display panel includes two sides extending perpendicular to the side having the video signal line driving circuit substrate arranged thereat, one of the two perpendicular sides having a scanning signal line driving circuit substrate arranged thereat and the other of the two perpendicular sides having a circuit substrate including a power source circuit and a conversion circuit arranged thereat.

2. A data processing device comprising:
   said video signal line driving circuit substrate is arranged above the display of a display unit when said liquid crystal display device according to claim 1 is assembled as said display unit in a predetermined data processing device.

3. A liquid crystal display device comprising:
   a liquid crystal display panel sealing a liquid crystal between two superposed transparent glass substrates,
   a plurality of circuit substrates arranged at the two, three or four sides of the peripheral portion of said liquid crystal display panel,
   a light guide plate for a back light arranged below said liquid crystal display panel,
   a metallic shield casing for accommodating said liquid crystal display panel and said circuit substrates, and
   a mold casing monolithically molded for accommodating said back light, said metallic shield casing and said mold casing being united by fitting their individual fitting members,
   wherein said liquid crystal display panel is formed with a single plate portion so that said liquid crystal display panel and said light guide plate are held through an elastic member between said single plate portion and said light guide plate and fixed in said device,
   a fluorescent tube arranged in the vicinity of at least one side face of said light guide plate,
   at least one optical sheet arranged on the upper face of said light guide plate,
   wherein at least one of the four sides of said at least one optical sheet has its end portion protruded and placed on the side wall of said mold casing, an elastic member is interposed between said optical sheet on said side wall and the lower face of an upper transparent glass substrate of said liquid crystal display panel, said shield casing and said mold casing are united by fitting their individual portions.

4. A liquid crystal display device comprising:
   a liquid crystal display panel,
   a plurality of circuit substrates arranged on the outer circumferential portion of said liquid crystal display panel,
   a light guide plate arranged below said liquid crystal display panel,
   a fluorescent tube arranged on at least one side face of said light guide plate,
   a metallic shield casing for accommodating said liquid crystal display panel and said circuit substrate together, and
   a mold casing monolithically molded for accommodating said light guide plate and said fluorescent tube,
   wherein two cables having their individual one ends connected with the two ends of said fluorescent tube are accommodated in a groove which is made integral with the side wall of said mold casing, and
   wherein said mold casing is notched at a portion corresponding to an exothermic portion mounted on said circuit substrates.

5. A liquid crystal display device comprising:
   a liquid crystal display panel,
   a plurality of circuit substrates arranged on the outer circumferential portion of said liquid crystal display panel, a light guide plate arranged below said liquid crystal display panel, a fluorescent tube arranged on at least one side face of said light guide plate, a metallic shield casing for accommodating said liquid crystal display panel and said circuit substrates together, a mold casing monolithically molded for accommodating said light guide plate and said fluorescent tube, wherein two cables having their individual one ends connected with the two ends of said fluorescent tube are accommodated in a groove which is made integral with the side wall of said mold casing, and wherein said mold casing is notched at a portion corresponding to an exothermic portion mounted on said circuit substrates, and a hybrid integrated circuit formed by hybridly integrating a portion of a sub-circuit is packaged in at least one of said circuit substrates.

* * * * *